(12) United States Patent
Sakaguchi et al.

(10) Patent No.: US 8,330,050 B2
(45) Date of Patent: Dec. 11, 2012

(54) WIRING BOARD HAVING HEAT INTERCEPTING MEMBER

(75) Inventors: Hideaki Sakaguchi, Nagano (JP); Kei Murayama, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 377 days.

(21) Appl. No.: 12/582,224

(22) Filed: Oct. 20, 2009

(65) Prior Publication Data

US 2010/0096163 A1    Apr. 22, 2010

(30) Foreign Application Priority Data

Oct. 21, 2008   (JP) ................... 2008-270530

(51) Int. Cl.
*H05K 1/03* (2006.01)
*H05K 1/16* (2006.01)
(52) U.S. Cl. ......... 174/252; 174/250; 174/256; 174/260
(58) Field of Classification Search .................. 174/252, 174/250, 256, 258, 260; 257/712, 713, 717, 257/702–704; 361/676, 679.46–722
See application file for complete search history.

(56) References Cited

U.S. PATENT DOCUMENTS

| | | | |
|---|---|---|---|
| 4,074,342 A * | 2/1978 | Honn et al. | 361/779 |
| 5,467,251 A * | 11/1995 | Katchmar | 361/719 |
| 7,462,784 B2 * | 12/2008 | Kariya et al. | 174/260 |
| 7,498,675 B2 * | 3/2009 | Farnworth et al. | 257/723 |
| 7,663,891 B2 * | 2/2010 | Tanaka et al. | 361/760 |
| 7,679,176 B2 * | 3/2010 | Asano et al. | 257/686 |
| 7,738,249 B2 * | 6/2010 | Chan et al. | 361/679.53 |

FOREIGN PATENT DOCUMENTS

| | | |
|---|---|---|
| JP | 2001-308137 | 11/2001 |
| JP | 2005-223078 | 8/2005 |
| JP | 2005-277163 | 10/2005 |
| JP | 2006-135174 | 5/2006 |

* cited by examiner

*Primary Examiner* — Angel R Estrada
*Assistant Examiner* — Dimary Lopez
(74) *Attorney, Agent, or Firm* — Drinker Biddle & Reath LLP

(57) ABSTRACT

A wiring board comprises a first pad which is provided on a first surface side of a substrate and on which a first electronic component is to be mounted, and a second pad which is provided on the first surface side of the substrate and on which a second electronic component having a larger amount of heat generation in an operation than that of the first electronic component is to be mounted, a first through electrode which penetrates the substrate and has one of ends connected electrically to the first pad, a second through electrode which penetrates the substrate and has one of ends connected electrically to the second pad, a through trench penetrating the substrate in a portion positioned between a first mounting region for the first electronic component and a second mounting region for the second electronic component, and a heat intercepting member provided in the through trench.

16 Claims, 68 Drawing Sheets

US 8,330,050 B2

WIRING BOARD HAVING HEAT INTERCEPTING MEMBER

This application claims priority to Japanese Patent Application No. 2008-270530, filed Oct. 21, 2008, in the Japanese Patent Office. The Japanese Patent Application No. 2008-270530 is incorporated by reference in its entirety.

TECHNICAL FIELD

The present disclosure relates to a wiring board and a method of manufacturing the wiring board. More particularly, the present disclosure relates to a wiring board on which a first electronic component and a second electronic component having a larger amount of heat generation in an operation than that of the first electronic component are to be mounted, and a method of manufacturing the wiring board.

RELATED ART

There has been a semiconductor device including a plurality of electronic components and a wiring board on which the electronic components are to be mounted (see FIG. 1).

FIG. 1 is a sectional view showing the related-art semiconductor device.

With reference to FIG. 1, a related-art semiconductor device 200 has a wiring board 201, electronic components 202 and 203, and external connecting terminals 205 and 206.

The wiring board 201 has a substrate 211 formed by a semiconductor material, an insulating film 212, through electrodes 213 and 214, pads 216 and 217, a wiring 218, external connecting pads 221 and 222, and solder resist layers 225 and 226.

The substrate 211 is plate-shaped and has through holes 231 and 232. The insulating film 212 is formed to cover an upper surface 211A and a lower surface 211B in the substrate 211 and a surface of the substrate 211 in corresponding parts to side surfaces of the through holes 231 and 232.

The through electrode 213 is provided in the through hole 231 in which the insulating film 212 is formed. The through electrode 214 is provided in the through hole 232 in which the insulating film 212 is formed.

The pad 216 is provided on the insulating film 212 formed on the upper surface 211A of the substrate 211. The pad 216 is connected to an upper end of the through electrode 213. The pad 216 has a connecting surface 216A on which the electronic component 202 is to be mounted.

The pad 217 is provided on the insulating film 212 formed on the upper surface 211A of the substrate 211. The pad 217 is connected to an upper end of the through electrode 214. The pad 217 has a connecting surface 217A on which the electronic component 203 is to be mounted.

The wiring 218 is provided on the insulating film 212 formed on the upper surface 211A of the substrate 211. The wiring 218 connects the pads 216 and 217 to each other.

The external connecting pad 221 is provided on a lower surface of the insulating film 212 formed on the lower surface 211B of the substrate 211. The external connecting pad 221 is connected to a lower end of the through electrode 213. Consequently, the external connecting pad 221 is electrically connected to the pad 216 through the through electrode 213. The external connecting pad 221 has a connecting surface 221A on which the external connecting terminal 205 is to be provided.

The external connecting pad 222 is provided on the lower surface of the insulating film 212 formed on the lower surface 211B of the substrate 211. The external connecting pad 222 is connected to a lower end of the through electrode 214. Consequently, the external connecting pad 222 is electrically connected to the pad 217 through the through electrode 214. The external connecting pad 222 has a connecting surface 222A on which the external connecting terminal 206 is to be provided.

The solder resist layer 225 is provided on the insulating film 212 to cover the pads 216 and 217 and the wiring 218 in parts excluding the connecting surfaces 216A and 217A. The solder resist layer 225 has an opening portion 225A for exposing the connecting surface 216A and an opening portion 225B for exposing the connecting surface 217A.

The solder resist layer 226 is provided on the lower surface of the insulating film 212 to cover the external connecting pads 221 and 222 in parts excluding the connecting surfaces 221A and 222A. The solder resist layer 226 has an opening portion 226A for exposing the connecting surface 221A and an opening portion 226B for exposing the connecting surface 222A.

The electronic component 202 is mounted on the pad 216 by flip chip bonding. For the electronic component 202, for example, it is possible to use a semiconductor chip (for instance, a flash memory). In the case in which the electronic component 202 is the flash memory, an amount of heat generation in an operation of the electronic component 202 is 0.5 W, for example.

The electronic component 203 is mounted on the pad 217 by flip chip bonding. The electronic component 203 is electrically connected to the electronic component 202 through the wiring pattern 218. The electronic component 203 has a larger amount of heat generation in an operation than that of the electronic component 202. For the electronic component 203, for example, it is possible to use a semiconductor chip (for instance, a semiconductor chip for a CPU). In the case in which the semiconductor chip for a CPU is used as the electronic component 203, the amount of heat generation in the operation of the electronic component 203 is 30 W, for example.

The external connecting terminal 205 is provided on the external connecting pad 221. The external connecting terminal 206 is provided on the external connecting pad 222. The external connecting terminals 205 and 206 are electrically connected to a pad (not shown) provided on a mounting substrate such as a mother board (not shown) when the semiconductor device 200 is to be mounted on the mounting substrate (for example, see Patent Document 1).

[Patent Document 1] JP-A-2006-135174 Publication

However, the substrate 211 constituted by a semiconductor material is apt to transfer a heat. For this reason, a heat in the operation of the electronic component 203 mounted on the wiring board 201 is transferred to the electronic component 202 through the substrate 211. Consequently, there is a problem in that the electronic component 202 carries out a malfunction or the electronic component 202 cannot exhibit an original performance.

SUMMARY

Exemplary embodiments of the present invention provide a wiring board capable of preventing a transfer, to a first electronic component, of a heat generated by a second electronic component having a larger amount of heat generation in an operation than that of the first electronic component, and a method of manufacturing the wiring board.

According to a first aspect of the invention, a wiring board comprises:

a substrate formed by a semiconductor material, a first pad which is provided on a first surface side of the substrate and on which a first electronic component is to be mounted, and a second pad which is provided on the first surface side of the substrate and on which a second electronic component having a larger amount of heat generation in an operation than that of the first electronic component is to be mounted;

a first through electrode which penetrates the substrate and has one of ends connected electrically to the first pad;

a second through electrode which penetrates the substrate and has one of ends connected electrically to the second pad;

a through trench which penetrates the substrate and which is provided on the substrate in a portion positioned between a first mounting region on which the first electronic component is to be mounted and a second mounting region on which the second electronic component is to be mounted; and a heat intercepting member which is provided in the through trench.

According to the invention, the through trench penetrating the substrate is provided on the substrate in the portion positioned between the mounting region for the first electronic component and the mounting region for the second electronic component having the larger amount of heat generation in the operation than that of the first electronic component, and the heat intercepting member is provided in the through trench. Consequently, it is possible to intercept the heat generated from the second electronic component in the operation by the heat intercepting member. Thus, the heat generated from the second electronic component in the operation can be prevented from being transferred to the first electronic component through the substrate in the corresponding portion to the first mounting region.

According to a second aspect of the invention, a wiring board comprises:

a substrate formed by a semiconductor material, a first pad which is provided on a first surface side of the substrate and on which a first electronic component is to be mounted, and a second pad which is provided on the first surface side of the substrate and on which a second electronic component having a larger amount of heat generation in an operation than that of the first electronic component is to be mounted;

a first through electrode which penetrates the substrate and has one of ends connected electrically to the first pad;

a second through electrode which penetrates the substrate and has one of ends connected electrically to the second pad;

a trench which does not penetrate the substrate and which is provided on the substrate in a portion positioned at an opposite side to the first surface in the substrate in a portion positioned between a first mounting region on which the first electronic component is to be mounted and a second mounting region on which the second electronic component is to be mounted; and a heat intercepting member which is provided in the trench.

According to the invention, the trench which does not penetrate the substrate is provided on the substrate in the portion positioned at the opposite side to the first surface in the substrate in the portion positioned between the first mounting region on which the first electronic component is to be mounted and the second mounting region on which the second electronic component is to be mounted, and the heat intercepting member is provided in the trench. Consequently, it is possible to intercept the heat generated from the second electronic component in the operation by the heat intercepting member. Thus, the heat generated from the second electronic component in the operation can be prevented from being transferred to the first electronic component through the substrate in the corresponding portion to the first mounting region.

According to a third aspect of the invention, a method of manufacturing a wiring board, including:

a substrate formed by a semiconductor material, a first pad which is provided on a first surface side of the substrate and on which a first electronic component is to be mounted, and a second pad which is provided on the first surface side of the substrate and on which a second electronic component having a larger amount of heat generation in an operation than that of the first electronic component is to be mounted;

a first through electrode which penetrates the substrate and has one of ends connected electrically to the first pad; and a second through electrode which penetrates the substrate and has one of ends connected electrically to the second pad, the method comprises:

a base material preparing step of preparing a base material having a plurality of substrate forming regions in which the substrate is to be formed;

an opening portion and trench forming step of simultaneously forming, on the base material from a first surface side of the base material, a first opening portion which corresponds to a forming position for the first through electrode and does not penetrate the base material, a second opening portion which corresponds to a forming position for the second through electrode and does not penetrate the base material, and a trench which is positioned between a first mounting region for mounting the first electronic component thereon and a second mounting region for mounting the second electronic component thereon and does not penetrate the base material;

a heat intercepting member forming step of forming, in the trench, a heat intercepting member for intercepting a heat;

a conductive member forming step of forming a conductive member to be a base metal of the first and second through electrodes in the first and second opening portions;

a pad forming step of forming the first and second pads after the conductive member forming step; and a base material thinning step of thinning the base material till an exposure of the conductive member and the heat intercepting member from a second surface side of the base material which is positioned on an opposite side to the first surface and forming the heat intercepting member and the first and second through electrodes penetrating the base material after the pad forming step.

According to the invention, the first and second opening portions which do not penetrate the base material and the trench which is positioned between the first mounting region for mounting the first electronic component thereon and the second mounting region for mounting the second electronic component thereon and does not penetrate the base material are formed on the base material from the first surface side of the base material at the same time. Subsequently, the heat intercepting member for intercepting a heat is formed in the trench. Then, the conductive members serving as the base metals of the first and second through electrodes are formed in the first and second opening portions. Thereafter, the first and second pads are formed. Next, the base material is thinned until the conductive member and the heat intercepting member are exposed from the second surface side of the base material which is positioned on the opposite side to the first surface. Consequently, the heat intercepting member penetrating the base material and serving to intercept the heat generated from the second electronic component in the operation is formed on the base material in the portion positioned between the first mounting region for mounting the first electronic component thereon and the second mounting region for mounting the second electronic component thereon. Therefore, the heat generated from the second electronic component in the operation can be prevented from being transferred to the first electronic component through the substrate in the corresponding portion to the first mounting region.

According to a fourth aspect of the invention, a method of manufacturing a wiring board, including:

a substrate formed by a semiconductor material, a first pad which is provided on a first surface side of the substrate and on which a first electronic component is to be mounted, and a second pad which is provided on the first surface side of the substrate and on which a second electronic component having a larger amount of heat generation in an operation than that of the first electronic component is to be mounted;

a first through electrode which penetrates the substrate and has one of ends connected electrically to the first pad; and a second through electrode which penetrates the substrate and has one of ends connected electrically to the second pad, the method comprises:

a base material preparing step of preparing a base material having a plurality of substrate forming regions in which the substrate is to be formed;

a trench forming step of forming a trench which does not penetrate the base material from a first surface side of the base material on the base material in a portion between a first mounting region for mounting the first electronic component thereon and a second mounting region for mounting the second electronic component thereon;

a heat intercepting member forming step of forming, in the trench, a heat intercepting member for intercepting a heat;

an opening portion forming step of simultaneously forming, on the base material from the first surface side of the base material, a first opening portion which corresponds to a forming position for the first through electrode and does not penetrate the base material, and a second opening portion which corresponds to a forming position for the second through electrode and does not penetrate the base material;

a conductive member forming step of forming a conductive member to be a base metal of the first and second through electrodes in the first and second opening portions;

a pad forming step of forming the first and second pads after the conductive member forming step; and a base material thinning step of thinning the base material till an exposure of the conductive member and the heat intercepting member from a second surface side of the base material which is positioned on an opposite side to the first surface and forming the heat intercepting member and the first and second through electrodes penetrating the base material after the conductive member forming step.

According to the invention, the trench which does not penetrate the base material is formed from the first surface side of the base material on the base material in the portion positioned between the first mounting region on which the first electronic component is to be mounted and the second mounting region on which the second electronic component is to be mounted. Subsequently, the heat intercepting member for intercepting a heat is formed in the trench. Then, the first opening portion which corresponds to the forming position for the first through electrode and does not penetrate the base material and the second opening portion which corresponds to the forming position for the second through electrode and does not penetrate the base material are formed on the base material from the first surface side of the base material at the same time. Thereafter, the conductive members serving as the base metals of the first and second through electrodes are formed in the first and second opening portions. Next, the first and second pads are formed. Subsequently, the base material is thinned until the conductive member and the heat intercepting member are exposed from the second surface side of the base material which is positioned on the opposite side to the first surface. Consequently, the heat intercepting member penetrating the base material and serving to intercept the heat generated from the second electronic component in the operation is formed on the base material in the portion positioned between the first mounting region on which the first electronic component is to be mounted and the second mounting region on which the second electronic component is to be mounted. Therefore, the heat generated from the second electronic component in the operation can be prevented from being transferred to the first electronic component through the substrate in the corresponding portion to the first mounting region.

According to a fifth aspect of the invention, a method of manufacturing a wiring board, including:

a substrate formed by a semiconductor material, a first pad which is provided on a first surface side of the substrate and on which a first electronic component is to be mounted, and a second pad which is provided on the first surface side of the substrate and on which a second electronic component having a larger amount of heat generation in an operation than that of the first electronic component is to be mounted;

a first through electrode which penetrates the substrate and has one of ends connected electrically to the first pad; and a second through electrode which penetrates the substrate and has one of ends connected electrically to the second pad, the method comprises:

a base material preparing step of preparing a base material having a plurality of substrate forming regions in which the substrate is to be formed;

a through hole and through trench forming step of simultaneously forming, on the base material, a first through hole which corresponds to a forming position for the first through electrode and penetrates the base material, a second through hole which corresponds to a forming position for the second through electrode and penetrates the base material, and a through trench which is positioned between a first mounting region for mounting the first electronic component thereon and a second mounting region for mounting the second electronic component thereon and penetrates the base material;

a heat intercepting member forming step of forming, in the through trench, a heat intercepting member for intercepting a heat;

a through electrode forming step of filling the first and second through holes with a conductive member to form the first and second through electrodes; and a pad forming step of forming the first and second pads after the through electrode forming step.

According to the invention, the first and second through holes penetrating the base material and the through trench positioned between the first mounting region for mounting the first electronic component thereon and the second mounting region for mounting the second electronic component thereon and penetrating the base material are formed on the base material at the same time. Subsequently, the heat intercepting member for intercepting a heat is formed in the through trench. Then, the first and second through holes are filled with the conductive member to form the first and second through electrodes. Thereafter, the first and second pads are formed. Consequently, the heat intercepting member penetrating the base material and serving to intercept the heat generated from the second electronic component in the operation is formed on the base material in the portion positioned between the first mounting region for mounting the first electronic component thereon and the second mounting region for mounting the second electronic component thereon. Therefore, the heat generated from the second electronic component in the operation can be prevented from being transferred to the first electronic component through the substrate in the corresponding portion to the first mounting region.

According to a sixth aspect of the invention, a method of manufacturing a wiring board, including:

a substrate formed by a semiconductor material, a first pad which is provided on a first surface side of the substrate and on which a first electronic component is to be mounted, and a second pad which is provided on the first surface side of the substrate and on which a second electronic component having a larger amount of heat generation in an operation than that of the first electronic component is to be mounted;

a first through electrode which penetrates the substrate and has one of ends connected electrically to the first pad; and a second through electrode which penetrates the substrate and has one of ends connected electrically to the second pad, the method comprises:

a base material preparing step of preparing a base Material having a plurality of substrate forming regions in which the substrate is to be formed;

a through hole and through trench forming step of simultaneously forming, on the base material, a first through hole which corresponds to a forming position for the first through electrode and penetrates the base material, a second through hole which corresponds to a forming position for the second through electrode and penetrates the base material, and a through trench which is positioned between a first mounting region for mounting the first electronic component thereon and a second mounting region for mounting the second electronic component thereon and penetrates the base material;

a heat intercepting member filling step of filling the first through hole, the second through hole and the through trench with an insulating resin to form a heat intercepting member;

a through hole forming step of forming a third through hole in which the first through electrode is to be provided on the heat intercepting member formed in the first through hole and a fourth through hole in which the second through electrode is to be provided on the heat intercepting member formed in the second through hole after the heat intercepting member filling step;

a through electrode forming step of filling the third and fourth through holes with a conductive member to form the first and second through electrodes; and a pad forming step of forming the first and second pads after the through electrode forming step, wherein the third and fourth through holes are formed to interpose the heat intercepting member between the first through hole and the third through hole and between the second through hole and the fourth through hole at the through hole forming step.

According to the invention, the first and second through holes penetrating the base material and the through trench positioned between the first mounting region for mounting the first electronic component thereon and the second mounting region for mounting the second electronic component thereon and penetrating the base material are formed on the base material at the same time. Subsequently, the first through hole, the second through hole and the through trench are filled with the insulating resin to form the heat intercepting member. Then, the third through hole in which the first through electrode is to be provided is formed on the heat intercepting member disposed in the first through hole, and the fourth through hole in which the second through electrode is to be provided is formed on the heat intercepting member disposed in the second through hole. Thereafter, the third and fourth through holes are filled with the conductive member to form the first and second through electrodes. Next, the first and second pads are formed. Consequently, the heat intercepting member penetrating the base material and serving to intercept the heat generated from the second electronic component in the operation is formed on the base material in the portion positioned between the first mounting region for mounting the first electronic component thereon and the second mounting region for mounting the second electronic component thereon. Therefore, the heat generated from the second electronic component in the operation can be prevented from being transferred to the first electronic component through the substrate in the corresponding portion to the first mounting region.

After the first through hole, the second through hole and the through trench are filled with the insulating resin, moreover, the third and fourth through holes are formed to interpose the heat intercepting member between the first through hole and the third through hole and between the second through hole and the fourth through hole at the through hole forming step. Consequently, it is not necessary to separately form an insulating film for insulating the first and second through electrodes from the substrate. Therefore, it is possible to reduce a manufacturing cost of the wiring board.

According to a seventh aspect of the invention, a method of manufacturing a wiring board, including:

a substrate formed by a semiconductor material, a first pad which is provided on a first surface side of the substrate and on which a first electronic component is to be mounted, and a second pad which is provided on the first surface side of the substrate and on which a second electronic component having a larger amount of heat generation in an operation than that of the first electronic component is to be mounted;

a first through electrode which penetrates the substrate and has one of ends connected electrically to the first pad; and a second through electrode which penetrates the substrate and has one of ends connected electrically to the second pad, comprises:

a base material preparing step of preparing a base material having a plurality of substrate forming regions in which the substrate is to be formed;

a trench forming step of forming a trench which does not penetrate the base material on the base material in a portion positioned between a first mounting region for mounting the first electronic component thereon and a second mounting region for mounting the second electronic component thereon from a second surface side of the base material positioned on an opposite side to a first surface of the base material;

a through hole forming step of simultaneously forming, on the base material, a first through hole which corresponds to a forming position for the first through electrode and penetrates the base material and a second through hole which corresponds to a forming position for the second through electrode and penetrates the base material;

a heat intercepting member forming step of forming, in the trench, a heat intercepting member for intercepting a heat;

a through electrode forming step of filling the first and second through holes with a conductive member to form the first and second through electrodes; and a pad forming step of forming the first and second pads after the through electrode forming step.

According to the invention, the trench which does not penetrate the base material is formed on the base material in the portion positioned between the first mounting region for mounting the first electronic component thereon and the second mounting region for mounting the second electronic component thereon from the second surface side of the base material which is positioned on the opposite side to the first surface of the base material. Subsequently, the first through hole corresponding to the forming position for the first through electrode and penetrating the base material and the second through hole corresponding to the forming position for the second through electrode and penetrating the base material are formed on the base material at the same time. Then, the heat intercepting member for intercepting a heat is formed in the trench. Thereafter, the first and second through holes are filled with the conductive member to form the first and second through electrodes. Next, the first stand and second pads are formed. Consequently, the heat intercepting member for intercepting the heat generated from the second electronic component in the operation is formed on the base material in the portion positioned between the first mounting region for mounting the first electronic component thereon and the second mounting region for mounting the second electronic component thereon. Therefore, the heat generated from the second electronic component in the operation can be prevented from being transferred to the first electronic component through the substrate in the corresponding portion to the first mounting region.

According to the invention, it is possible to prevent the heat generated from the second electronic component in the operation from being transferred to the first electronic component through the substrate in the corresponding portion to the first mounting region on which the first electronic component is to be mounted.

Other features and advantages may be apparent from the following detailed description, the accompanying drawings and the claims.

DETAILED DESCRIPTION

Exemplary embodiments according to the invention will be described below with reference to the drawings. The exemplary embodiments will show semiconductor devices using wiring boards of the invention, as examples. The semiconductor device of the invention is also called as "semiconductor package".

(First Embodiment)

Figure 1:
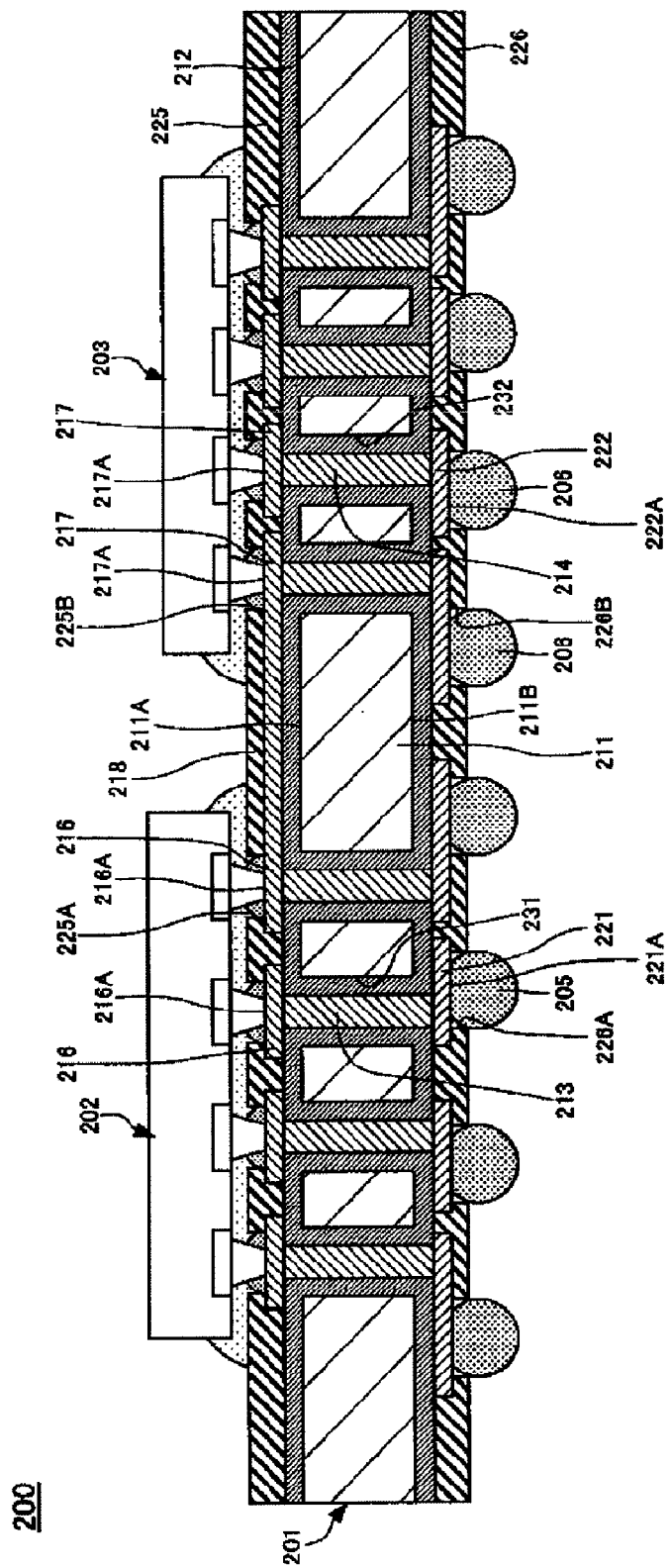
FIG. 1 is a sectional view showing a related-art semiconductor device.
Figure 2:
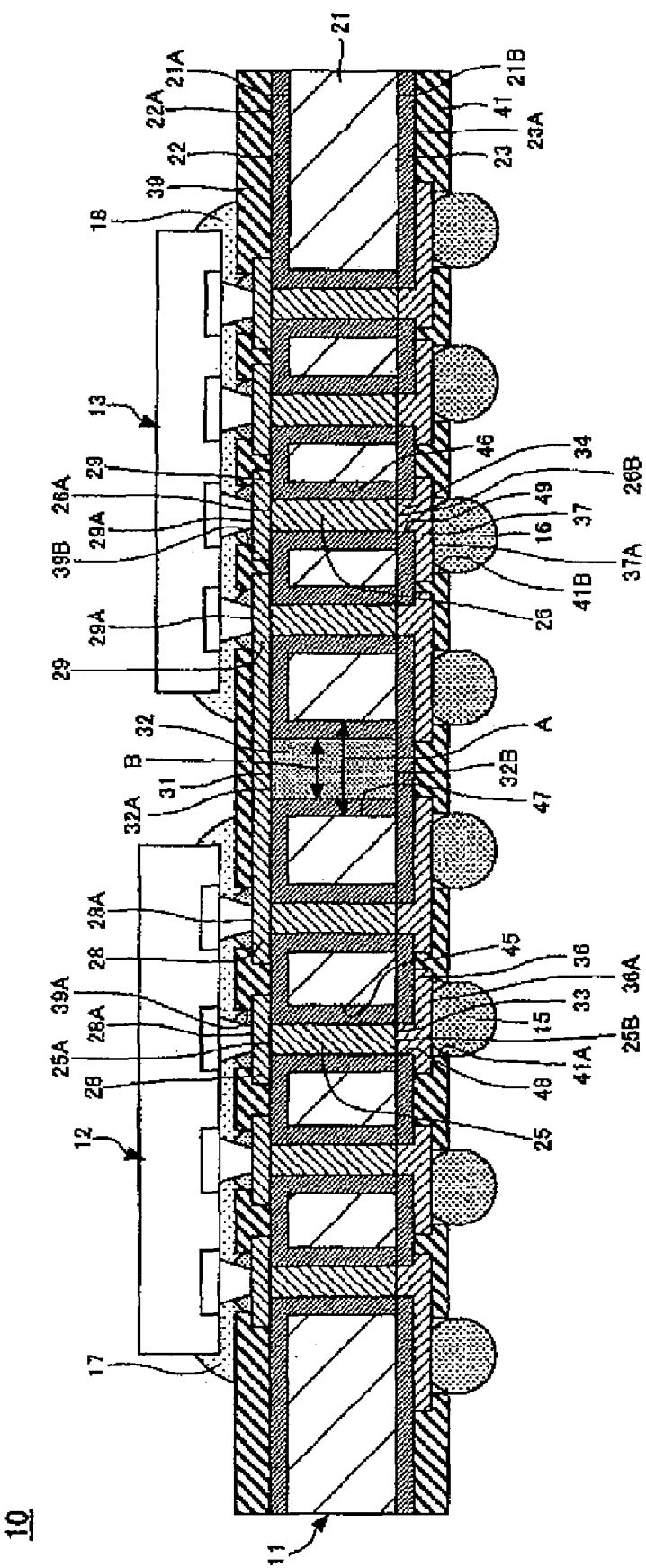
FIG. 2 is a sectional view showing a semiconductor device according to a first embodiment of invention.
Figure 3:
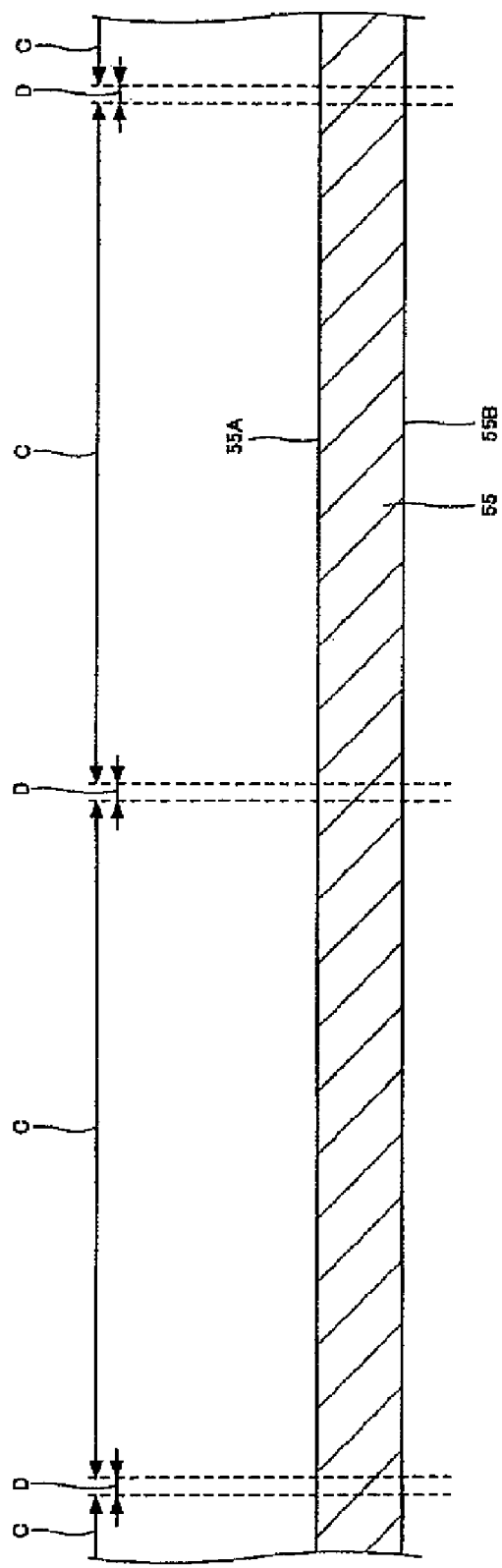
FIG. 3 is a view (No. 1) showing step of manufacturing the semiconductor device according to the first embodiment of invention.

FIG. 2 is a sectional view showing a semiconductor device according to a first embodiment of the invention.

With reference to FIG. 2, a semiconductor device 10 according to the first embodiment includes a wiring board 11, an electronic component 12 (a first electronic component), an electronic component 13 (a second electronic component) having a larger amount of heat generation in an operation than that of the electronic component 12, and external connecting terminals 15 and 16.

The wiring board 11 has a substrate 21, insulating films 22 and 23, through electrodes 25 and 26, a pad 28 (a first pad), a pad 29 (a second pad), a wiring 31, a heat intercepting member 32, vias 33 and 34, external connecting pads 36 and 37, and solder resist layers 39 and 41.

The substrate 21 is plate-shaped and is constituted by a semiconductor material (for example, silicon or a compound semiconductor such as GaAs). The substrate 21 has through holes 45 and 46 and a through trench 47. The through hole 45 is formed in a first mounting region on which the electronic component 12 is to be mounted. The through hole 46 is formed in a second mounting region on which the electronic component 13 is to be mounted. The through trench 47 is formed to penetrate the substrate 21 in a portion positioned between the first mounting region and the second mounting region. The through trench 47 serves to dispose the heat intercepting member 32 therein. A width A of the through trench 47 can be set to be 200 µm, for example.

For the substrate 21, for example, it is possible to use a silicon substrate or a compound semiconductor substrate such as GaAs. In the case in which the silicon substrate is used as the substrate 21, a thickness of the substrate 21 can be set to be 200 µm, for example.

In the embodiment, the following description will be given by taking, as an example, the case in which the silicon substrate is used as the substrate 21.

The insulating film 22 is provided to cover an upper surface 21A (a first surface) of the substrate 21 and a surface of the substrate 21 in corresponding portions to side surfaces of the through holes 45 and 46. For the insulating film 22, it is possible to use a thermal oxide film or an oxide film (for example, an oxide film formed by a CVD process), for instance. More specifically, an $SiO_2$ film can be used as the insulating film 22, for example. In the case in which the $SiO_2$ film is used as the insulating film 22, a thickness of the insulating film 22 can be set to be 1 µm, for example.

The insulating film 23 is provided to cover a lower surface 21B (a second surface) of the substrate 21. The insulating film 23 has an opening portion 48 for exposing the other end of the through electrode 25 and an opening portion 49 for exposing the other end of the through electrode 26. For the insulating film 23, for instance, it is possible to use an oxide film (for example, an oxide film formed by the CVD process) or an insulating resin. For the oxide film, it is possible to use the $SiO_2$ film, for example. A thickness of the insulating film 23 can be set to be 1 µm, for example.

The through electrode 25 is formed in the through hole 45 on which the insulating film 22 is formed. The through electrode 26 is provided in the through hole 46 on which the insulating film 22 is formed. End faces 25A and 26A of the through electrodes 25 and 26 are set on almost the level with an upper surface 22A of the insulating film 22. End faces 25B and 26B of the through electrodes 25 and 26 are set on almost the level with the lower surface 21B of the substrate 21. The through electrodes 25 and 26 can be formed by a plating method, for example. For materials of the through electrodes 25 and 26, it is possible to use Cu, for example.

The pad 28 is provided on the insulating film 22 formed on the upper surface 21A of the substrate 21. The pad 28 is connected to an upper end of the through electrode 25. The pad 28 has a connecting surface 28A on which the electronic component 12 is to be mounted.

The pad 29 is provided on the insulating film 22 formed on the upper surface 21A of the substrate 21. The pad 29 is connected to an upper end of the through electrode 26. The pad 29 has a connecting surface 29A on which the electronic component 13 is to be mounted.

The wiring 31 is provided on the insulating film 22 in a portion positioned between the first mounting region on which the electronic component 12 is to be mounted and the second mounting region on which the electronic component 13 is to be mounted. The wiring 31 has one of ends which is connected to the pad 28 and has the other end connected to the pad 29.

For materials of the pads 28 and 29 and the wiring 31 which have the structure, for example, it is possible to use Cu. Moreover, the pads 28 and 29 and the wiring 31 can be formed by a semiadditive process, for example.

The heat intercepting member 32 is provided in the through trench 47. In other words, the heat intercepting member 32 is disposed to penetrate the substrate 21 in the portion positioned between the first mounting region on which the electronic component 12 is to be mounted and the second mounting region on which the electronic component 13 is to be mounted. An end face 32A of the heat intercepting member 32 is set on almost the level with the upper surface 22A of the insulating film 22. An end face 32B of the heat intercepting member 32 is set on almost the level with the lower surface 21B of the substrate 21. In the case in which the width A of the through trench 47 is 200 µm, a width B of the heat intercepting member 32 can be set to be 198 µm, for example.

The heat intercepting member 32 is constituted by a material (for example, a material having a thermal conductivity of 0.1 to 1.0 W/m·K) which can intercept a heat transferred through the substrate 21 (for example, a thermal conductivity of 150 to 170 W/m·K). For the material of the heat intercepting member 32, it is possible to use a resin or a resin containing a filler (for example, silica), for instance. For the resin constituting the heat intercepting member 32, it is possible to use a polyimide resin, an epoxy resin or a silicone resin, for example. In the case in which the resin containing the filler (for example, the silica) is used as the heat intercepting member 32, it is possible to reduce a difference in a coefficient of thermal expansion between the substrate 21 and the heat intercepting member 32. For example, in the case in which a silicon substrate (a coefficient of thermal expansion of 3 ppm/K) is used as the substrate 21, a content of the filler (silica) contained in the resin can be set to be 50% (at this time, the coefficient of thermal expansion of the heat intercepting member 32 is approximately 40 ppm/K).

By providing the heat intercepting member 32 penetrating the substrate 21 in the portion positioned between the first mounting region on which the electronic component 12 is to be mounted and the second mounting region on which the electronic component 13 is to be mounted, thus, it is possible to intercept a heat generated from the electronic component 13 in an operation by means of the heat intercepting member 32. Consequently, the heat generated from the electronic component 13 in the operation can be prevented from being transferred to the electronic component 12 through the substrate 21 in a corresponding portion to the first mounting region.

The via 33 is provided in the opening portion 48. The via 33 is connected to the other end of the through electrode 25. Consequently, the via 33 is electrically connected to the pad 28 through the through electrode 25.

The via 34 is provided in the opening portion 49. The via 34 is connected to the other end of the through electrode 26. Consequently, the via 34 is electrically connected to the pad 29 through the through electrode 26.

For materials of the vias 33 and 34 having the structure, it is possible to use Cu, for example.

The external connecting pad 36 is provided on a lower surface 23A of the insulating film 23. The external connecting pad 36 is constituted integrally with the via 33. The external connecting pad 36 is electrically connected to the pad 28 through the via 33 and the through electrode 25. The external connecting pad 36 has a connecting surface 36A on which the external connecting terminal 15 is to be provided.

The external connecting pad 37 is provided on the lower surface 23A of the insulating film 23. The external connecting pad 37 is constituted integrally with the via 34. The external connecting pad 37 is electrically connected to the pad 29 through the via 34 and the through electrode 26. The external connecting pad 37 has a connecting surface 37A on which the external connecting terminal 16 is to be provided.

The solder resist layer 39 is provided on the upper surface 22A of the insulating film 22 and the wiring 31. The solder resist layer 39 has an opening portion 39A for exposing the connecting surface 28A of the pad 28 and an opening portion 39B for exposing the connecting surface 29A of the pad 29.

The solder resist layer 41 is provided on the lower surface 23A of the insulating film 23. The solder resist layer 41 has an opening portion 41A for exposing the connecting surface 36A of the external connecting pad 36 and an opening portion 41B for exposing the connecting surface 37A of the external connecting pad 37.

The electronic component 12 is mounted on the pad 28 formed in the first mounting region by a flip chip bonding. A clearance between the electronic component 12 and the wiring board 11 is filled with an underfill resin 17. For the electronic component 12, it is possible to use a semiconductor chip (for example, a flash memory) having an amount of heat generation of 1 W or less in an operation, for instance.

The electronic component 13 is mounted on the pad 29 formed in the second mounting region by a flip chip bonding. A clearance between the electronic component 13 and the wiring board 11 is filled with an underfill resin 18. The electronic component 13 has a larger amount of heat generation in the operation than that of the electronic component 12. The electronic component 13 has an amount of heat generation of 20 W or more in the operation, for example. For the electronic component 13, it is possible to use a semiconductor chip for a CPU, for example.

The external connecting terminal 15 is provided on the connecting surface 36A of the external connecting pad 36. The external connecting terminal 15 is electrically connected to the electronic component 12. The external connecting terminal 15 is connected to a pad (not shown) provided on a mounting substrate such as a mother board. For the external connecting terminal 15, it is possible to use a solder ball, for example.

The external connecting terminal 16 is provided on the connecting surface 37A of the external connecting pad 37. The external connecting terminal 16 is electrically connected to the electronic component 13. The external connecting terminal 16 is connected to a pad (not shown) provided on a mounting substrate such as a mother board. For the external connecting terminal 16, it is possible to use a solder ball, for example.

According to the wiring board of the exemplary embodiment of the invention, by providing the heat intercepting member 32 penetrating the substrate 21 in the portion positioned between the first mounting region on which the electronic component 12 is to be mounted and the second mounting region on which the electronic component 13 is to be mounted, thus, it is possible to intercept a heat generated from the electronic component 13 in an operation by means of the heat intercepting member 32. Consequently, the heat generated from the electronic component 13 in the operation can be prevented from being transferred to the electronic component 12 through the substrate 21 in a corresponding portion to the first mounting region.

According to the semiconductor device in accordance with the first embodiment, the wiring board 11 having the structure is provided so that the electronic component 12 can be prevented from carrying out a malfunction by the heat generated from the electronic component 13 in the operation. Therefore, it is possible to exhibit an original performance of the electronic component 12.

FIGS. 3 to 18 are views showing a process for manufacturing the semiconductor device according to the first embodiment of the invention. In FIGS. 3 to 18, the same components as those in the semiconductor device 10 according to the first embodiment have the same reference numerals.

With reference to FIGS. 3 to 18, description will be given to a method of manufacturing the semiconductor device 10 according to the first embodiment. First of all, at a step shown in FIG. 3, there is prepared a base material 55 having a plurality of substrate forming regions C in which a substrate 21 (one of the components in the wiring board 11 described above) is to be formed (a base material preparing step).

The base material 55 has a cut region D surrounding the substrate forming regions C. The cut region D is to be cut when a structure corresponding to the semiconductor device 10 is formed in the substrate forming regions C and the semiconductor device 10 is then divided into individual pieces.

For a material of the base material 55, the same material as that of the substrate 21 is used. For the material of the base material 55, for example, it is possible to use a semiconductor material (for instance, silicon or a compound semiconductor such as GaAs). In the stage, a thickness of the base material 55 is greater than that of the substrate 21. In the case in which the thickness of the substrate 21 formed of the silicon is 200 μm, the thickness of the base material 55 can be set to be 725 μm, for example. In the embodiment, the following description will be given by taking, as an example, the case in which a silicon wafer is used as the base material 55.

Figure 4:
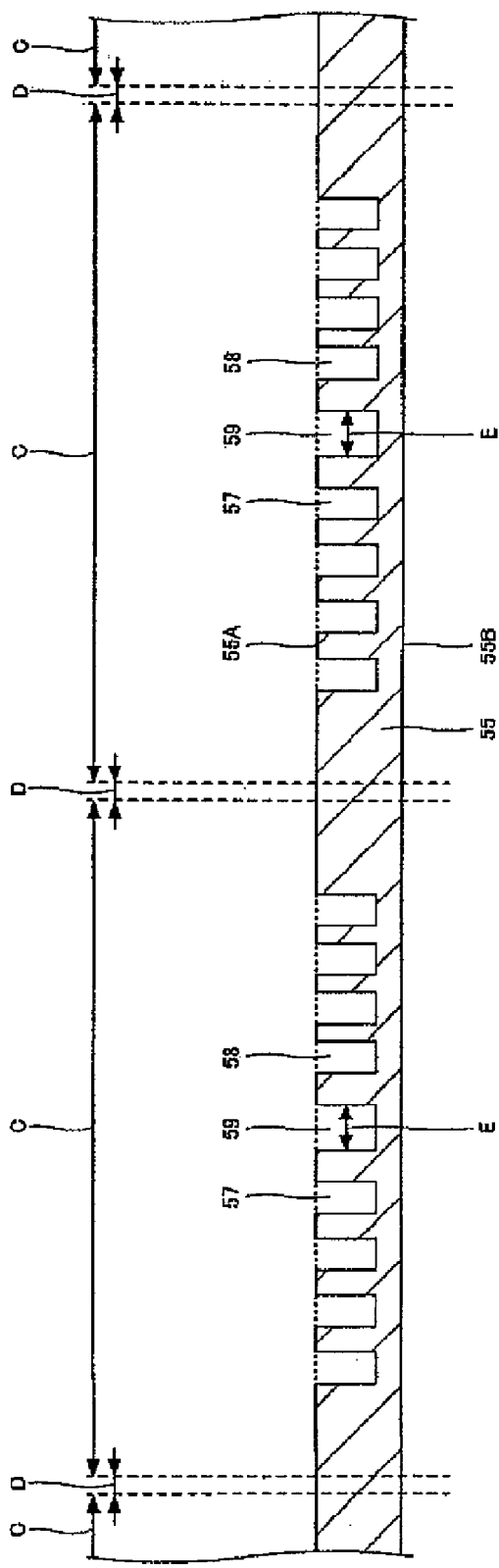
FIG. 4 is a view (No. 2) showing step of manufacturing the semiconductor device according to the first embodiment of invention.

At a step shown in FIG. 4, subsequently, an opening portion 57 (a first opening portion) corresponding to a position in which a through electrode 25 is to be formed, an opening portion 58 (a second opening portion) corresponding to a position in which a through electrode 26 is to be formed and a trench 59 are formed on the base material 55 from a side of an upper surface 55A of the base material 55 (a first surface of the base material 55) at the same time (an opening portion and trench forming step).

At this time, the opening portions 57 and 58 and the trench 59 are formed so as not to penetrate the base material 55. The opening portions 57 and 58 and the trench 59 can be formed by anisotropic etching using a mask (for example, dry etching), for instance. Depths of the opening portions 57 and 58 and the trench 59 are almost equal to each other and can be set to be 220 μm, for example. The trench 59 is formed on the base material 55 in a portion positioned between a first mounting region on which an electronic component 12 is to be mounted and a second mounting region on which an electronic component 13 is to be mounted. A width E of the trench 59 can be set to be 200 μm, for example.

The opening portion 57 is changed into the through hole 45 shown in FIG. 2 by thinning the base material 55 at a base material thinning step illustrated in FIG. 13 as will be described below. Moreover, the opening portion 58 is changed into the through hole 46 shown in FIG. 2 by thinning the base material 55 at the base material thinning step illustrated in FIG. 13 as will be described below. The trench 59 is changed into the through trench 47 shown in FIG. 2 by thinning the base material 55 at the base material thinning step illustrated in FIG. 13 as will be described below.

Thus, the trench 59 serving as the through trench 47 in which a thermal intercepting member 32 is to be provided is formed simultaneously with the formation of the opening portions 57 and 58 serving as the through holes 45 and 46. As compared with the case in which the trench 59 and the opening portions 57 and 58 are formed separately, consequently, it is possible to reduce a manufacturing cost of a wiring board 11 more greatly.

Figure 5:
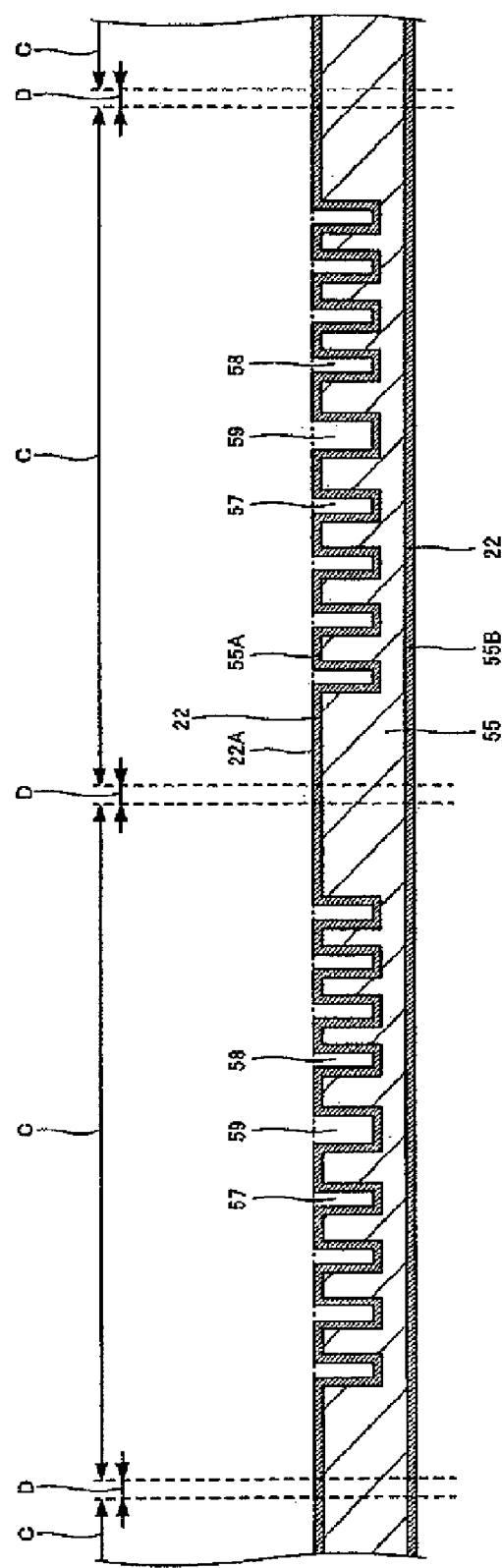
FIG. 5 is a view (No. 3) showing step of manufacturing the semiconductor device according to the first embodiment of invention.

At a step shown in FIG. 5, next, there is formed an insulating film 22 for covering surfaces of the base material 55 on which the opening portions 57 and 58 and the trench 59 are provided (both surfaces 55A and 55B of the base material 55 and a surface of the base material 55 in a portion constituting the opening portions 57 and 58 and the trench 59 are included).

For the insulating film 22, it is possible to use a thermal oxide film or an oxide film formed by a CVD process, for example. More specifically, for the insulating film 22, it is possible to use an $SiO_2$ film, for example. In the case in which the $SiO_2$ film is used as the insulating film 22, a thickness of the insulating film 22 can be set to be 1 μm, for example.

Figure 6:
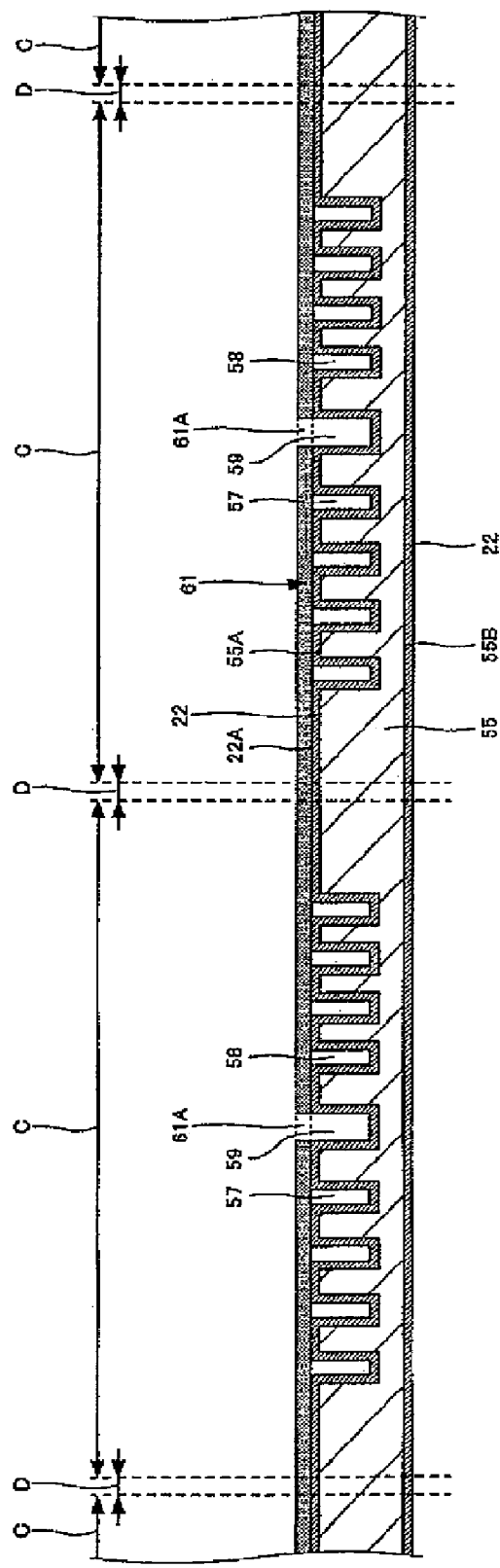
FIG. 6 is a view (No. 4) showing step of manufacturing the semiconductor device according to the first embodiment of invention.

At a step shown in FIG. 6, then, a mask 61 having a through trench 61A for exposing the trench 59 is formed on an upper surface 22A of the insulating film 22. More specifically, for example, a film-like resist is stuck to the upper surface 22A of the insulating film 22 and a region in which the through trench 61A is to be formed is then subjected to a laser processing so that the mask 61 is formed. A thickness of the mask 61 can be set to be 20 μm, for example.

Figure 7:
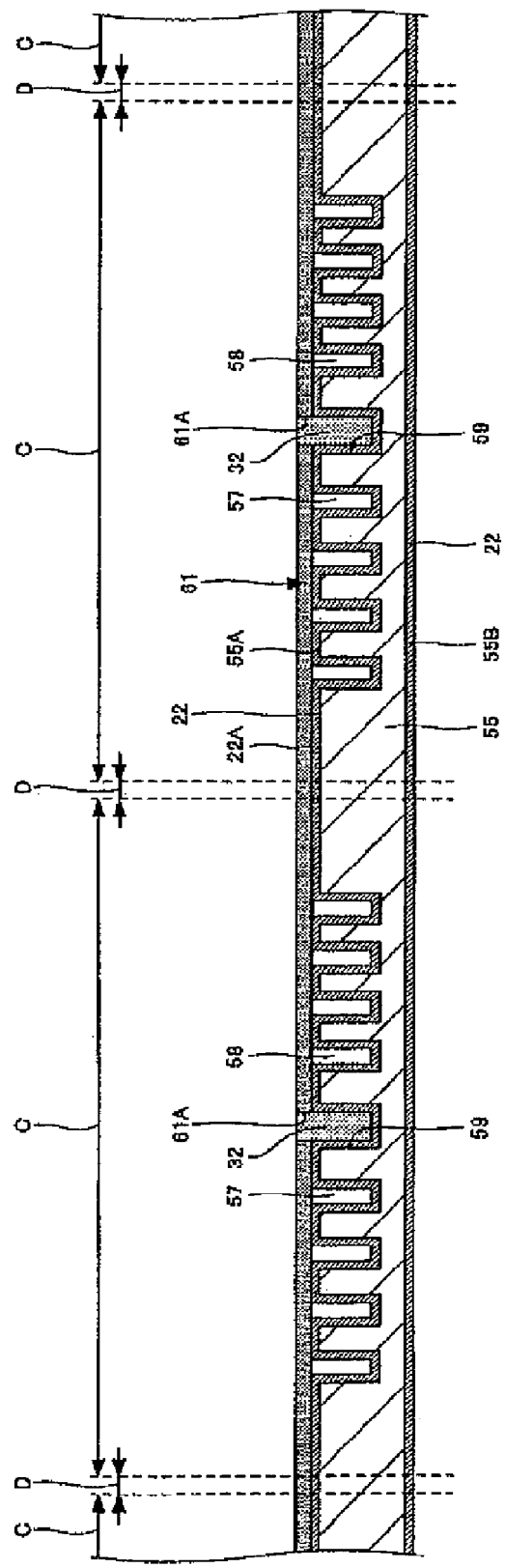
FIG. 7 is a view (No. 5) showing step of manufacturing the semiconductor device according to the first embodiment of invention.

At a step shown in FIG. 7, thereafter, the trench 59 is filled with a resin (a base metal of the heat intercepting member 32) to form the heat intercepting member 32 by a squeegee printing method, for example. The resin constituting the heat intercepting member 32 is heat treated and cured if necessary.

At this time, the opening portion 61A of the mask 61 is also filled with the resin. At a step shown in FIG. 10 which will be described below, therefore, it is necessary to remove the extra heat intercepting member 32.

For the resin, it is possible to use a resin capable of intercepting a heat (for example, a thermal conductivity of 0.1 to 1.0 W/m·K), for instance. More specifically, for the resin, it is possible to use a polyimide resin, an epoxy resin or a silicone resin, for example. The resin may be caused to contain a filler (for example, silica). In the case in which the resin is caused to contain the filler (for example, the silica), it is possible to reduce a difference in a coefficient of thermal expansion between the substrate 21 and the heat intercepting member 32. For example, in the case in which a silicon substrate (a coefficient of thermal expansion of 3 ppm/K) is used as the substrate 21, a content of the filler (the silica) contained in the resin can be set to be 50%.

At a step shown in FIG. 8, subsequently, the mask 61 illustrated in FIG. 7 is removed. More specifically, for example, an amine based releasing solution is used to remove the mask 61.

Figure 9:
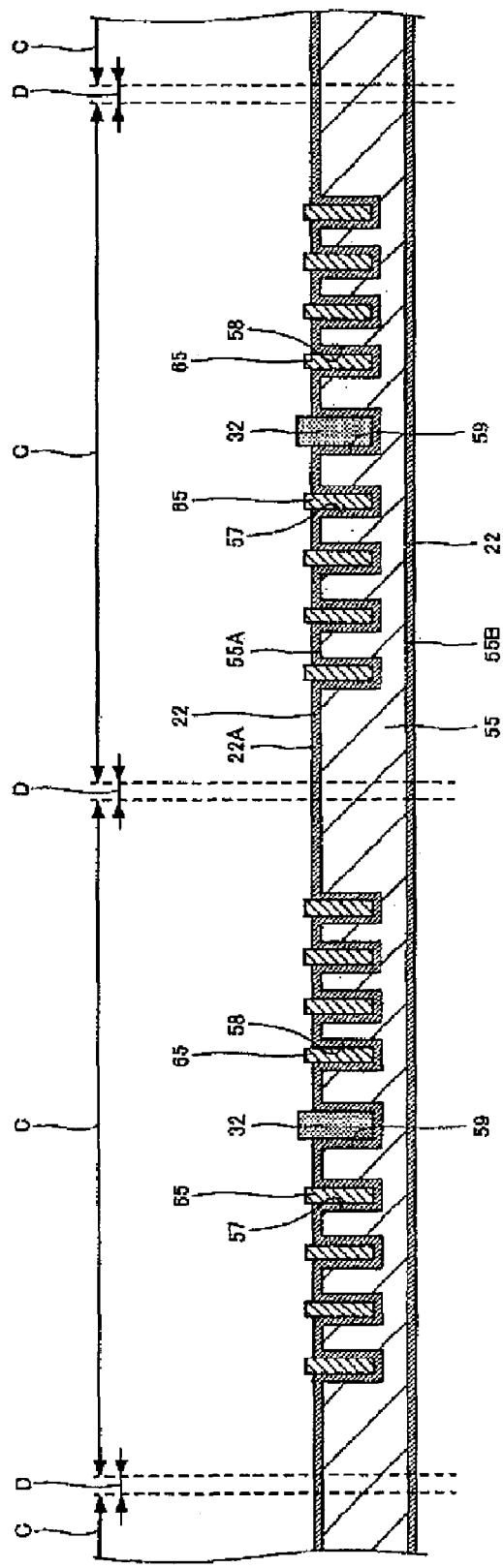
FIG. 9 is a view (No. 7) showing step of manufacturing the semiconductor device according to the first embodiment of invention.

At a step shown in FIG. 9, next, a conductive member 65 to be a base metal of the through electrodes 25 and 26 is formed in the opening portions 57 and 58 (a conductive member forming step). More specifically, for example, a seed layer is formed by a sputtering method and a Cu plated film is then deposited and grown by an electrolytic plating method to form the conductive member 65 through a semiadditive process or the opening portions 57 and 58 are filled with a conductive paste (for example, a Cu paste, an Ag paste or an Ni paste) to form the conductive member 65 by a printing method. At this time, the conductive member 65 is protruded from the upper surface 22A of the insulating film 22 in some cases.

Figure 10:
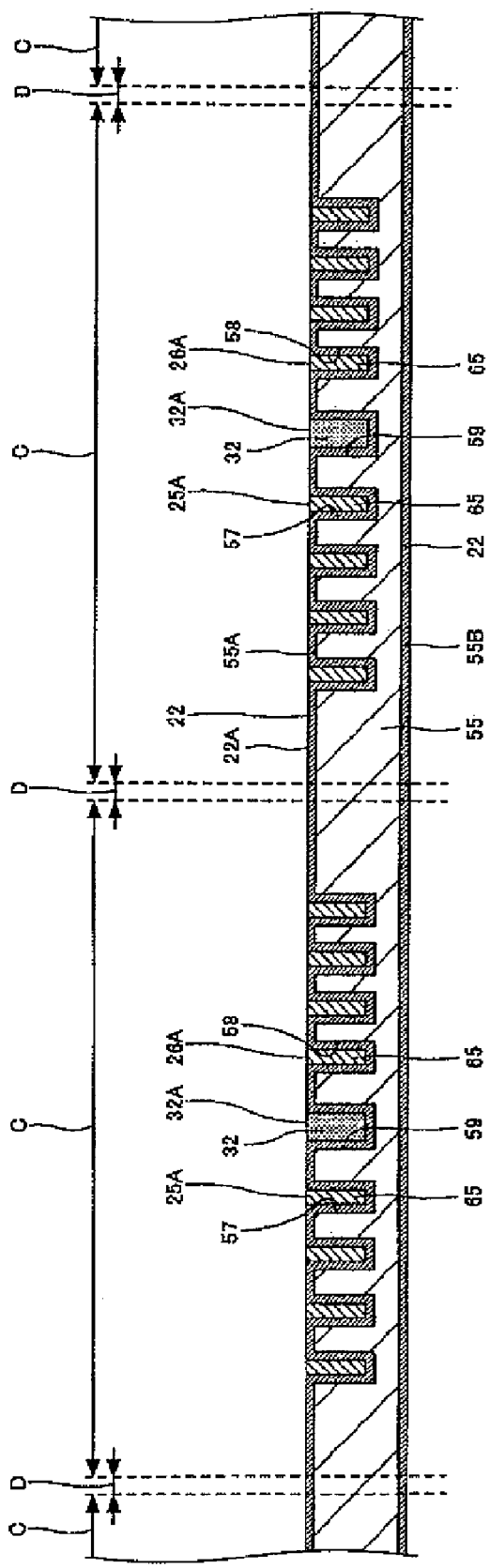
FIG. 10 is a view (No. 8) showing step of manufacturing the semiconductor device according to the first embodiment of invention.

At a step shown in FIG. 10, thereafter, the conducive member 65 and/or the heat intercepting member 32 in portions protruded from the upper surface 22A of the insulating film 22 are/is removed (a conductive member and/or heat intercepting member removing step). More specifically, the unnecessary conductive member 65 and/or the heat intercepting member 32 which are/is protruded from the upper surface 22A of the insulating film 22 are/is removed by grinding or polishing.

Consequently, an end face 25A of the conductive member 65 formed in the first mounting region, an end face 26A of the conductive member 65 formed in the second mounting region and an end face 32A of the heat intercepting member 32 are set on almost the level with the upper surface 22A of the insulating film 22. Therefore, it is possible to form pads 28 and 29 and a wiring 31 on an upper surface side of a structure shown in FIG. 10.

At the conductive member and/or heat intercepting member removing step, in some cases in which the heat intercepting member 32 is removed, the insulating film 22 formed on the upper surface 55A of the base material 55 is gone. In the embodiment, however, the following description will be given by taking, as an example, the case in which the insulating film 22 is left. In the case in which the insulating film 22 is gone at the conductive member and/or heat intercepting member removing step, moreover, it is necessary to form the insulating film separately. In this case, the same processing as a step shown in FIG. 42 which will be described below in a third embodiment is carried out to separately form the insulating film.

Figure 11:
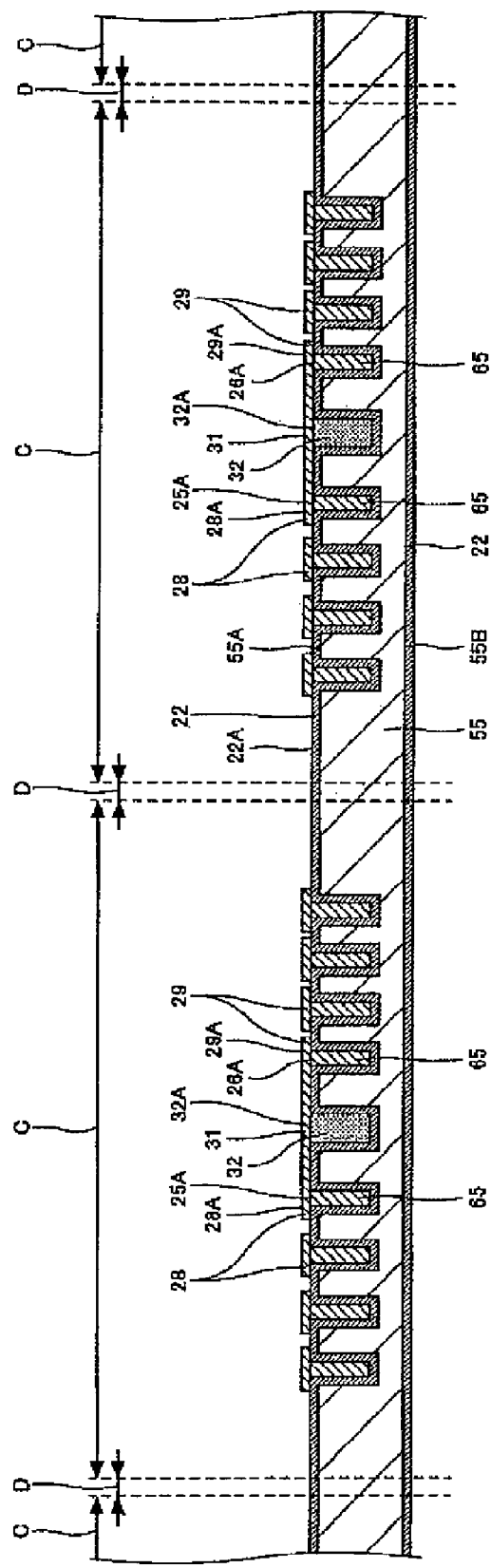
FIG. 11 is a view (No. 9) showing step of manufacturing the semiconductor device according to the first embodiment of invention.

At a step shown in FIG. 11, thereafter, the pads 28 and 29 and the wiring 31 are formed on an upper surface side of the structure illustrated in FIG. 10 at the same time (a pad forming step). More specifically, a seed layer is formed by a sputtering method and the pads 28 and 29 and the wiring 31 are then formed by a semiadditive process. For materials of the pads 28 and 29 and the wiring 31, it is possible to use Cu, for example.

At a step shown in FIG. 12, subsequently, a solder resist layer 39 is formed on the upper surface 22A of the insulating film 22. The solder resist layer 39 has an opening portion 39A for exposing a connecting surface 28A and an opening portion 39B for exposing a connecting surface 29A.

Figure 12:
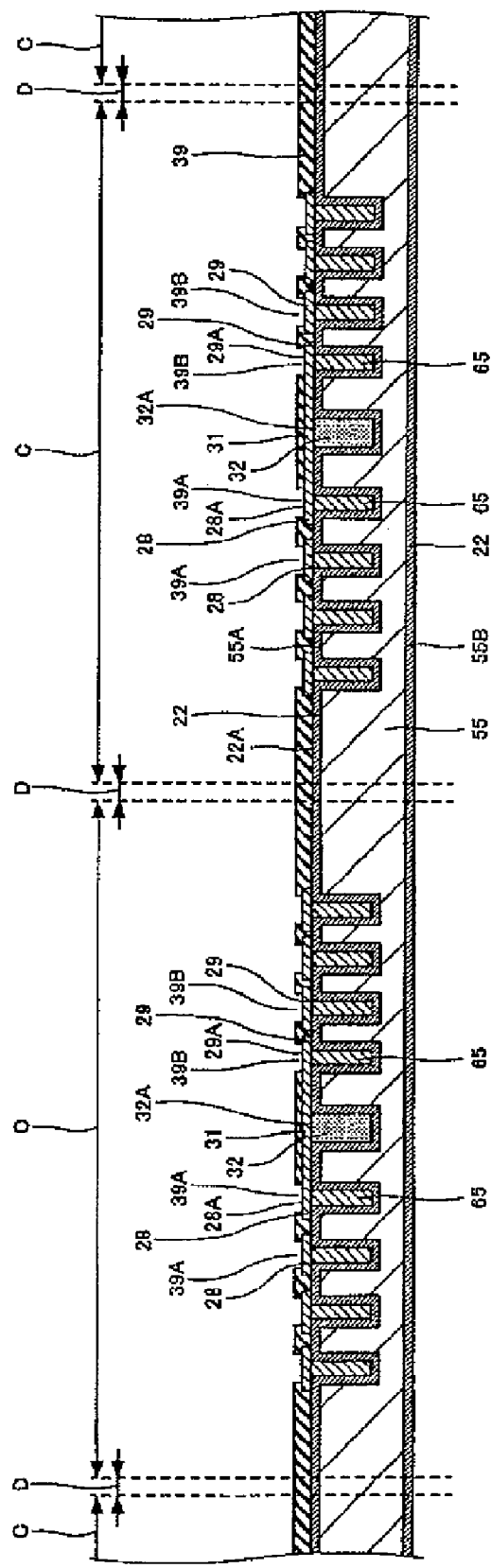
FIG. 12 is a view (No. 10) showing step of manufacturing the semiconductor device according to the first embodiment of invention.
Figure 13:
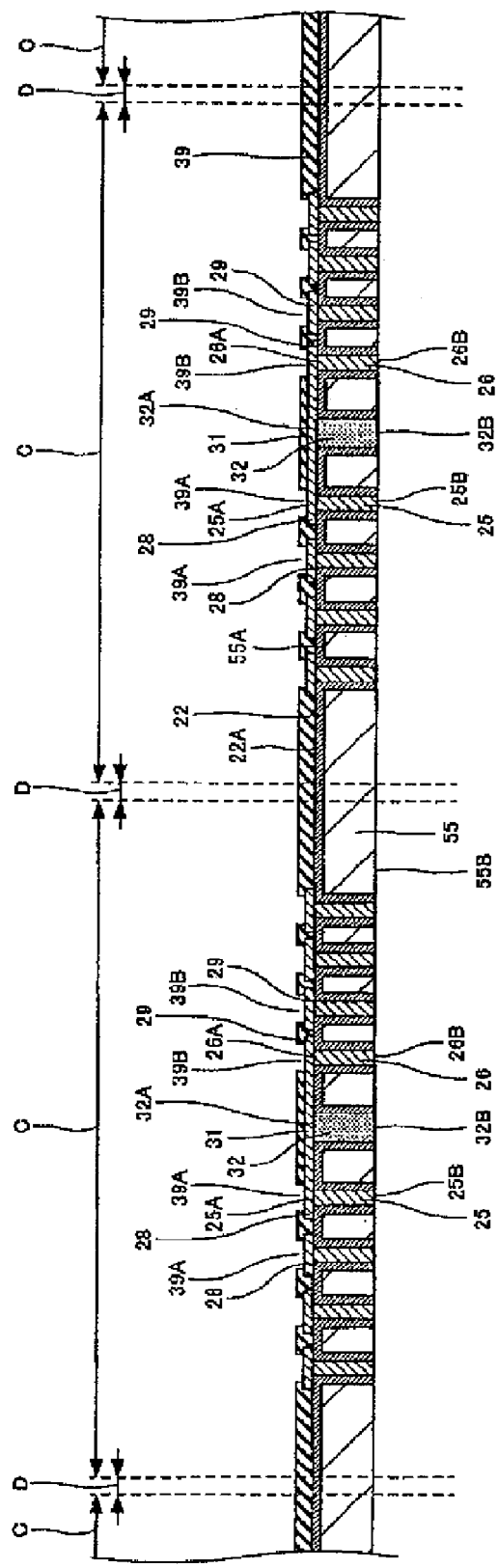
FIG. 13 is a view (No. 11) showing step of manufacturing the semiconductor device according to the first embodiment of invention.

At a step shown in FIG. 13, next, the base material 55 is thinned until lower ends of the conductive member 65 and the heat intercepting member 32 are exposed from a side of the surface 55B of the base material 55 (the second surface of the base material 55) illustrated in FIG. 12. Consequently, there are formed the heat intercepting member 32 penetrating the thinned base material 55 and the through electrodes 25 and 26 (a substrate thinning step).

More specifically, the base material 55 is thinned by grinding or polishing. At this time, the insulating film 22 formed on the lower surface 55B side of the base material 55 is removed so that end faces 25B and 26B of the through electrodes 25 and 26 and an end face 32B of the heat intercepting member 32 are set on almost the level with the lower surface 55B of the thinned base material 55. A thickness of the thinned base material 55 can be set to be 200 μm, for example.

Thus, the heat intercepting member 32 penetrating the base material 55 and serving to intercept a heat generated from the electronic component 13 in an operation is formed on the base material 55 in the portion positioned between the first mounting region and the second mounting region. Consequently, the heat generated from the electronic component 13 in the operation can be prevented from being transferred to the electronic component 12 through the substrate 21 in a corresponding portion to the first mounting region.

Figure 14:
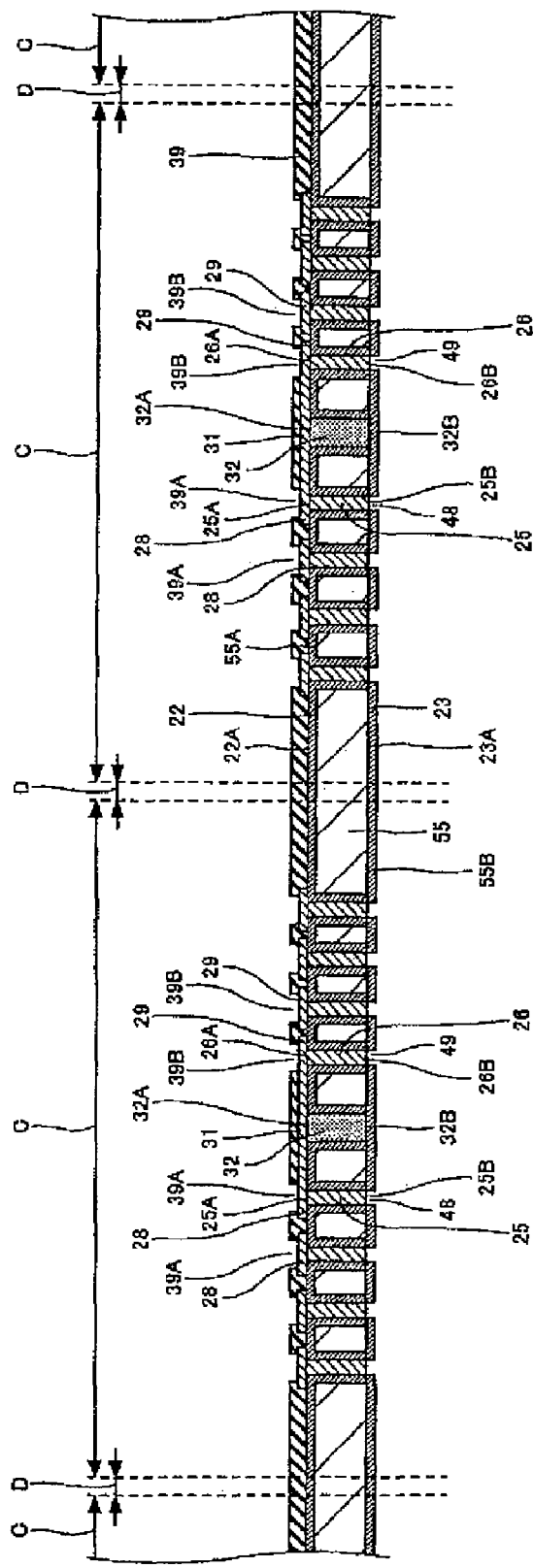
FIG. 14 is a view (No. 12) showing step of manufacturing the semiconductor device according to the first embodiment of invention.

At a step shown in FIG. 14, then, an insulating film 23 is formed on the lower surface 55B of the base material 55 illustrated in FIG. 13. The insulating film 23 has an opening portion 48 for exposing the end face 25B of the through electrode 25 and an opening portion 49 for exposing the end face 26B of the through electrode 26. For the insulating film 23, it is possible to use an oxide film formed by a CVD process (for example, an $SiO_2$ film) or an insulating resin layer, for instance. A thickness of the insulating film 22 can be set to be 1 μm, for example. The opening portions 48 and 49 can be formed by anisotropic etching using a mask (for example, dry etching) or a laser processing, for instance.

Figure 15:
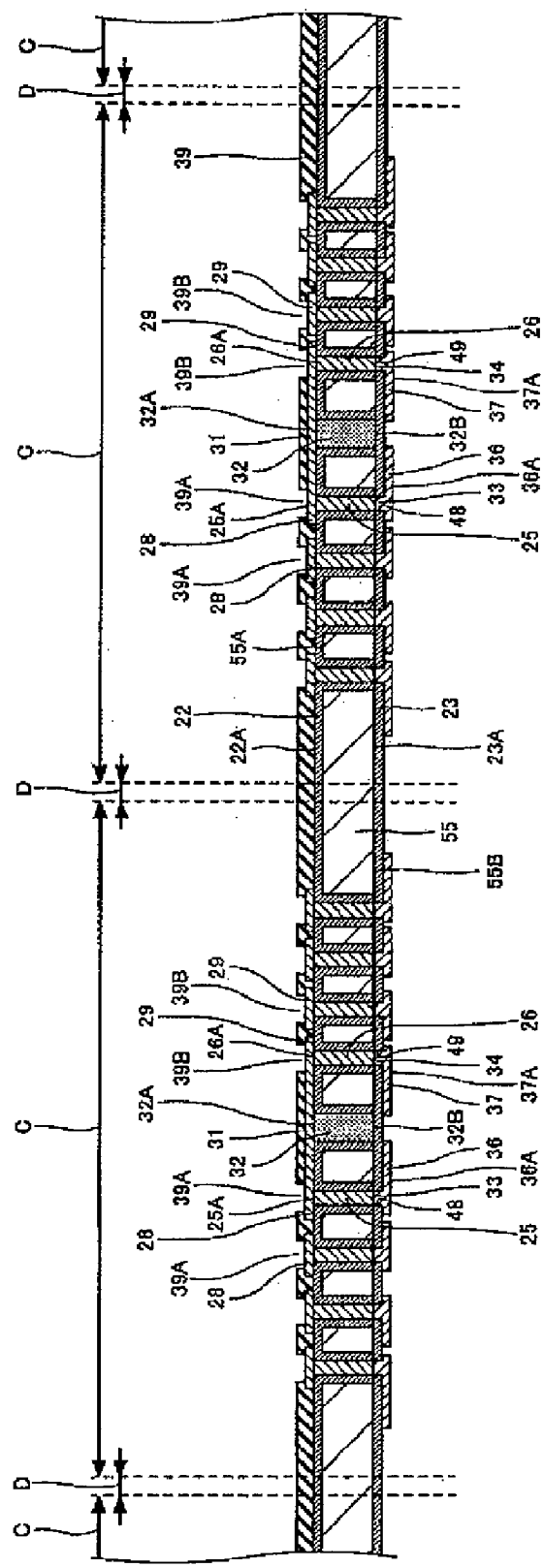
FIG. 15 is a view (No. 13) showing step of manufacturing the semiconductor device according to the first embodiment of invention.

At a step shown in FIG. 15, thereafter, vias 33 and 34 and external connecting pads 36 and 37 are formed on the lower surface side of the structure illustrated in FIG. 14 at the same time (an external connecting pad forming step).

More specifically, for example, a seed layer is formed by a sputtering method and the vias 33 and 34 and the external connecting pads 36 and 37 are then formed by a semiadditive process. For materials of the vias 33 and 34 and the external connecting pads 36 and 37, it is possible to use Cu, for example.

At a step shown in FIG. 16, subsequently, a solder resist layer 41 is formed on a lower surface 23A of the insulating film 23. The solder resist layer 41 has an opening portion 41A for exposing a connecting surface 36A and an opening portion 41B for exposing a connecting surface 37A. Consequently, the wiring board 11 is formed in the substrate forming regions C.

Figure 17:
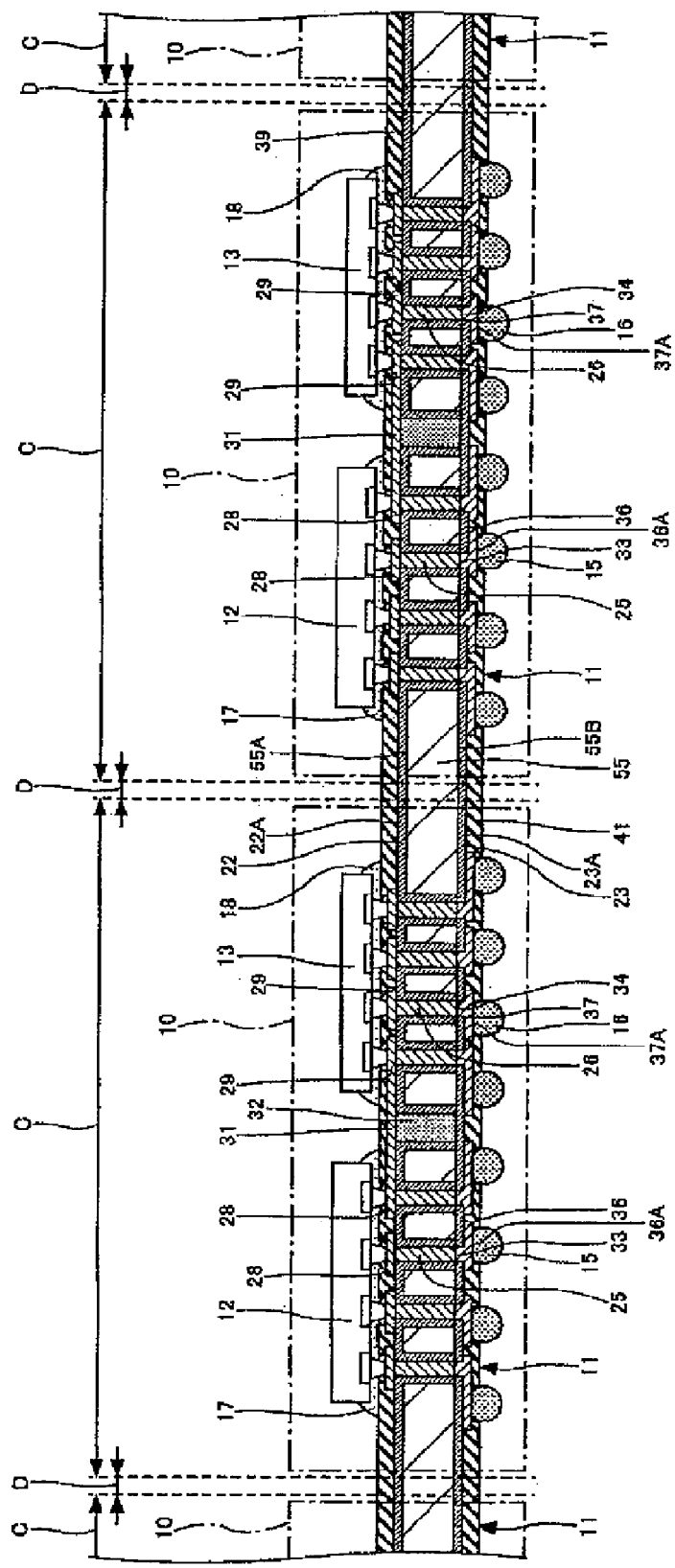
FIG. 17 is a view (No. 15) showing step of manufacturing the semiconductor device according to the first embodiment of invention.

At a step shown in FIG. 17, next, the electronic components 12 and 13 are mounted on the pads 28 and 29 of the wiring board 11 by a flip chip bonding. Then, a clearance between the electronic component 12 and the wiring board 11 is filled with an underfill resin 17, and a clearance between the electronic component 13 and the wiring board 11 is filled with an underfill resin 18. Thereafter, an external connecting terminal 15 is provided on the external connecting pad 36 and an external connecting terminal 16 is provided on the external connecting pad 37. Consequently, the semiconductor device 10 is manufactured in the substrate forming regions C.

Figure 18:
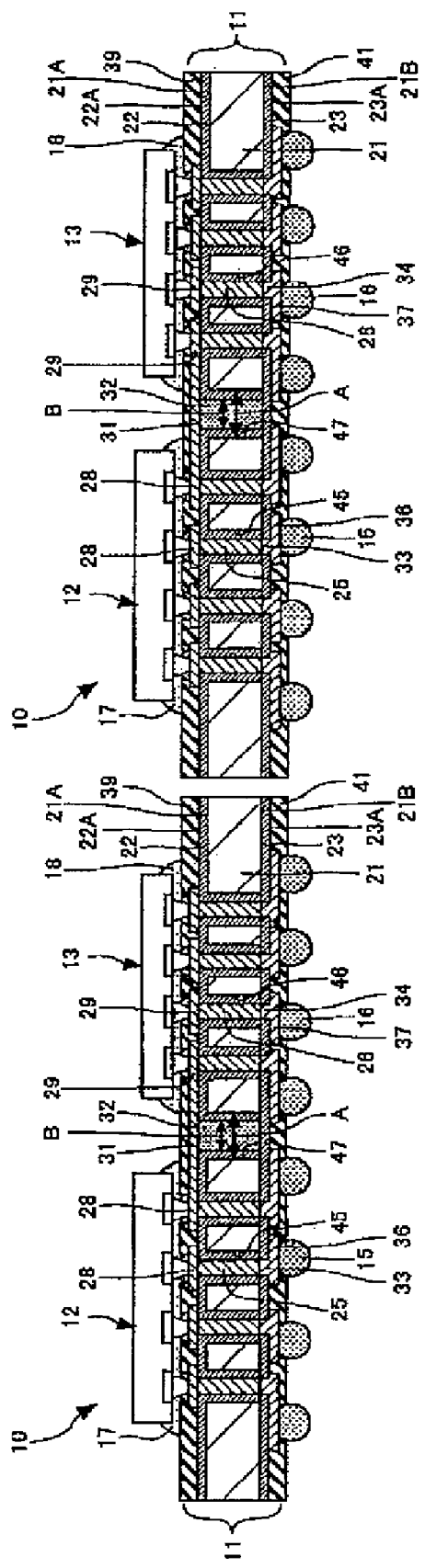
FIG. 18 is a view (No. 16) showing step of manufacturing the semiconductor device according to the first embodiment of invention.

At a step shown in FIG. 18, subsequently, the structure illustrated in FIG. 17 is cut along the cut region D so that the semiconductor devices 10 are obtained as individual pieces (a cutting step).

According to the method of manufacturing the wiring board of the exemplary embodiment of the invention, the opening portions 57, 58 which do not penetrate the base material 55 and the trench 59 which is positioned between the first mounting region for mounting the electronic component 12 thereon and the second mounting region for mounting the electronic component 13 thereon and does not penetrate the base material 55 are formed on the base material 55 from the upper surface 55A side of the base material 55 at the same time. Subsequently, the heat intercepting member 32 for intercepting a heat is formed in the trench 59. Then, the conductive members 65 serving as the base metals of the through electrodes 25, 26 are formed in the opening portions 57, 58. Thereafter, the pads 28, 29 are formed. Next, the base material 55 is thinned until the conductive member 65 and the heat intercepting member 32 are exposed from the lower surface 55B side of the base material 55 to form the through electrodes 25 and 26. Consequently, the heat intercepting member 32 penetrating the base material 55 and serving to intercept the heat generated from the electronic component 13 in the operation is formed on the base material 55 in the portion positioned between the first mounting region and the second mounting region. Therefore, the heat generated from the electronic component 13 in the operation can be prevented from being transferred to the electronic component 12 through the substrate in the corresponding portion to the first mounting region.

Figure 19:
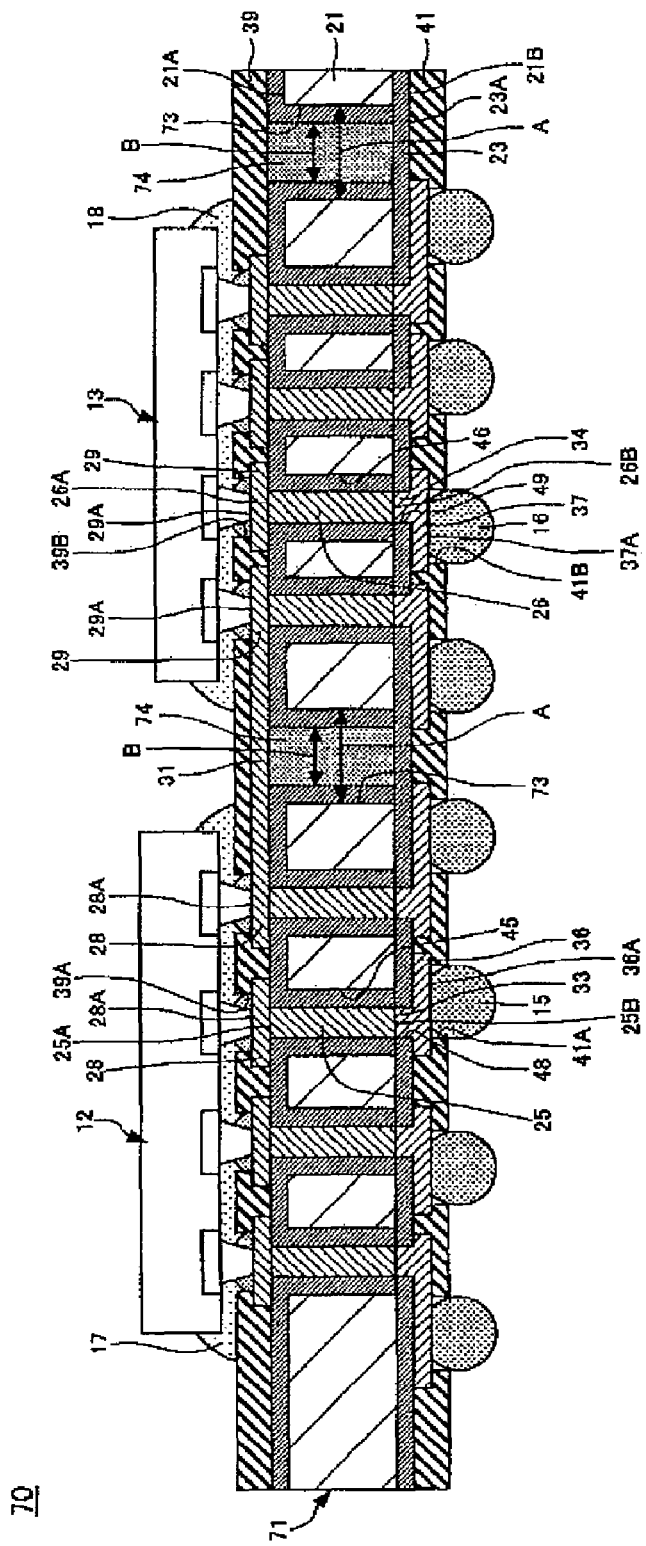
FIG. 19 is a sectional view showing a semiconductor device according to variant of the first embodiment of invention.
Figure 20:
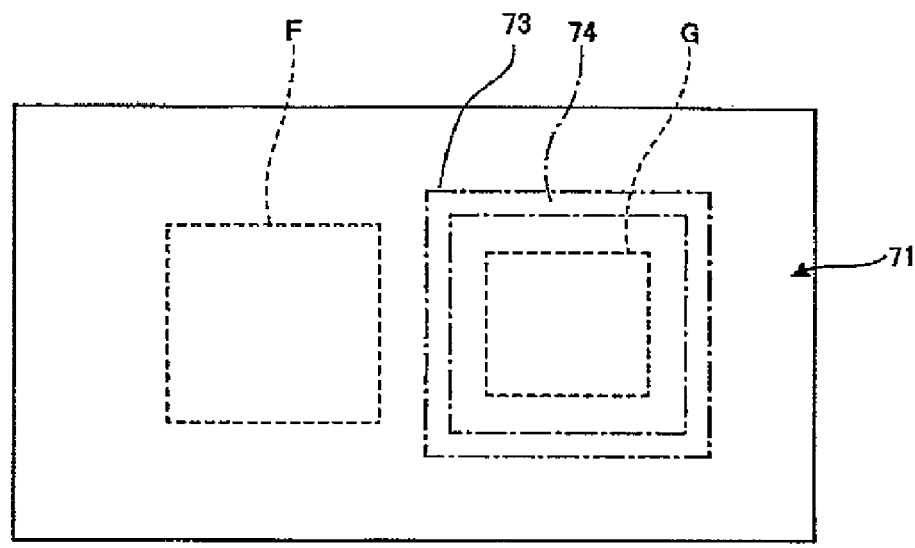
FIG. 20 is a view for explaining a through trench and a heat intercepting member provided in a semiconductor device according to variant of the first embodiment of invention.

FIG. 19 is a sectional view showing a semiconductor device according to a variant of the first embodiment of the invention, and FIG. 20 is a view for explaining a through trench and a heat intercepting member which are provided in the semiconductor device according to the variant of the first embodiment of the invention. In FIG. 19, the same components as those of the semiconductor device 10 according to the first embodiment have the same reference numerals. In FIG. 20, moreover, F denotes a first mounting region on which an electronic component 12 is to be mounted (which will be hereinafter referred to as a "first mounting region F") and G denotes a second mounting region on which an electronic component 13 is to be mounted (which will be hereinafter referred to as a "second mounting region G").

With reference to FIGS. 19 and 20, a semiconductor device 70 according to the variant of the first embodiment has the same structure as that of the semiconductor device 10 except that a wiring board 71 is provided in place of the wiring board 11 disposed in the semiconductor device 10 according to the first embodiment.

The wiring board 71 has the same structure as that of the wiring board 11 except that a through trench 73 and a heat intercepting member 74 are provided in place of the through trench 47 and the heat intercepting member 32 which are provided on the wiring board 11.

The through trench 73 is formed on a substrate 21 to continuously surround the substrate 21 in a corresponding portion to the second mounting region G. The through trench 73 is set to take a shape of a frame. A width A of the through trench 73 can be set to be 200 μm, for example.

The heat intercepting member 74 is provided in the through trench 73. The heat intercepting member 74 has the same structure as that of the heat intercepting member 32 described above except that a shape thereof is set to be a shape of a frame.

According to the wiring board in accordance with the variant of the embodiment, the through trench 73 for continuously surrounding the substrate 21 in the corresponding portion to the second mounting region G is formed on the substrate 21 and the heat intercepting member 74 taking the shape of the frame is provided in the through trench 73. Consequently, a heat generated from the electronic component 13 in an operation can be prevented from being transferred to a region other than the second mounting region G. Therefore, the heat generated from the electronic component 13 in the operation can be prevented from being transferred to the electronic component 12 through the substrate 21 in a corresponding portion to the first mounting region F.

The wiring board 71 according to the variant of the first embodiment can be manufactured by the same technique as that for the wiring board 11 according to the first embodiment described above.

Figure 21:
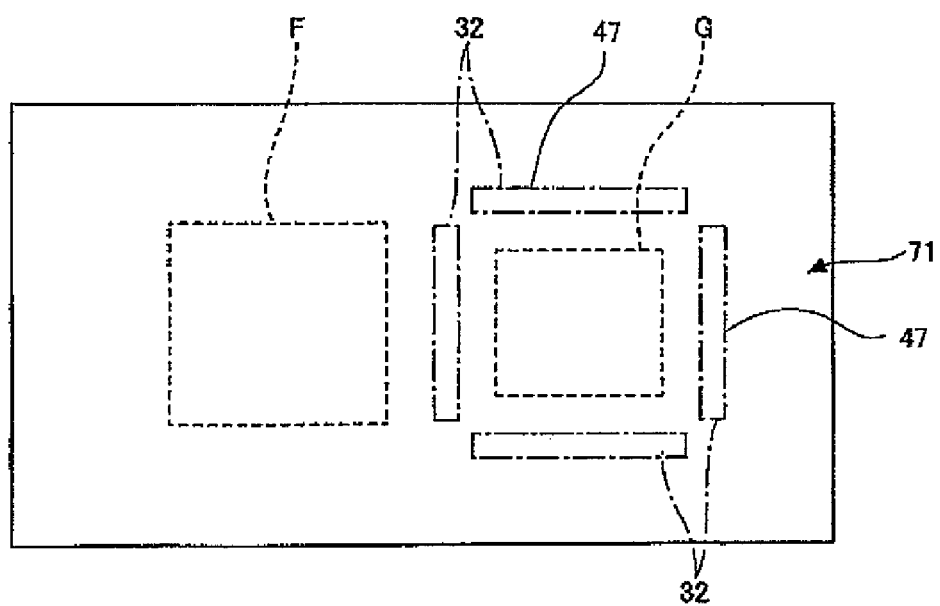
FIG. 21 is a view showing example of layout of a heat intercepting member.

FIG. 21 is a view showing an example of a layout of the heat intercepting member.

As shown in FIG. 21, a plurality of heat intercepting members 32 described with reference to FIG. 2 may be disposed to surround the second mounting region G. In this case, it is possible to obtain the same advantages as those of the wiring board 71 according to the variant of the first embodiment.

(Second Embodiment)

Figure 22:
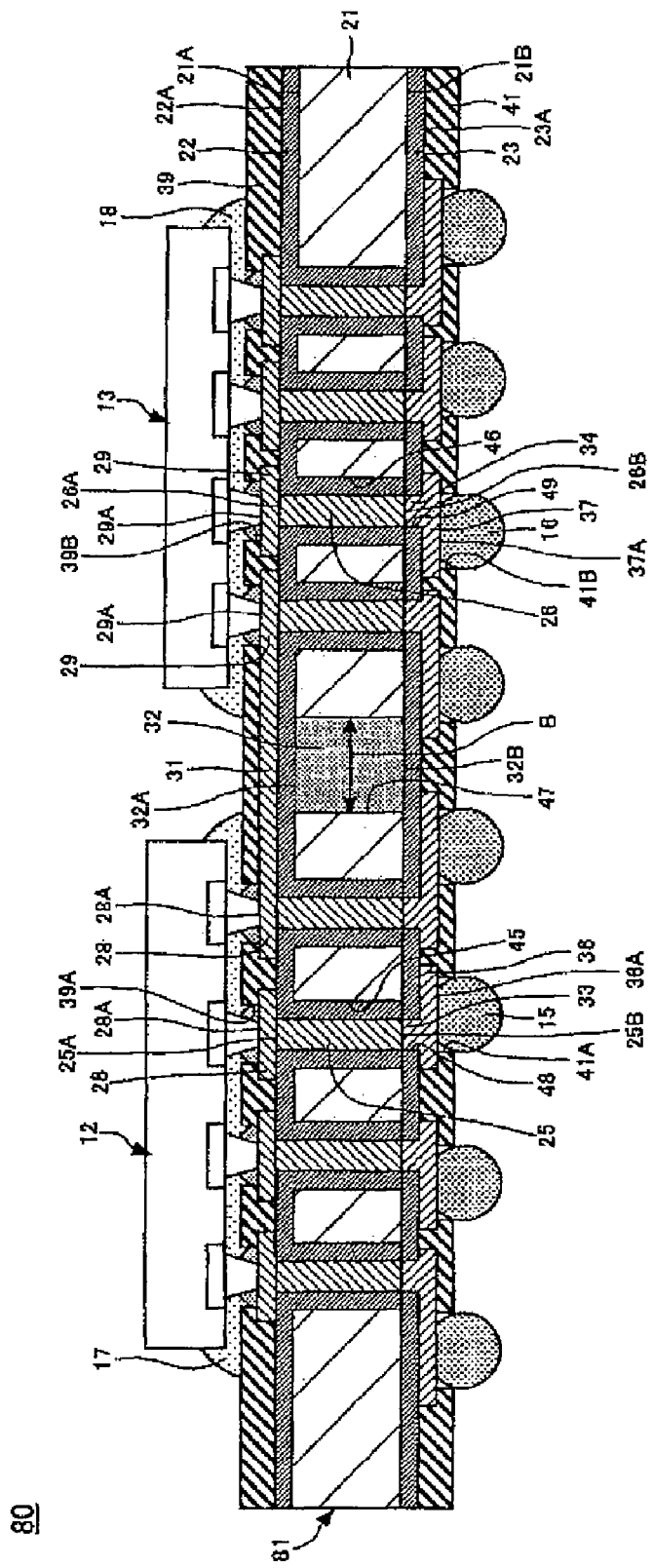
FIG. 22 is a sectional view showing a semiconductor device according to a second embodiment of invention.
Figure 23:
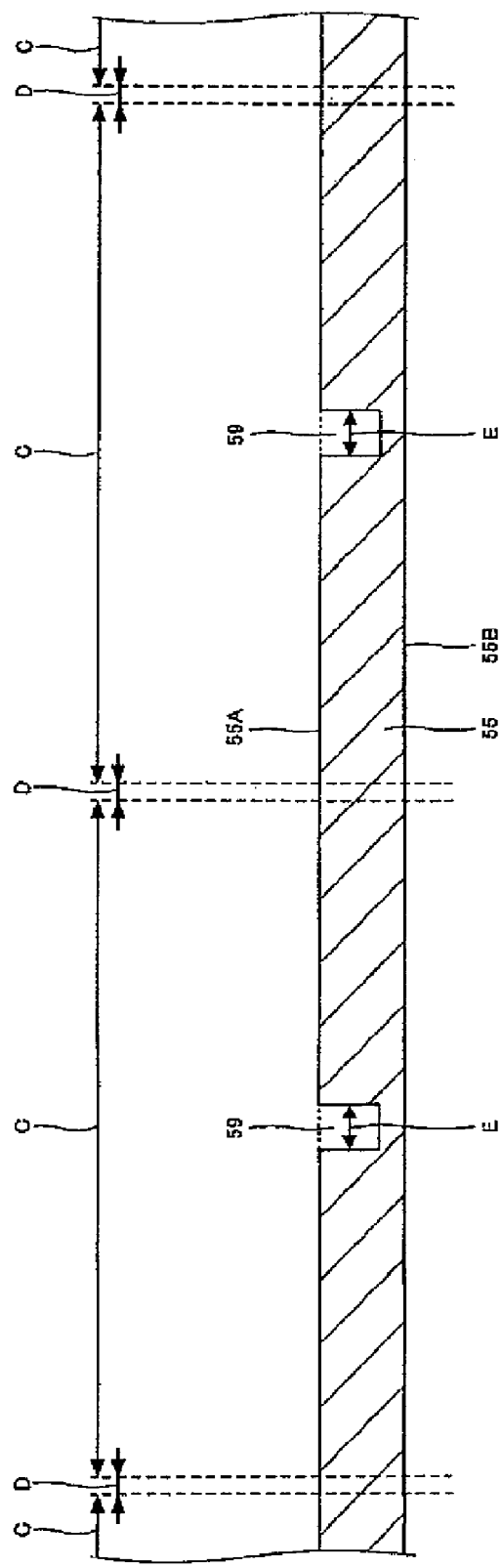
FIG. 23 is a view (No. 1) showing step of manufacturing the semiconductor device according to the second embodiment of invention.

FIG. 22 is a sectional view showing a semiconductor device according to a second embodiment of the invention. In FIG. 22, the same components as those of the semiconductor device 10 according to the first embodiment have the same reference numerals.

With reference to FIG. 22, a semiconductor device 80 according to the second embodiment has the same structure as that of the semiconductor device 10 except that a wiring board 81 is provided in place of the wiring board 11 disposed in the semiconductor device according to the first embodiment.

The wiring board 81 has the same structure as that of the wiring board 11 except that the insulating film 22 in the portion formed on the side surface of the through trench 47 provided on the wiring board 11 is excluded from the components. In other words, there is employed a structure in which the side surface of the through trench 47 is provided in contact with a sidewall of a heat intercepting member 32 having an insulating property.

In the wiring board 81 according to the second embodiment which has the structure described above, it is possible to obtain the same advantages as those of the wiring board 11 according to the first embodiment.

FIGS. 23 to 32 are views showing a process for manufacturing the semiconductor device according to the second embodiment of the invention. In FIGS. 23 to 32, the same components as those in the semiconductor device 80 according to the second embodiment have the same reference numerals.

With reference to FIGS. 23 to 32, description will be given to a method of manufacturing the semiconductor device 80 according to the second embodiment. First of all, there is prepared the base material 55 shown in FIG. 3 which has been described in the first embodiment (a base material preparing step). At the step shown in FIG. 23, then, a trench 59 which does not penetrate the base material 55 is formed on the base material 55 in a portion positioned between a first mounting region for mounting an electronic component 12 thereon and a second mounting region for mounting an electronic component 13 thereon from the upper surface 55A side of the base material 55 illustrated in FIG. 3 which has been described in the first embodiment (a trench forming step).

The trench 59 is formed by anisotropic etching using a mask (for example, dry etching), for instance. The trench 59 is changed into the through trench 47 shown in FIG. 22 by thinning the base material 55 at a base material thinning step illustrated in FIG. 29 which will be described below. A depth of the trench 59 can be set to be 220 μm, for example. A width E of the trench 59 can be set to be 200 μm, for example.

Figure 24:
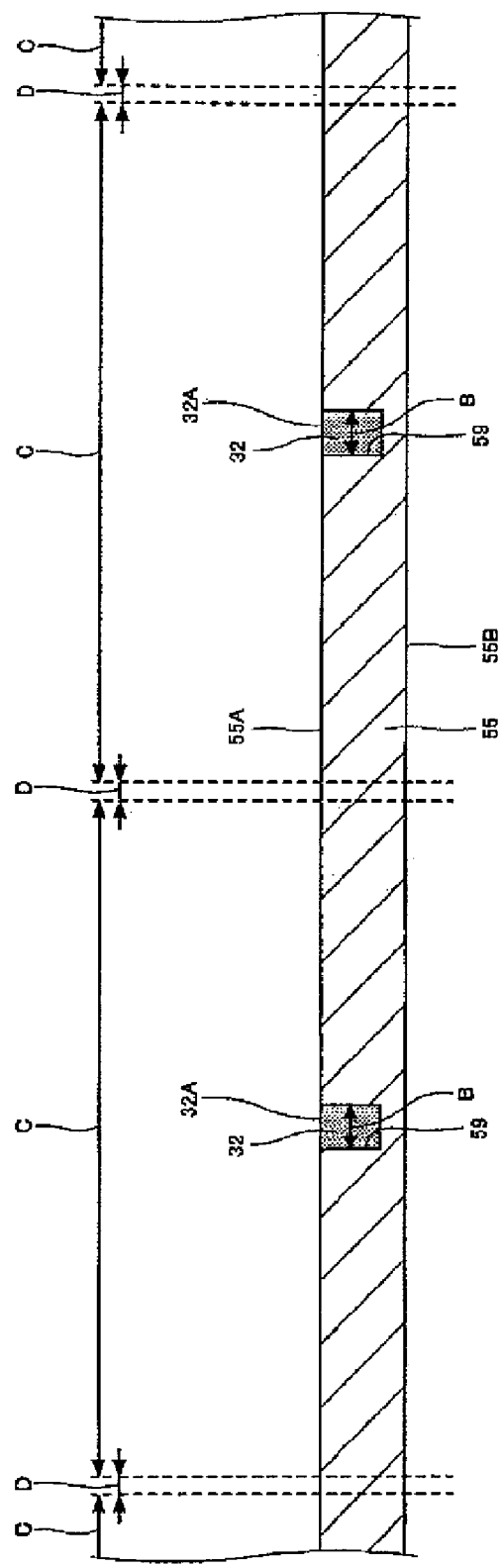
FIG. 24 is a view (No. 2) showing step of manufacturing the semiconductor device according to the second embodiment of invention.

At a step shown in FIG. 24, subsequently, there are carried out the same processings as those in the steps illustrated in FIGS. 6 to 8 and 10 which have been described in the first embodiment. Consequently, a heat intercepting member 32 having an end face 32A which is on almost the level with the upper surface 55A of the base material 55 is formed in the trench 59 (a heat intercepting member forming step).

Figure 25:
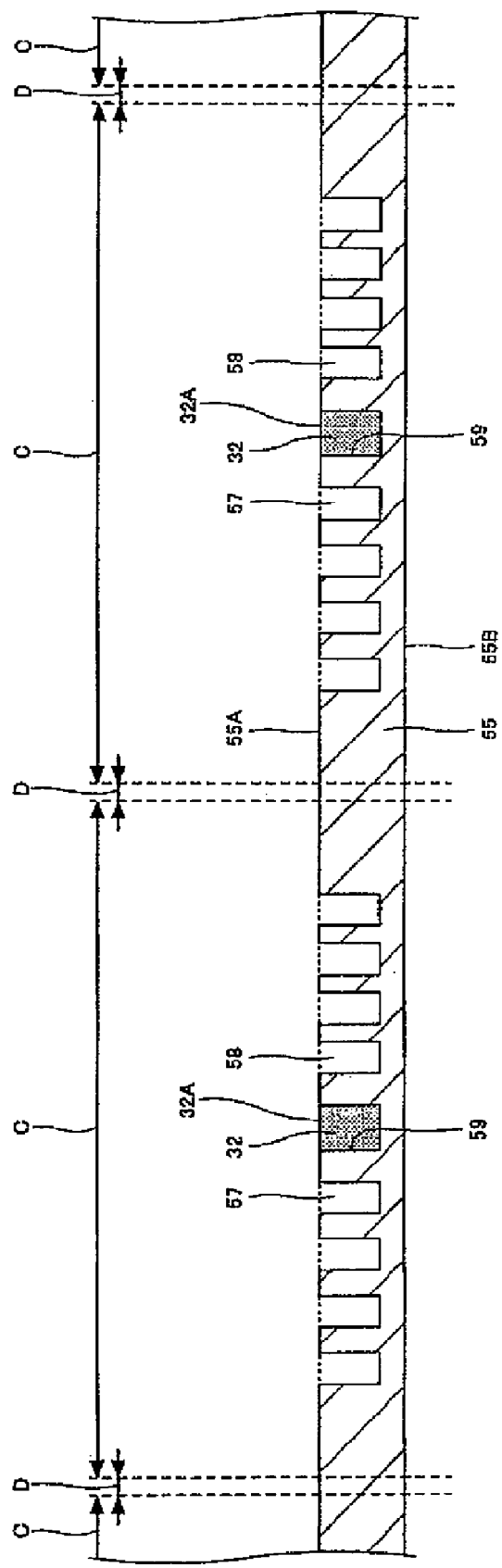
FIG. 25 is a view (No. 3) showing step of manufacturing the semiconductor device according to the second embodiment of invention.

At a step shown in FIG. 25, then, an opening portion 57 corresponding to a position in which a through electrode 25 is to be formed and an opening portion 58 corresponding to a position in which a through electrode 26 is to be formed are provided on the base material 55 from the upper surface 55A side of the base material 55 at the same time (an opening portion forming step).

At this time, the opening portions 57 and 58 are formed so as not to penetrate the base material 55. The opening portions 57 and 58 can be formed by anisotropic etching using a mask (for example, dry etching), for instance. Depths of the opening portions 57 and 58 can be set to be 220 μm, for example.

The opening portion 57 is changed into a through hole 45 shown in FIG. 22 by thinning the base material 55 at the base material thinning step illustrated in FIG. 29 as will be described below. Moreover, the opening portion 58 is changed into a through hole 46 shown in FIG. 22 by thinning the base material 55 at the base material thinning step illustrated in FIG. 29 as will be described below.

Figure 26:
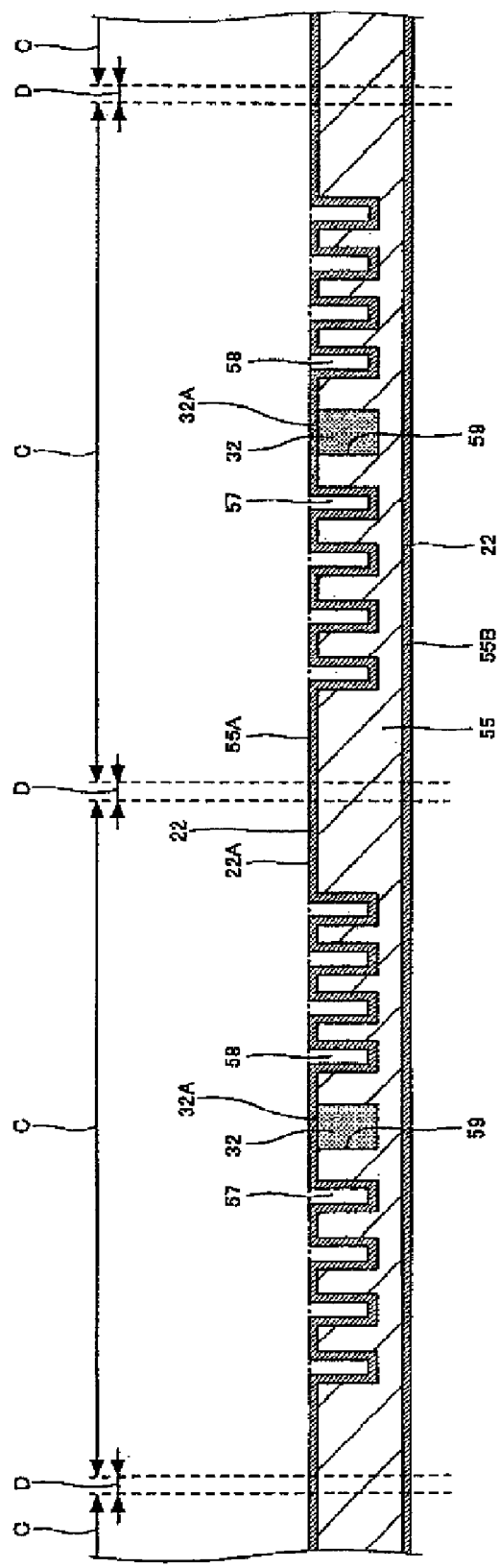
FIG. 26 is a view (No. 4) showing step of manufacturing the semiconductor device according to the second embodiment of invention.

At a step shown in FIG. 26, thereafter, there is formed an insulating film 22 for covering surfaces of the base material 55 on which the opening portions 57 and 58 are formed (more specifically, both surfaces 55A and 55B of the base material 55 and a surface of the base material 55 in a portion constituting the opening portions 57 and 58). For the insulating film 22, it is possible to use an oxide film formed by a CVD process (for example, an $SiO_2$ film), for instance. A thickness of the insulating film 22 can be set to be 1 μm, for example.

Figure 27:
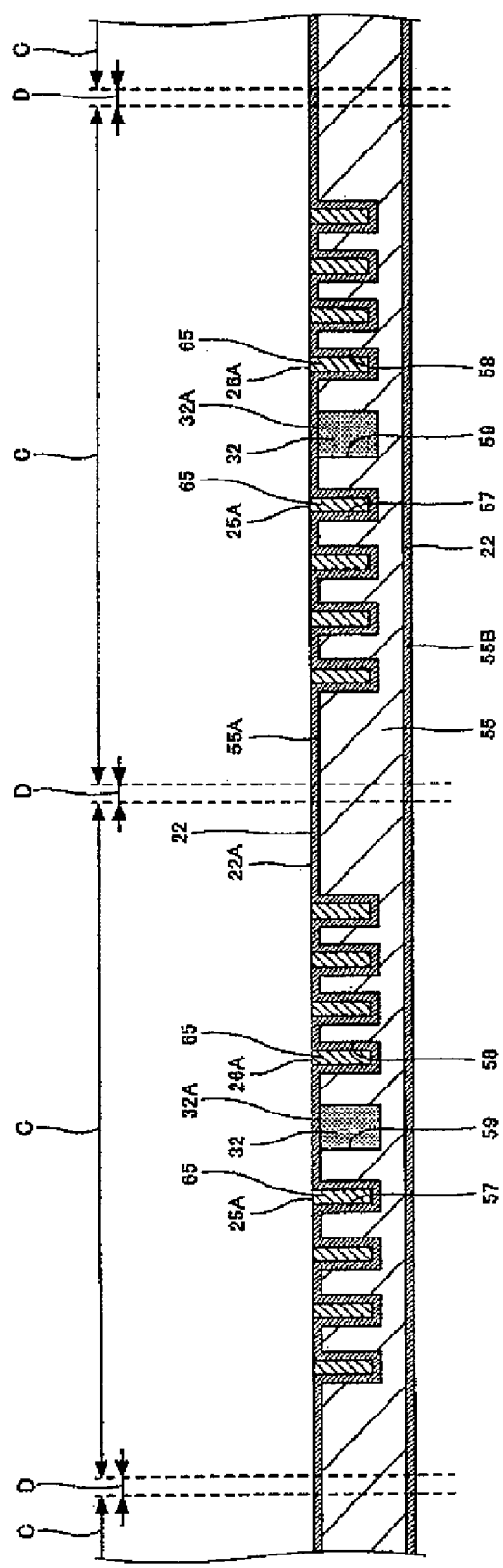
FIG. 27 is a view (No. 5) showing step of manufacturing the semiconductor device according to the second embodiment of invention.

At a step shown in FIG. 27, next, there is carried out the same processing as the step illustrated in FIG. 9 which has been described in the first embodiment. Consequently, a conductive member 65 serving as a metal material of the through electrodes 25 and 26 is formed in the opening portions 57 and 58 (a conductive member forming step), and the conductive member 65 in a protruded portion from an upper surface 22A of the insulating film 22 is then removed (a conductive member removing step). The conductive member 65 in the protruded portion from the upper surface 22A of the insulating film 22 is removed by polishing, for example. At the step shown in FIG. 27, polishing using a polishing solution capable of removing only the conductive member 65 is carried out. Therefore, the insulating film 22 formed on the upper surface 55A of the base material 55 can be prevented from being polished.

Figure 28:
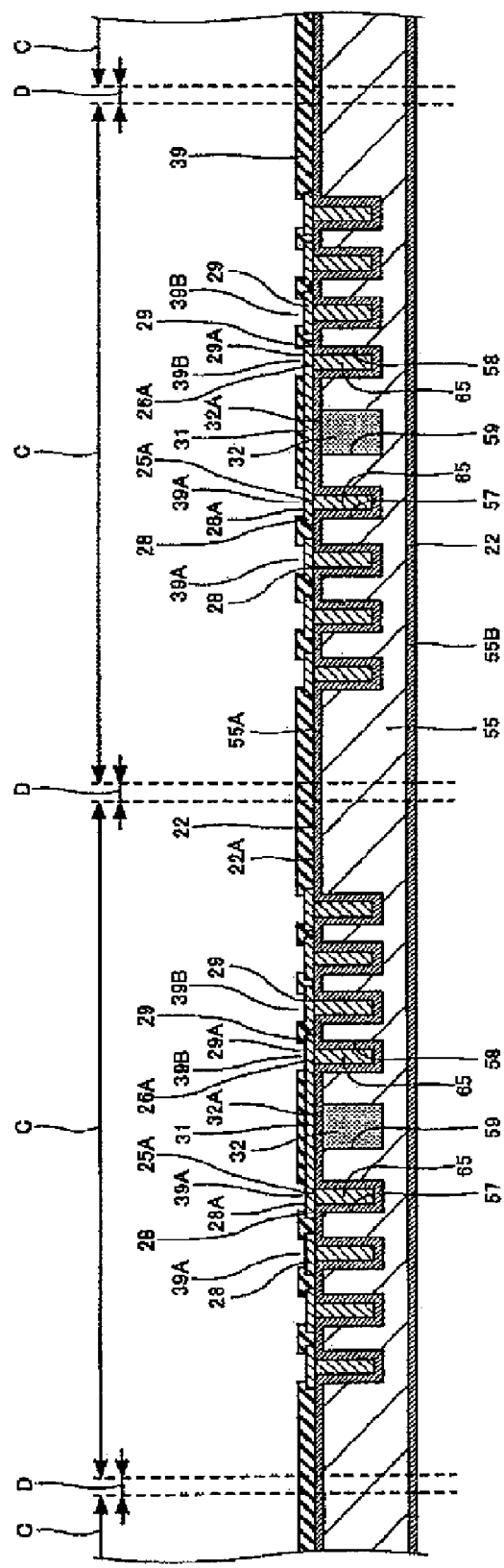
FIG. 28 is a view (No. 6) showing step of manufacturing the semiconductor device according to the second embodiment of invention.

At a step shown in FIG. 28, subsequently, there is carried out the same processing as the step illustrated in FIG. 11 which has been described in the first embodiment. Consequently, pads 28 and 29 and a wiring 31 are formed on an upper surface side of the structure shown in FIG. 27 at the same time (a pad forming step) and a solder resist layer 39 having an opening portion 39A for exposing a connecting surface 28A and an opening portion 39B for exposing a connecting surface 29A is then formed on the upper surface 22A of the insulating film 22.

Figure 29:
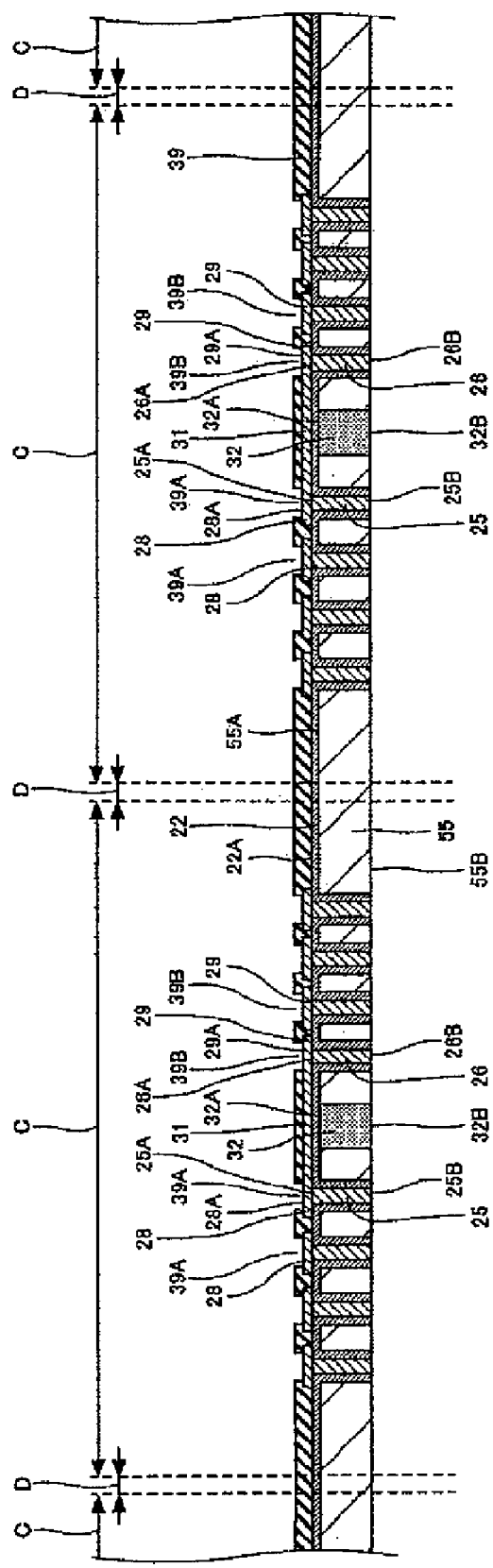
FIG. 29 is a view (No. 7) showing step of manufacturing the semiconductor device according to the second embodiment of invention.

At a step shown in FIG. 29, next, there is carried out the same processing as the step illustrated in FIG. 13 which has been described in the first embodiment. Consequently, the base material 55 is thinned until lower ends of the conductive member 65 and the heat intercepting member 32 are exposed from the surface 55B side of the base material 55 shown in FIG. 28 so that the heat intercepting member 32 penetrating the thinned base material 55 and the through electrodes 25 and 26 are formed (a substrate thinning step). A thickness of the thinned base material 55 can be set to be 200 μm, for example.

Thus, the heat intercepting member 32 penetrating the base material 55 and serving to intercept a heat generated from the electronic component 13 in an operation is formed on the base material 55 in the portion positioned between the first mounting region and the second mounting region. Consequently, the heat generated from the electronic component 13 in the operation can be prevented from being transferred to the electronic component 12 through a substrate 21 in a corresponding portion to the first mounting region.

Figure 16:
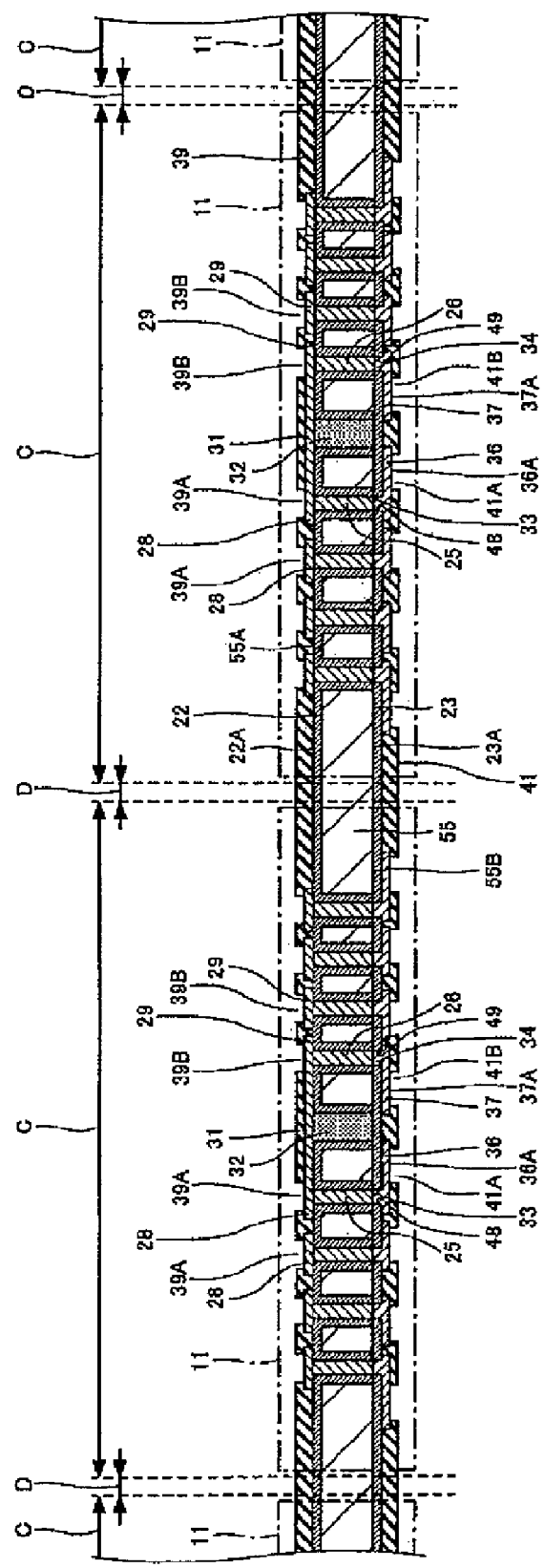
FIG. 16 is a view (No. 14) showing step of manufacturing the semiconductor device according to the first embodiment of invention.
Figure 30:
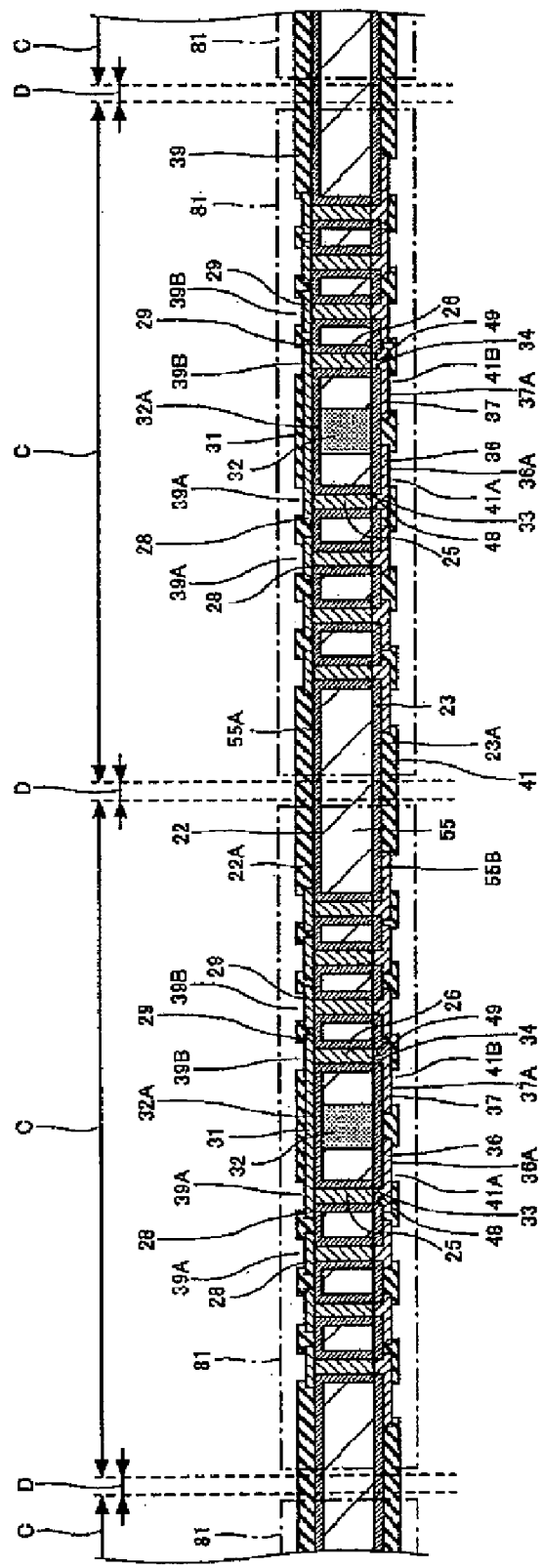
FIG. 30 is a view (No. 8) showing step of manufacturing the semiconductor device according to the second embodiment of invention.

At a step shown in FIG. 30, thereafter, there are carried out the same processings as the steps illustrated in FIGS. 14 to 16 which have been described in the first embodiment (the steps including "the external connecting pad forming step"). Consequently, an insulating film 23, vias 33 and 34, external connecting pads 36 and 37, and a solder resist layer 41 are formed. Thus, a wiring board 81 is formed in a plurality of substrate forming regions C.

Figure 31:
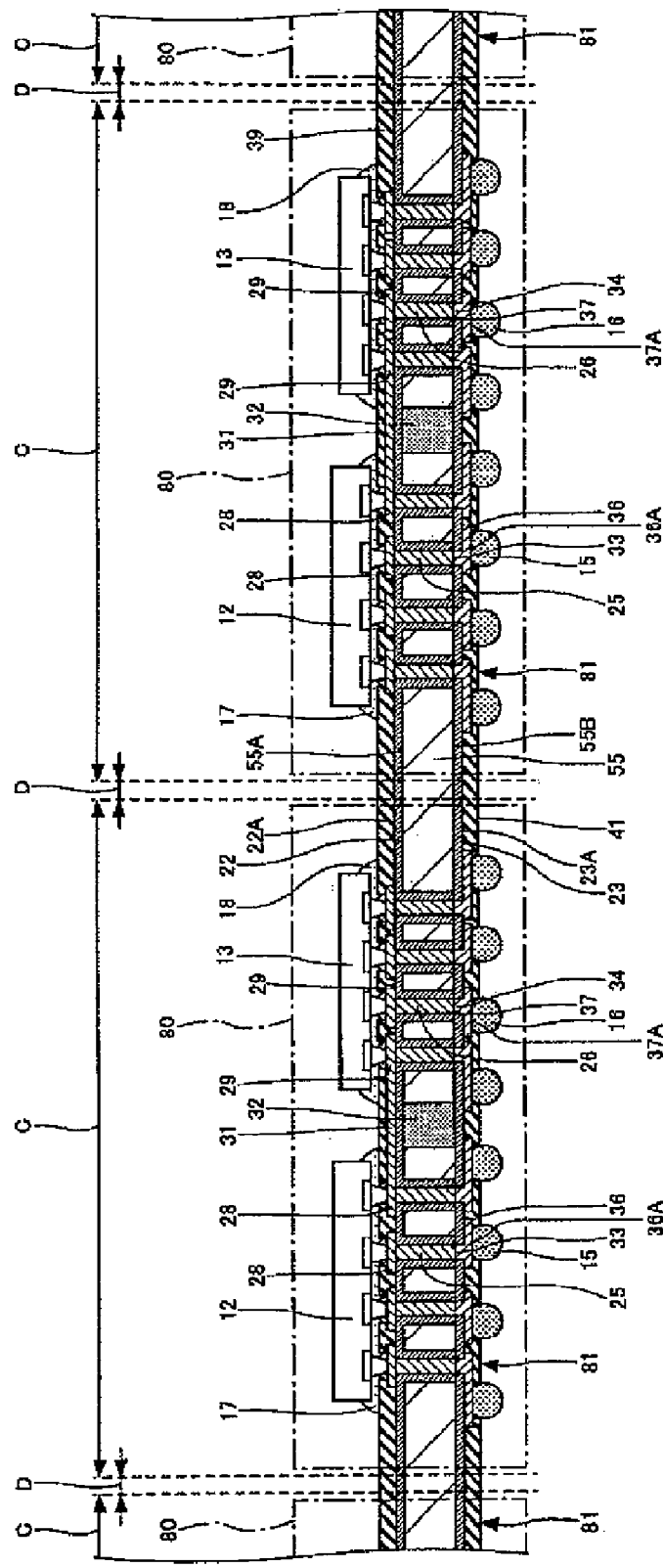
FIG. 31 is a view (No. 9) showing step of manufacturing the semiconductor device according to second embodiment of invention.

At a step shown in FIG. 31, next, the electronic components 12 and 13 are mounted on the pads 28 and 29 of the wiring board 81 by a flip chip bonding. Then, a clearance between the electronic component 12 and the wiring board 81 is filled with an underfill resin 17, and a clearance between the electronic component 13 and the wiring board 81 is filled with an underfill resin 18. Thereafter, an external connecting terminal 15 is provided on the external connecting pad 36 and an external connecting terminal 16 is provided on the external connecting pad 37. Consequently, the semiconductor device 80 is manufactured in the substrate forming regions C.

Figure 32:
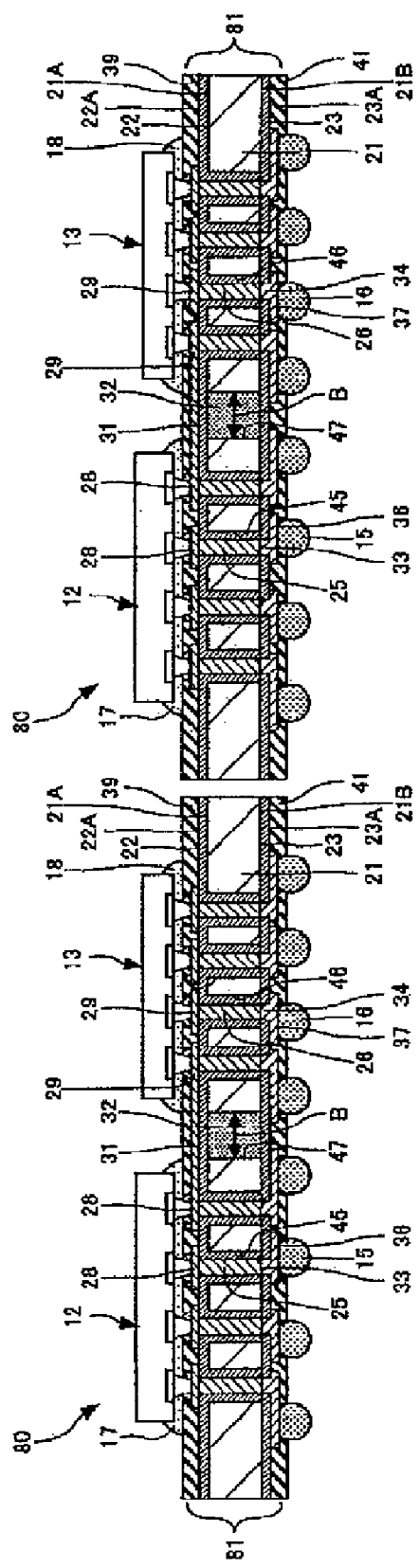
FIG. 32 is a view (No. 10) showing step of manufacturing the semiconductor device according to the second embodiment of invention.

At a step shown in FIG. 32, subsequently, the structure illustrated in FIG. 31 is cut along a cut region D so that the semiconductor devices 80 are obtained as individual pieces (a cutting step).

According to the method of manufacturing the wiring board of the exemplary embodiment of the invention, the trench 59 which does not penetrate the base material 55 is formed from the upper surface 55A side of the base material 55 on the base material 55 in the portion positioned between the first mounting region on which the electronic component 12 is to be mounted and the second mounting region on which the electronic component 13 is to be mounted. Subsequently, the heat intercepting member 32 for intercepting a heat is formed in the trench 59. Then, the opening portions 57, 58 which correspond to the forming positions for the through electrodes 25, 26 and do not penetrate the base material 55 are formed on the base material 55 from the upper surface 55A side of the base material 55 at the same time. Thereafter, the conductive members 65 serving as the base metals of the through electrodes 25, 26 are formed in the opening portions 57, 58. Next, the pads 28, 29 are formed. Subsequently, the base material 55 is thinned until the conductive member 65 and the heat intercepting member 32 are exposed from the lower surface 55B side of the base material 55. Consequently, the heat intercepting member 32 penetrating the base material 55 and serving to intercept the heat generated from the electronic component 13 in the operation is formed on the base material 55 in the portion positioned between the first mounting region and the second mounting region. Therefore, the heat generated from the electronic component 13 in the operation can be prevented from being transferred to the electronic component 12 through the substrate 21 in the corresponding portion to the first mounting region.

In place of the heat intercepting member 32 provided in the wiring board 81 according to the embodiment, it is also possible to provide the heat intercepting member 74 described with reference to FIG. 20 in the first embodiment or the heat intercepting members 32 described with reference to FIG. 21 in the first embodiment.

(Third Embodiment)

Figure 33:
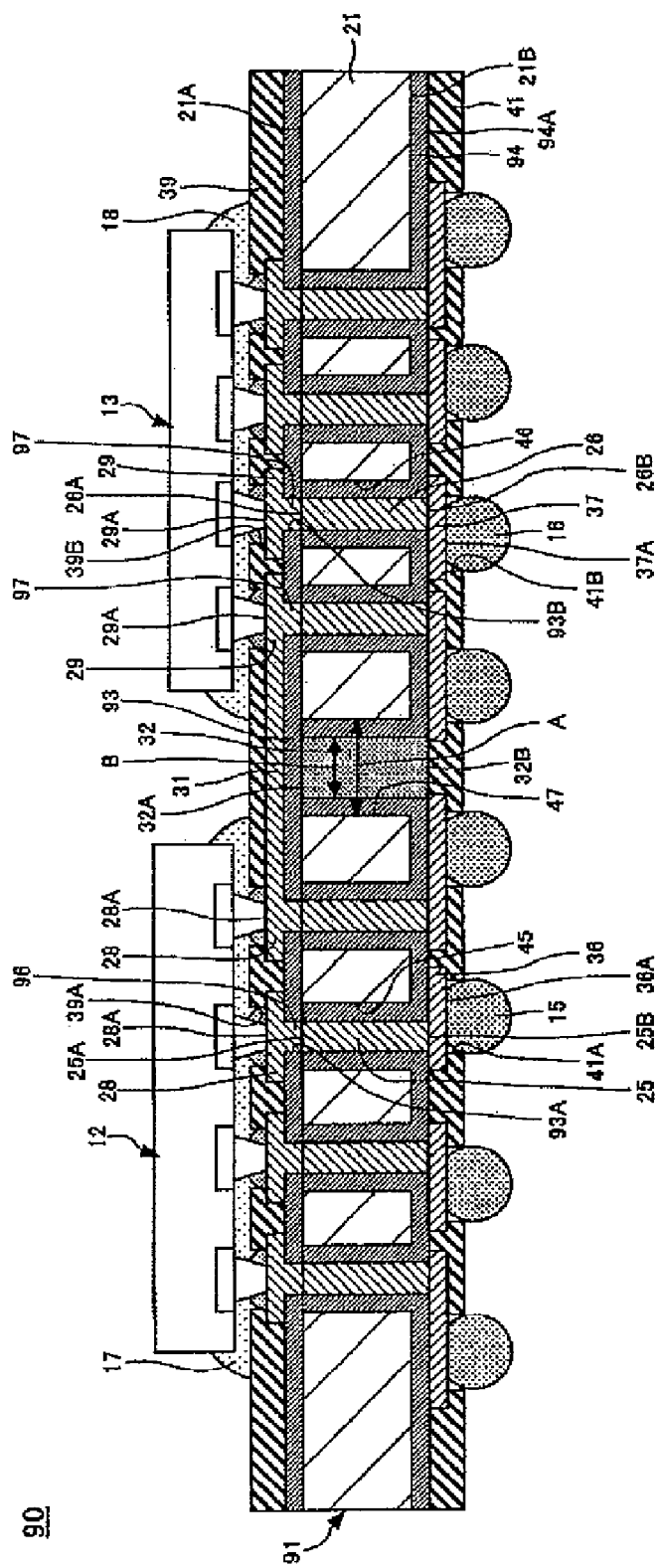
FIG. 33 is a sectional view showing a semiconductor device according to a third embodiment of invention.

FIG. 33 is a sectional view showing a semiconductor device according to a third embodiment of the invention. In FIG. 33, the same components as those in the semiconductor device 10 according to the first embodiment have the same reference numerals.

With reference to FIG. 33, a semiconductor device 90 according to the third embodiment has the same structure as that of the semiconductor device 10 except that a wiring board 91 is provided in place of the wiring board 11 disposed in the semiconductor device 10 according to the first embodiment.

The wiring board 91 has the same structure as that of the wiring board 11 except that insulating films 93 and 94 are provided in place of the insulating films 22 and 23 disposed on the wiring board 11, and furthermore, vias 96 and 97 are provided and the vias 33 and 34 provided on the wiring board 11 are excluded from the components.

The insulating film 93 is provided on an upper surface 21A of a substrate 21 and has an opening portion 93A for exposing an end face 25A of a through electrode 25 and an opening portion 93B for exposing an end face 26A of a through electrode 26. Pads 28 and 29 and a wiring 31 are formed on an upper surface of the insulating film 93. For the insulating film 93, it is possible to use an oxide film formed by a CVD process (for example, an $SiO_2$ film) or a resin layer (for example, a resin layer constituted by an epoxy resin or a polyimide resin), for instance. A thickness of the insulating film 93 can be set to be 1 μm, for example. The opening portions 93A and 93B can be formed by anisotropic etching using a mask (for example, dry etching) or a laser processing, for example.

The insulating film 94 is provided on a lower surface 21B of the substrate 21. A lower surface 94A of the insulating film 94 is on almost the level with end faces 25B and 26B of the through electrodes 25 and 26. For the insulating film 93, it is possible to use a thermal oxide film or an oxide film formed by the CVD process (for example, an $SiO_2$ film), for instance. A thickness of the insulating film 94 can be set to be 1 μm, for example.

The via 96 is provided in the opening portion 93A. The via 96 is constituted integrally with the pad 28 formed thereon. A lower end of the via 96 is connected to the through electrode 25. Consequently, the pad 28 is electrically connected to the through electrode 25 through the via 96.

The via 97 is provided in the opening portion 93B. The via 97 is constituted integrally with the pad 29 formed thereon. A lower end of the via 97 is connected to the through electrode 26. Consequently, the pad 29 is electrically connected to the through electrode 26 through the via 97. For materials of the vias 96 and 97, it is possible to use Cu, for example.

An external connecting pad 36 is connected to a lower end of the through electrode 25. An external connecting pad 37 is connected to a lower end of the through electrode 26.

In the wiring board 91 according to the third embodiment having the structure described above, it is possible to obtain the same advantages as those of the wiring board 11 according to the first embodiment.

In place of a heat intercepting member 32 provided in the semiconductor device 90 according to the third embodiment, it is also possible to provide the heat intercepting member 74 described with reference to FIG. 20 in the first embodiment or the heat intercepting members 32 described with reference to FIG. 21 in the first embodiment.

FIGS. 34 to 48 are views showing a process for manufacturing the semiconductor device according to the third embodiment of the invention. In FIGS. 34 to 48, the same components as those in the semiconductor device 90 according to the third embodiment have the same reference numerals.

With reference to FIGS. 34 to 48, description will be given to a method of manufacturing the semiconductor device 90 according to the third embodiment. First of all, at a step shown in FIG. 34, there is prepared a thinned base material 55 having a plurality of substrate forming regions C in which a substrate 21 is to be formed (a base material preparing step).

The base material 55 has a cut region D for surrounding the substrate forming regions C. The base material 55 shown in FIG. 34 can be formed by thinning the base material 55 illustrated in FIG. 3 which has been described in the first embodiment, for example. A thickness of the thinned base material 55 can be set to be 220 μm, for example.

Figure 35:
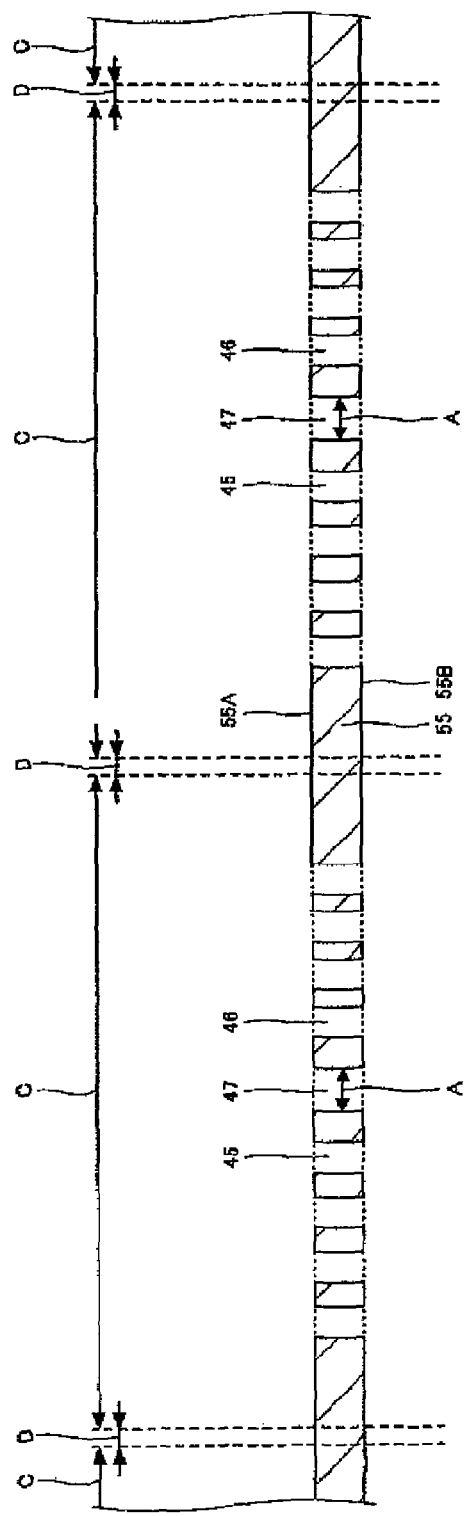
FIG. 35 is a view (No. 2) showing step of manufacturing the semiconductor device according to the third embodiment of invention.

At a step shown in FIG. 35, subsequently, a through hole 45 (a first through hole) corresponding to a position in which a through electrode 25 is to be formed, a through hole 46 (a second through hole) corresponding to a position in which a through electrode 26 is to be formed, and a through trench 47 are formed on the base material 55 from an upper surface 55A side of the base material 55 at the same time (a through hole and through trench forming step).

At this time, the through holes 45 and 46 and the through trench 47 are formed to penetrate the base material 55. The through holes 45 and 46 and the through trench 47 can be formed by anisotropic etching using a mask (for example, dry etching), for instance. Depths of the through holes 45 and 46 and the through trench 47 are almost equal to a thickness of the base material 55 and can be set to be 220 μm, for example. The through trench 47 is formed on the base material 55 in a portion positioned between a first mounting region for mounting an electronic component 12 thereon and a second mounting region for mounting an electronic component 13 thereon. A width A of the through trench 47 can be set to be 200 μm, for example.

Figure 36:
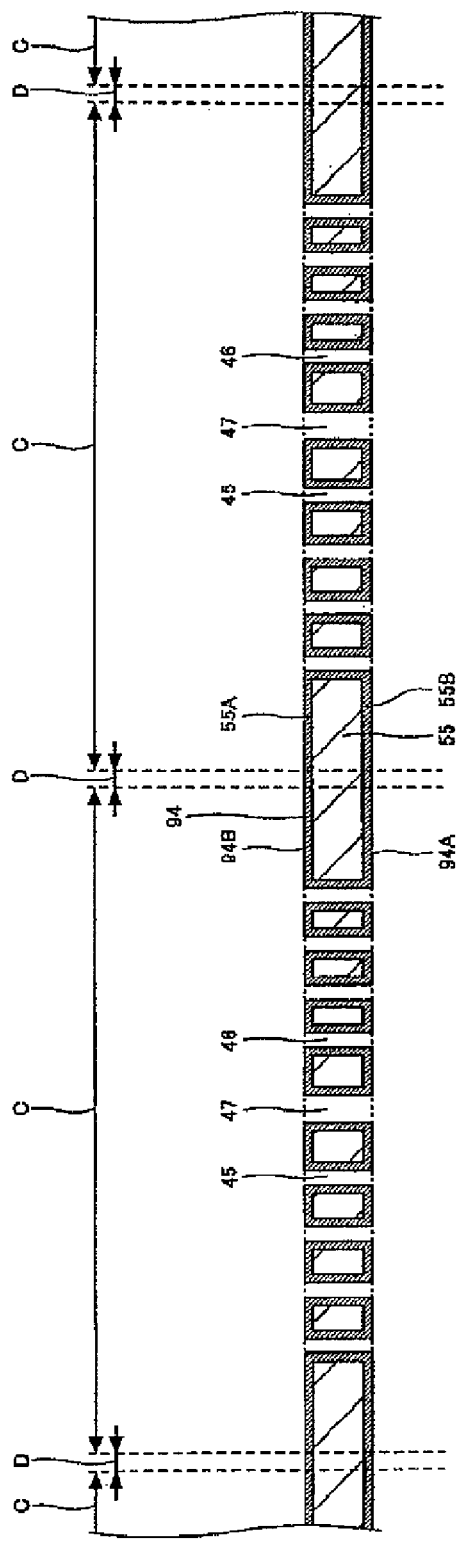
FIG. 36 is a view (No. 3) showing step of manufacturing the semiconductor device according to the third embodiment of invention.

At a step shown in FIG. 36, then, there is formed an insulating film 94 for covering surfaces of the base material 55 on which the through holes 45 and 46 and the through trench 47 are provided (including both surfaces 55A and 55B of the base material 55 and a surface of the base material 55 in a portion constituting the through holes 45 and 46 and the through trench 47). For the insulating film 94, it is possible to use a thermal oxide film or an oxide film formed by a CVD process (for example, a $SiO_2$ film), for instance. A thickness of the insulating film 94 can be set to be 1 μm, for example.

Figure 37:
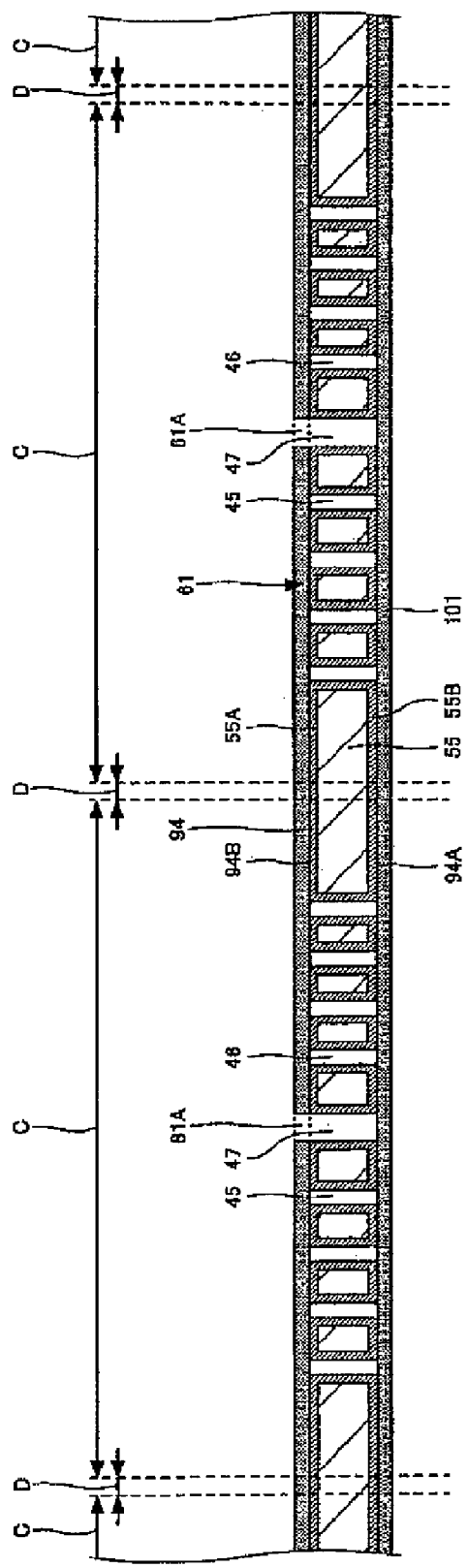
FIG. 37 is a view (No. 4) showing step of manufacturing the semiconductor device according to the third embodiment of invention.

At a step shown in FIG. 37, thereafter, the mask 61 illustrated in FIG. 6 according to the first embodiment is formed on an upper surface 94B of the insulating film 94 and a film 101 for closing the through holes 45 and 46 and the through trench 47 is stuck to a lower surface 94A of the insulating film 94. For the film 101, it is possible to use a dry film resist, for example. In the case in which the dry film resist is used as the film 101, a thickness of the film 101 can be set to be 50 μm, for example.

At a step shown in FIG. 38, subsequently, the through trench 47 is filled with a resin (a base metal of a heat intercepting member 32) to form the heat intercepting member 32 by a squeegee printing method, for example (a heat intercepting member forming step).

At this time, an opening portion 61A of the mask 61 is also filled with a resin. For the resin, it is possible to use a resin capable of intercepting a heat (for example, a thermal conductivity of 0.1 to 1.0 W/m·K), for instance. More specifically, for the resin, it is possible to use a polyimide resin, an epoxy resin or a silicone resin, for example. The resin may be caused to contain a filler (for example, silica). In the case in which the resin is caused to contain the filler (for example, the silica), it is possible to reduce a difference in a coefficient of thermal expansion between the substrate 21 and the heat intercepting member 32. For example, in the case in which a silicon substrate (a coefficient of thermal expansion of 3 ppm/K) is used as the substrate 21, a content of the filler (the silica) contained in the resin can be set to be 50%.

Figure 38:
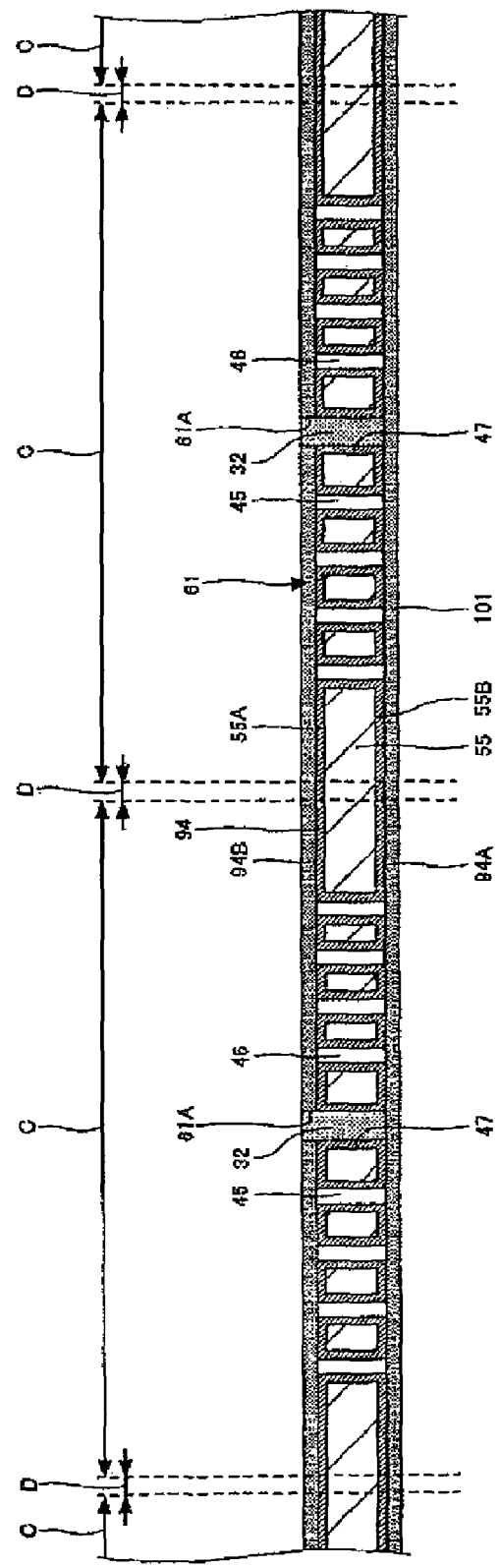
FIG. 38 is a view (No. 5) showing step of manufacturing the semiconductor device according to the third embodiment of invention.
Figure 39:
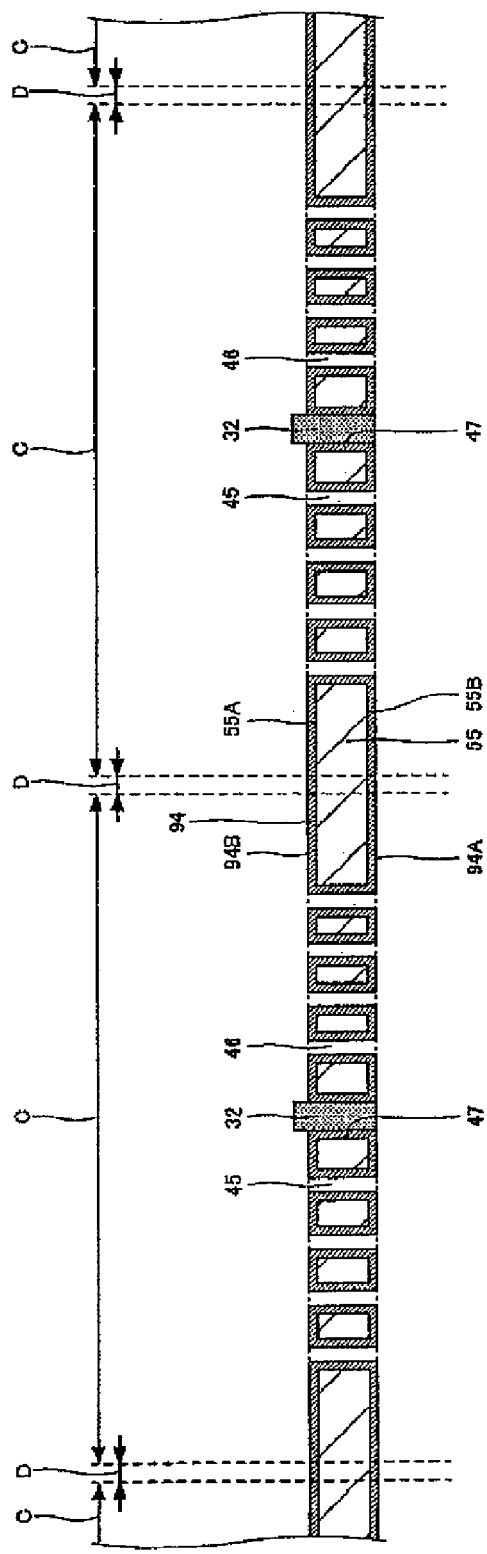
FIG. 39 is a view (No. 6) showing step of manufacturing the semiconductor device according to the third embodiment of invention.

At a step shown in FIG. 39, next, the mask 61 and the film 101 illustrated in FIG. 38 are removed. In the case in which a dry film resist is used as the mask 61 and the film 101, the mask 61 and the film 101 are removed by an amine based releasing solution at the same time, for example.

At a step shown in FIG. 40, subsequently, the same processing as the step illustrated in FIG. 9 which has been described in the first embodiment is carried out to form a conductive member 65 to be a base metal for the through electrodes 25 and 26 in the through holes 45 and 46. At this time, the conductive member 65 is protruded from the upper surface 94B of the insulating film 94 in some cases. In the embodiment, the following, description will be given by taking, as an example, the case in which the conductive member 65 is protruded from the upper surface 94B of the insulating film 94.

Figure 41:
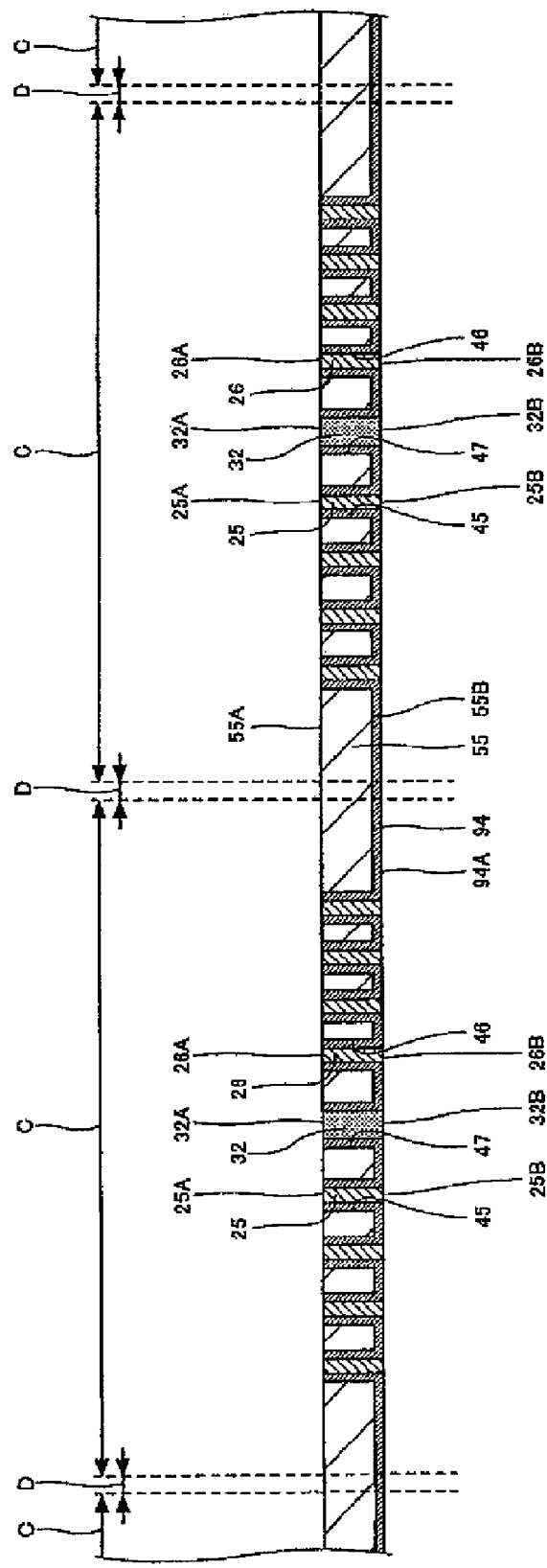
FIG. 41 is a view (No. 8) showing step of manufacturing the semiconductor device according to the third embodiment of invention.

At a step shown in FIG. 41, then, there are removed the conducive member 65 and the heat intercepting member 32 in portions protruded from the upper surface 94B of the insulating film 94 (a conductive member and/or heat intercepting member removing step). More specifically, the unnecessary conductive member 65 and/or heat intercepting member 32 which are/is protruded from the upper surface 94B of the insulating film 94 are/is removed by grinding or polishing.

Figure 40:
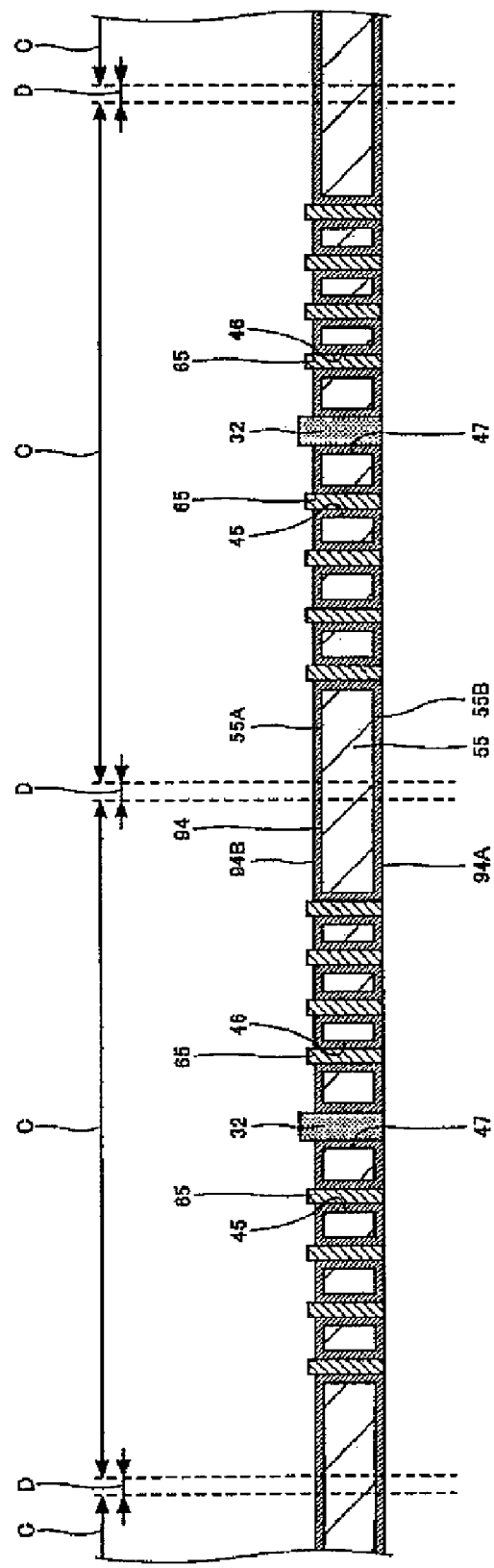
FIG. 40 is a view (No. 7) showing step of manufacturing the semiconductor device according to the third embodiment of invention.

Consequently, there are formed the heat intercepting member 32 penetrating the base material 55 and the through electrodes 25 and 26 (the steps shown in FIGS. 40 and 41 correspond to "a through electrode forming step"). Moreover, the conductive member 65 and the heat intercepting member 32 in the portions protruded from the upper surface 94B of the insulating film 94 are removed so that an end face 32A of the heat intercepting member 32 and end faces 25A and 26A of the through electrodes 25 and 26 are on almost the level with the upper surface 55A of the base material 55. An end face 32B of the heat intercepting member 32 and end faces 25B and 26B of the through electrodes 25 and 26 are on almost the level with the lower surface 94A of the insulating film 94.

Thus, the heat intercepting member 32 penetrating the base material 55 and serving to intercept a heat generated from the electronic component 13 in an operation is formed on the base material 55 in the portion positioned between the first mounting region and the second mounting region. Consequently, the heat generated from the electronic component 13 in the operation can be prevented from being transferred to the electronic component 12 through the substrate 21 in a corresponding portion to the first mounting region.

Figure 42:
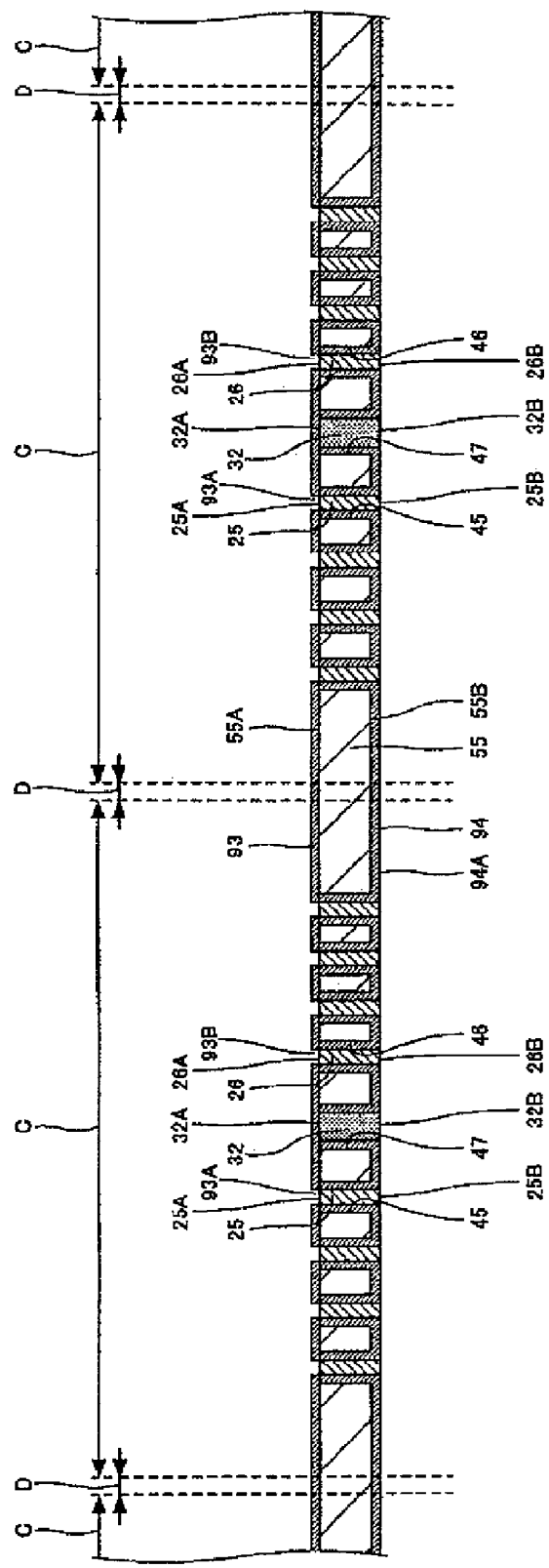
FIG. 42 is a view (No. 9) showing step of manufacturing the semiconductor device according to the third embodiment of invention.

At a step shown in FIG. 42, then, an insulating film 93 having opening portions 93A and 93B is formed on the upper surface 55A of the base material 55 illustrated in FIG. 41. For the insulating film 93, it is possible to use an oxide film formed by a CVD process (for example, an $SiO_2$ film) or an insulating resin layer, for instance. A thickness of the insulating film 93 can be set to be 1 μm, for example. The opening portions 93A and 93B can be formed by anisotropic etching using a mask (for example, dry etching) or a laser processing, for instance.

Figure 43:
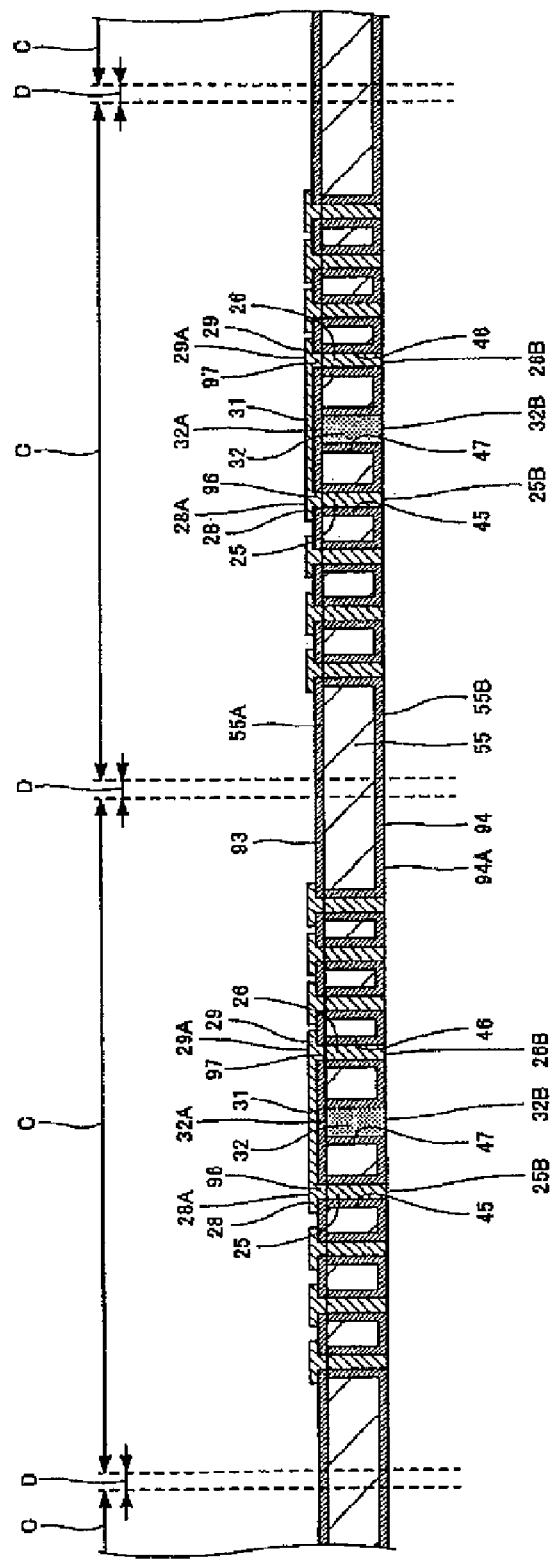
FIG. 43 is a view (No. 10) showing step of manufacturing the semiconductor device according to the third embodiment of invention.

At a step shown in FIG. 43, thereafter, vias 96 and 97, pads 28 and 29 and a wiring 31 are formed on an upper surface side of the structure illustrated in FIG. 42 at the same time (a pad forming step). More specifically, for example, a seed layer is formed by a sputtering method and the vias 96 and 97, the pads 28 and 29 and the wiring 31 are then formed at the same time by a semiadditive process. For materials of the vias 96 and 97, the pads 28 and 29 and the wiring 31, it is possible to use Cu, for example.

Figure 44:
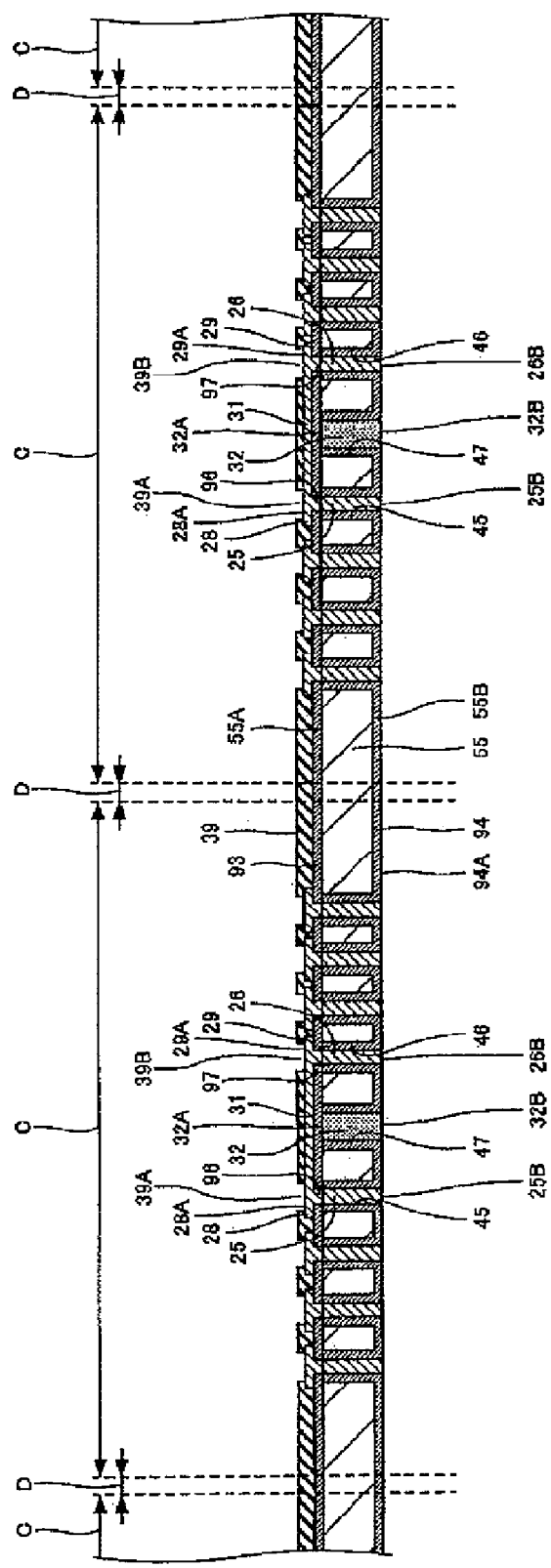
FIG. 44 is a view (No. 11) showing step of manufacturing the semiconductor device according to the third embodiment of invention.

At a step shown in FIG. 44, next, a solder resist layer 39 is formed on an upper surface of the insulating film 93. The solder resist layer 39 has an opening portion 39A for exposing a connecting surface 28A and an opening portion 39B for exposing a connecting surface 29A.

Figure 45:
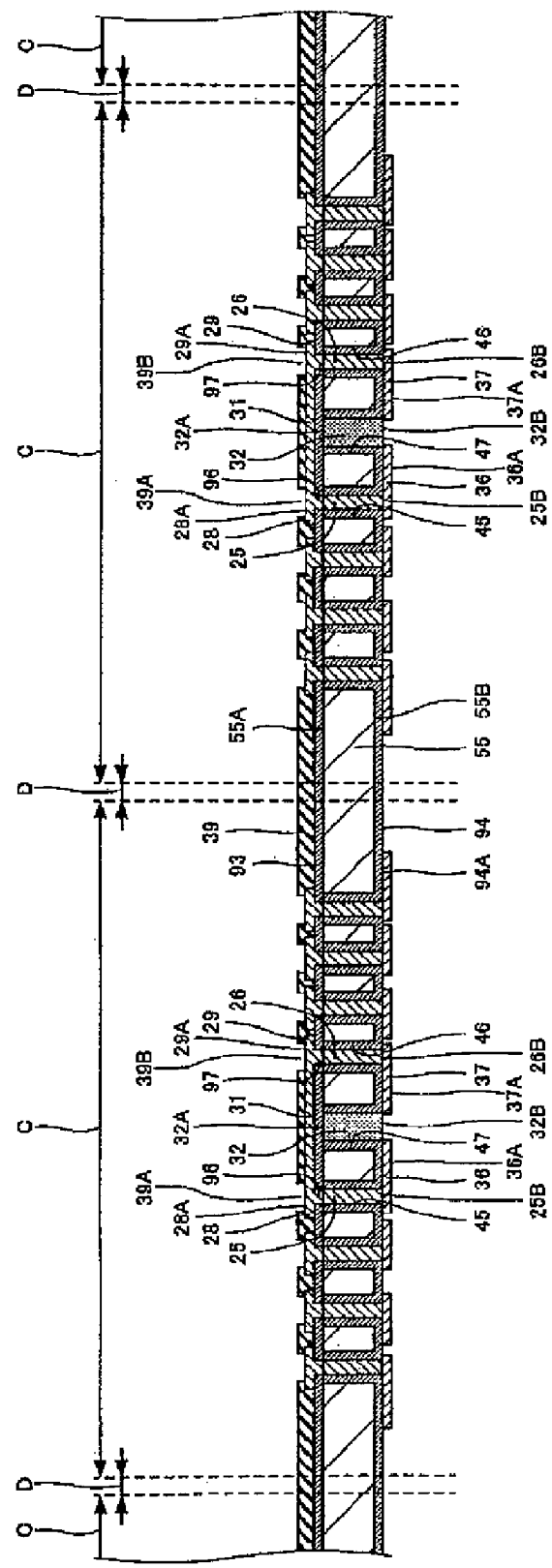
FIG. 45 is a view (No. 12) showing step of manufacturing the semiconductor device according to the third embodiment of invention.

At a step shown in FIG. 45, subsequently, external connecting pads 36 and 37 are formed on the lower surface 94A of the insulating layer 94 (an external connecting pad forming step). More specifically, for example, a seed layer is formed by a sputtering method and the external connecting pads 36 and 37 are then formed by a semiadditive process. For materials of the external connecting pads 36 and 37, it is possible to use Cu, for example.

Figure 46:
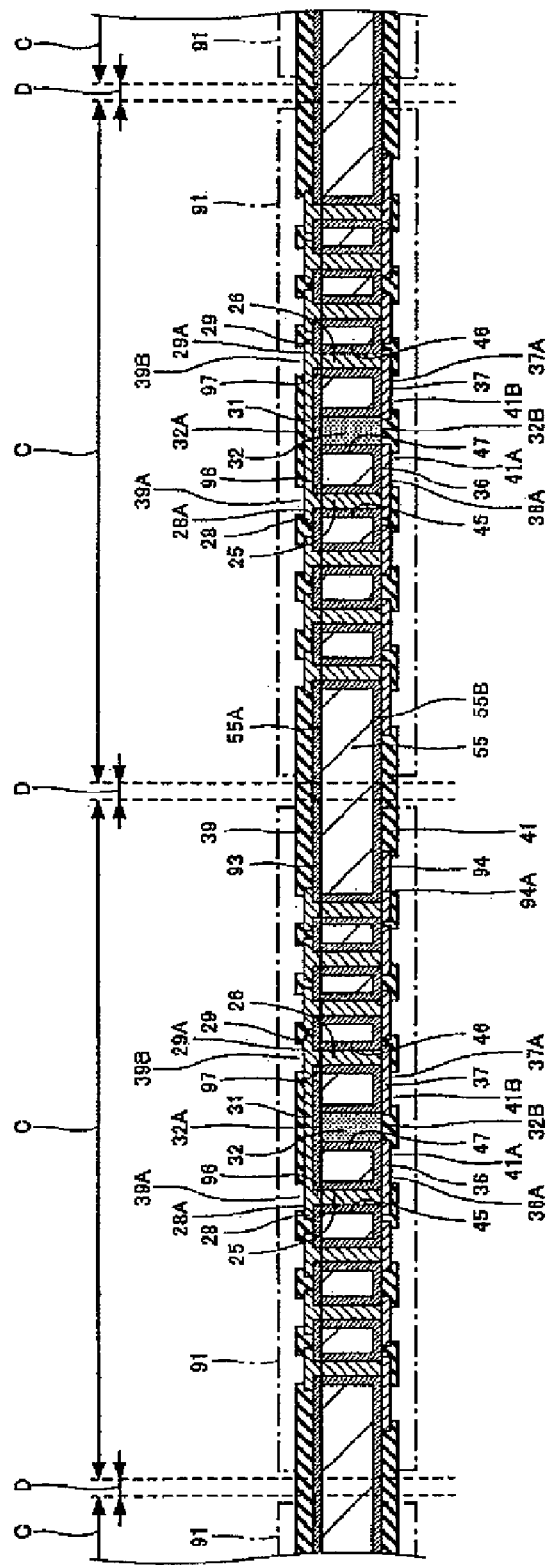
FIG. 46 is a view (No. 13) showing step of manufacturing the semiconductor device according to the third embodiment of invention.

At a step shown in FIG. 46, thereafter, a solder resist layer 41 is formed on the lower surface 94A of the insulating film 94. The solder resist layer 41 has an opening portion 41A for exposing a connecting surface 36A and an opening portion 41B for exposing a connecting surface 37A. Consequently, the wiring board 91 is formed in the substrate forming regions C.

Figure 47:
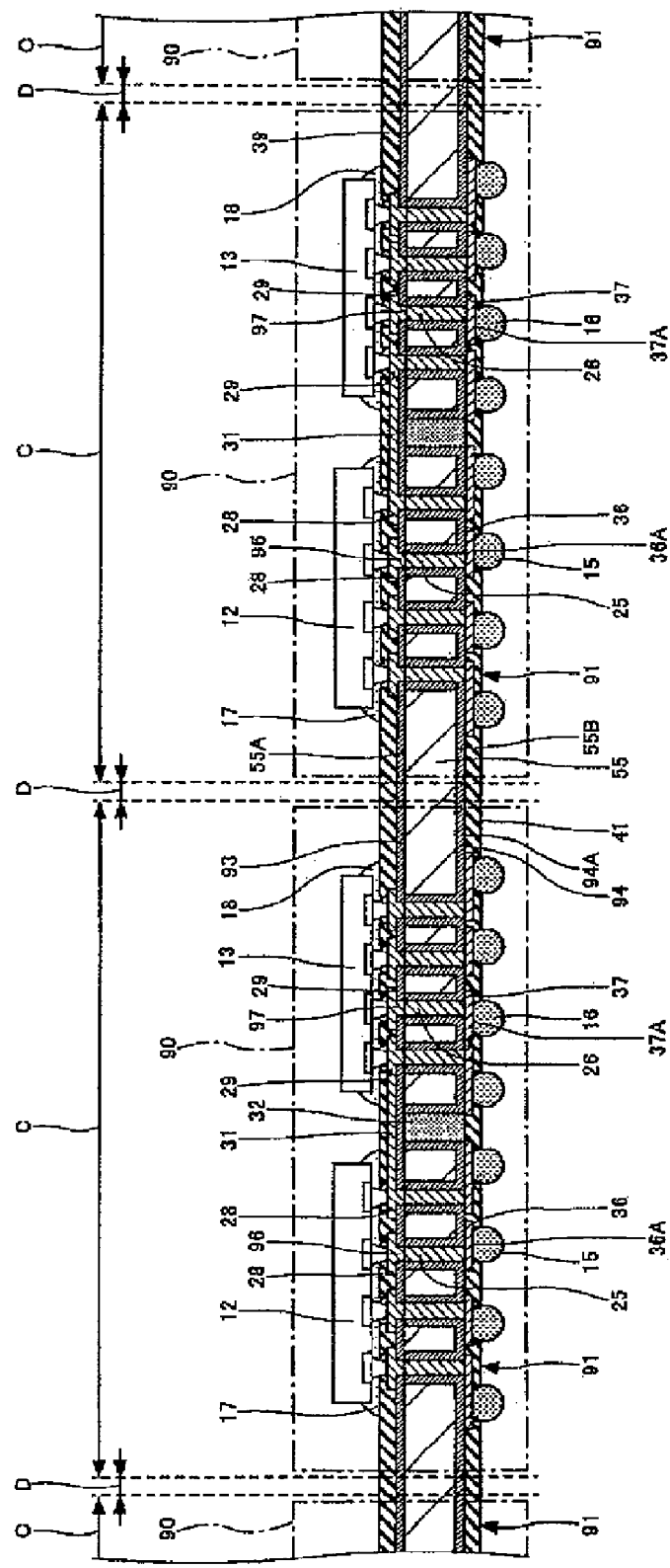
FIG. 47 is a view (No. 14) showing step of manufacturing the semiconductor device according to the third embodiment of invention.

At a step shown in FIG. 47, next, the electronic components 12 and 13 are mounted on the pads 28 and 29 of the wiring board 91 by a flip chip bonding. Then, a clearance between the electronic component 12 and the wiring board 91 is filled with an underfill resin 17, and a clearance between the electronic component 13 and the wiring board 91 is filled with an underfill resin 18. Thereafter, an external connecting terminal 15 is provided on the external connecting pad 36 and an external connecting terminal 16 is provided on the external connecting pad 37. Consequently, the semiconductor device 90 is manufactured in the substrate forming regions C.

Figure 48:
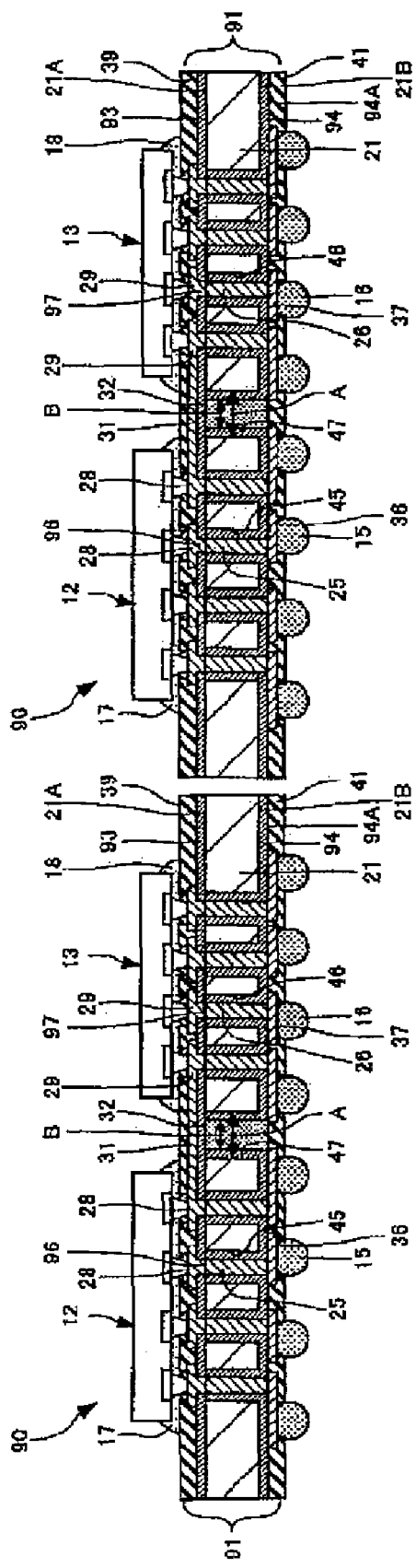
FIG. 48 is a view (No. 15) showing step of manufacturing the semiconductor device according to the third embodiment of invention.

At a step shown in FIG. 48, subsequently, the structure illustrated in FIG. 47 is cut along the cut region D so that the semiconductor devices 90 are obtained as individual pieces (a cutting step).

According to the method of manufacturing the wiring board of the exemplary embodiment of the invention, the through holes 45, 46 which correspond to the forming positions for the through electrodes 25, 26 and penetrate the base material 55 and the through trench 47 positioned between the first mounting region for mounting the electronic component 12 thereon and the second mounting region for mounting the electronic component 13 thereon and penetrating the base material 55 are formed on the base, material at the same time. Subsequently, the heat intercepting member 32 for intercepting a heat is formed in the through trench 47. Then, the through holes 45, 46 are filled with the conductive member to form the through electrodes 25, 26. Thereafter, the pads 28, 29 are formed. Consequently, the heat intercepting member 32 penetrating the base material 55 and serving to intercept the heat generated from the electronic component 13 in the operation is formed on the base material 55 in the portion positioned between the first mounting region for mounting the electronic component 12 thereon and the second mounting region for mounting the electronic component 13 thereon. Therefore, the heat generated from the electronic component 13 in the operation can be prevented from being transferred to the electronic component 12 through the substrate 21 in the corresponding portion to the first mounting region.

(Fourth Embodiment)

Figure 49:
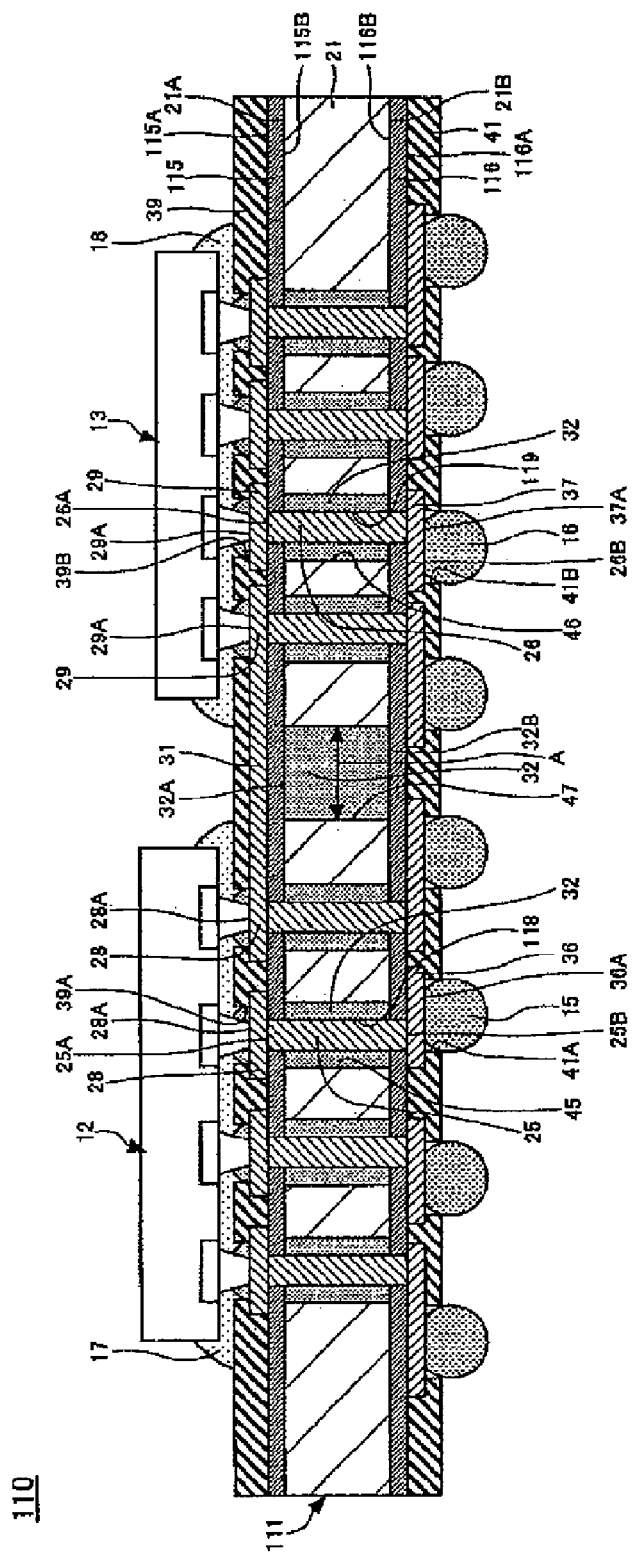
FIG. 49 is a sectional view showing a semiconductor device according to a fourth embodiment of invention.

FIG. 49 is a sectional view showing a semiconductor device according to a fourth embodiment of the invention. In FIG. 49, the same components as those in the semiconductor device 90 according to the third embodiment have the same reference numerals.

With reference to FIG. 49, a semiconductor device 110 according to the fourth embodiment has the same structure as that of the semiconductor device 90 except that a wiring board 111 is provided in place of the wiring board 91 disposed in the semiconductor device 90 according to the third embodiment.

The wiring board 111 has the same structure as that of the wiring board 91 except that insulating films 115 and 116 are provided in place of the insulating films 93 and 94 disposed in the wiring board 91, the vias 96 and 97 provided on the wiring board 91 are excluded from the components, through holes 118 and 119 are provided, and furthermore, a heat intercepting member 32 is provided between side surfaces of through holes 45 and 46 and through electrodes 25 and 26.

The insulating film 115 is provided on an upper surface 21A of a substrate 21. The insulating film 115 covers side surfaces of upper ends of the through electrodes 25 and 26. An upper surface 115A of the insulating film 115 is set on almost the level with end faces 25A and 26A of the through electrodes 25 and 26. Pads 28 and 29, a wiring 31 and a solder resist layer 39 are provided on the upper surface 115A of the insulating film 115. For the insulating film 115, it is possible to use an oxide film formed by a CVD process (for example, an $SiO_2$ film) or a resin layer (for example, a resin layer constituted by an epoxy resin or a polyimide resin), for instance. A thickness of the insulating film 115 can be set to be 5 μm to 10 μm, for example.

The insulating film 116 is provided on a lower surface 21B of the substrate 21. The insulating film 116 covers side surfaces of lower ends of the through electrodes 25 and 26. A lower surface 116A of the insulating film 116 is set on almost the level with end faces 25B and 26B of the through electrodes 25 and 26. External connecting pads 36 and 37 and a solder resist layer 41 are provided on the lower surface 116A of the insulating film 116. For the insulating film 116, it is possible to use an oxide film formed by a CVD process (for example, an $SiO_2$ film) or a resin layer (for example, a resin layer constituted by an epoxy resin or a polyimide resin), for instance. A thickness of the insulating film 116 can be set to be 5 μm to 10 μm, for example.

The heat intercepting member 32 in portions provided between side surfaces of the through holes 45 and 46 and the through electrodes 25 and 26 serves to electrically insulate the substrate 21 from the through electrodes 25 and 26. The heat intercepting member 32 in the portions provided between the side surfaces of the through holes 45 and 46 and the through electrodes 25 and 26 is constituted by the same material having an insulating property as that of the heat intercepting member 32 provided in a through trench 47. A thickness of the heat intercepting member 32 in the portions provided between the side surfaces of the through holes 45 and 46 and the through electrodes 25 and 26 can be set to be 20 μm, for example.

The through hole 118 is formed to penetrate the insulating layers 115 and 116 and the heat intercepting member 32 in a portion provided in a position in which the through electrode 25 is to be formed. The through hole 118 serves to provide the through electrode 25 therein. In the case in which a diameter of the through hole 45 is 100 μm, that of the through hole 118 can be set to be 60 μm, for example.

The through hole 119 is formed to penetrate the insulating layers 115 and 116 and the heat intercepting member 32 in a portion provided in a position in which the through electrode 26 is to be formed. The through hole 119 serves to provide the through electrode 26 therein. In the case in which a diameter of the through hole 46 is 100 μm, that of the through hole 119 can be set to be 60 μm, for example.

A side surface of the heat intercepting member 32 in a portion provided in the through trench 47 is disposed in contact with the substrate 21. The heat intercepting member 32 in the portion disposed in the through trench 47 has an end face 32A provided in contact with a lower surface 115B of the insulating film 115 and the other end face 32B provided in contact with an upper surface 116B of the insulating film 116.

In the wiring board 111 according to the fourth embodiment which has the structure, it is possible to obtain the same advantages as those of the wiring board 11 according to the first embodiment.

In place of the heat intercepting member 32 provided in the wiring board 110 according to the embodiment, it is also possible to provide the heat intercepting member 74 described with reference to FIG. 20 in the first embodiment or the heat intercepting members 32 described with reference to FIG. 21 in the first embodiment.

FIGS. 50 to 57 are views showing a process for manufacturing the semiconductor device according to the fourth embodiment of the invention. In FIGS. 50 to 57, the same components as those in the semiconductor device 110 according to the fourth embodiment have the same reference numerals.

With reference to FIGS. 50 to 57, description will be given to a method of manufacturing the semiconductor device 110 according to the fourth embodiment. First of all, there are carried out the same processings as the steps shown in FIGS. 34 and 35 (the base material preparing step and the through hole and through trench forming step) which have been described in the third embodiment. Thus, there is formed the base material 55 shown in FIG. 35 (more specifically, the base material 55 on which the through holes 45 and 46 and the through trench 47 are provided).

Figure 50:
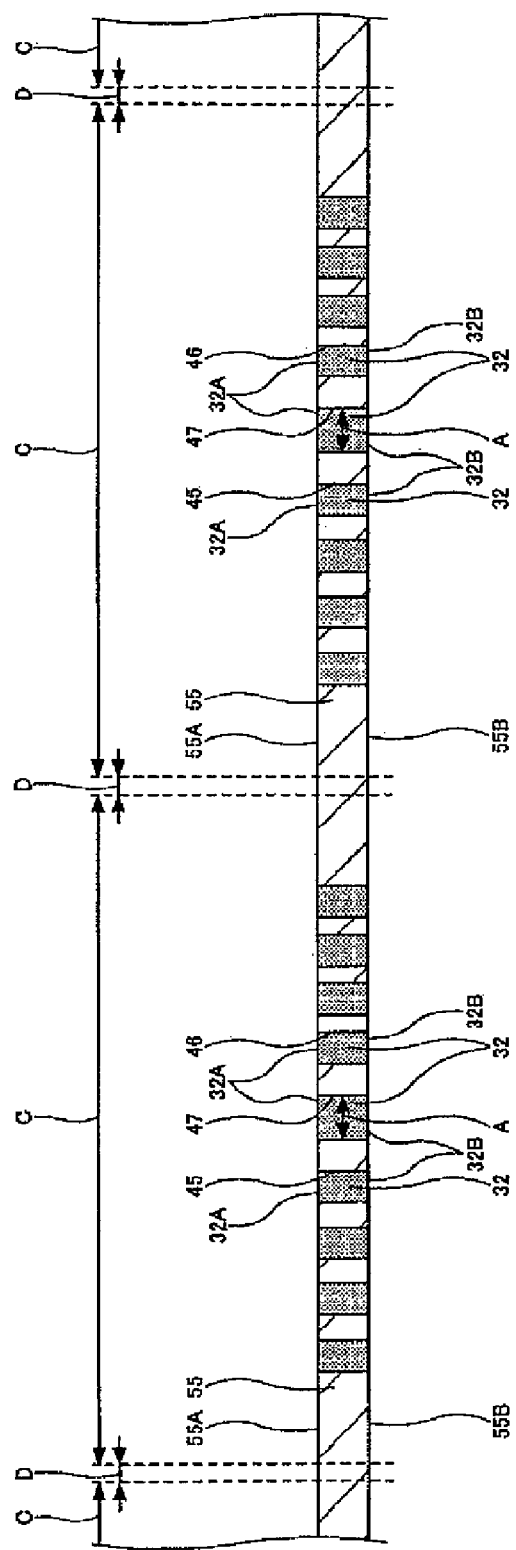
FIG. 50 is a view (No. 1) showing step of manufacturing the semiconductor device according to fourth embodiment of invention.

At a step shown in FIG. 50, subsequently, the through holes 45 and 46 and the through trench 47 are filled with an insulating resin. Consequently, a heat intercepting member 32 is formed in the through holes 45 and 46 and the through trench 47 (a heat intercepting member filling step).

At this time, the heat intercepting member 32 is formed in such a manner that an end face 32A of the heat intercepting member 32 is on almost the level with an upper surface 55A of the base material 55 and an end face 32B of the heat intercepting member 32 is on almost the level with a lower surface 55B of the base material 55. At the heat intercepting member filling step, in the case in which the insulating resin is protruded from the upper surface 55A and/or the lower surface 55B in the base material 55, the insulating resin in the protruded portion may be removed by polishing, for example.

For the insulating resin, it is possible to use an epoxy resin, a polyimide resin or a silicone resin, for example. The insulating resin may be caused to contain a filler (for example, silica).

Figure 51:
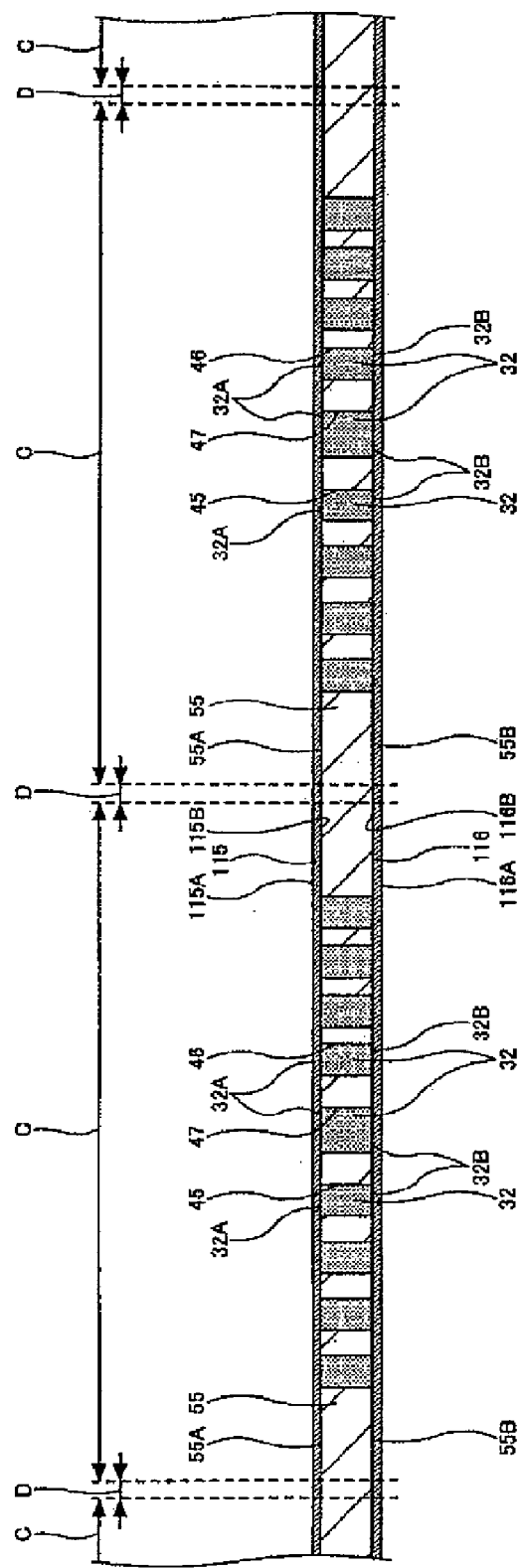
FIG. 51 is a view (No. 2) showing step of manufacturing the semiconductor device according to fourth embodiment of invention.

At a step shown in FIG. 51, then, there are formed an insulating film 115 for covering the upper surface 55A of the base material 55 and the end face 32A of the heat intercepting member 32 and an insulating film 116 for covering the lower surface 55B of the base material 55 and the end face 32B of the heat intercepting member 32. For the insulating films 115 and 116, it is possible to use an oxide film formed by a CVD process (for example, a $SiO_2$ film) or an insulating resin layer (an epoxy resin, a polyimide resin or a silicone resin), for instance. Thicknesses of the insulating films 115 and 116 can be set to be 5 μm to 10 μm, for example.

Figure 52:
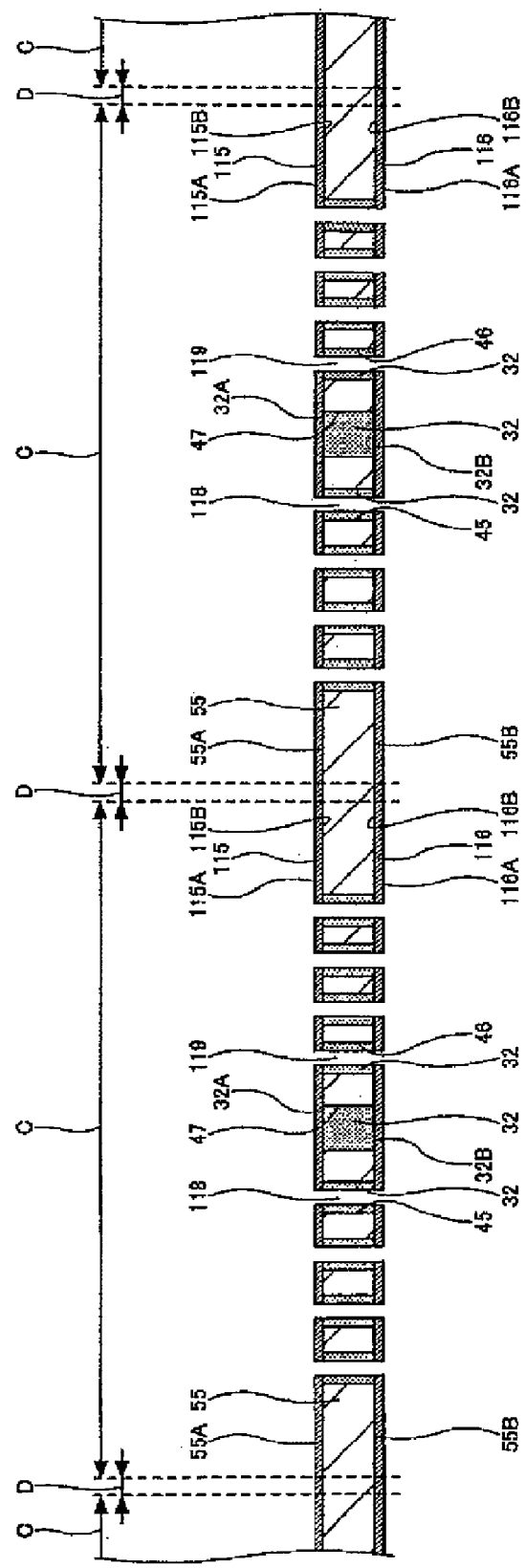
FIG. 52 is a view (No. 3) showing step of manufacturing the semiconductor device according to the fourth embodiment of invention.

At a step shown in FIG. 52, thereafter, a through hole 118 (a third through hole) and a through hole 119 (a fourth through hole) are formed at the same time (a through hole forming step). The through hole 118 penetrates the insulating films 115 and 116 in a corresponding portion to a position in which the through hole 45 (the first through hole) is to be formed, and the heat intercepting member 32 formed in the through hole 45. The through hole 119 penetrates the insulating films 115 and 116 in a corresponding portion to a position in which the through hole 46 (the second through hole) is to be formed, and the heat intercepting member 32 formed in the through hole 46. More specifically, for example, the insulating films 115 and 116 and the heat intercepting member 32 are subjected to a laser processing to form the through holes 118 and 119.

At this time, the through holes 118 and 119 are formed in such a manner that the heat intercepting member 32 having an insulating property is provided between a side surface of the through hole 45 and the through hole 118 and between a side surface of the through hole 46 and the through hole 119.

Thus, the through holes 118 and 119 are formed in such a manner that the heat intercepting member 32 having an insulating property is provided between the side surface of the through hole 45 and the through hole 118 and between the side surface of the through hole 46 and the through hole 119. Consequently, it is not necessary to separately form an insulating film for insulating through electrodes 25 and 26 from a substrate 21. Therefore, it is possible to reduce a manufacturing cost of a wiring board 111.

In the case in which diameters of the through holes 45 and 46 are 100 μm, those of the through holes 118 and 119 can be set to be 60 μm, for example.

Figure 53:
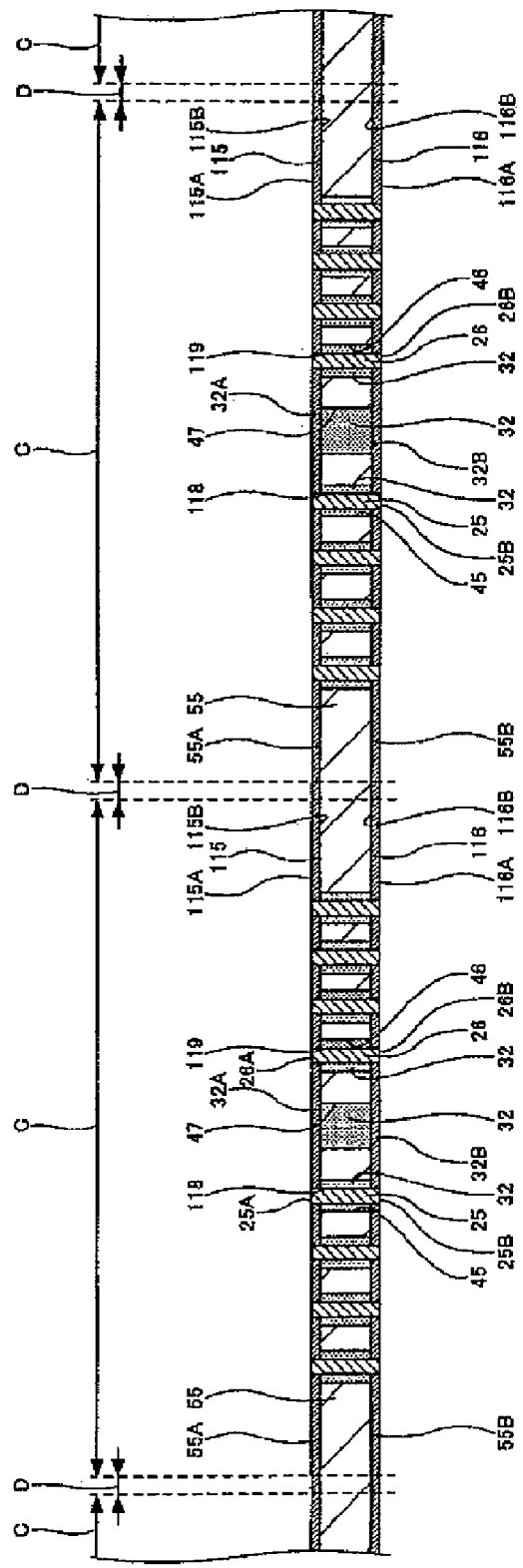
FIG. 53 is a view (No. 4) showing step of manufacturing the semiconductor device according to the fourth embodiment of invention.

At a step shown in FIG. 53, subsequently, the through holes 118 and 119 are filled with a conductive member, and the through electrode 25 is formed in the through hole 118 and the through electrode 26 is formed in the through hole 119 (a through electrode forming step).

More specifically, the through electrodes 25 and 26 can be formed in contact with a lower surface 116A of the insulating film 116 by an electrolytic plating method of providing a metal foil and setting the metal foil as a feeding layer, for example. In this case, it is possible to use Cu for the conductive member, for example. Moreover, it is also possible to form the through electrodes 25 and 26 by filling the through holes 118 and 119 with a conductive member (in this case, a conductive paste) through a printing method. For the conductive paste, it is possible to use an Ni paste, an Ag paste and a Cu paste, for example.

At the through electrode forming step, the through electrodes 25 and 26 are formed in such a manner that end faces 25A and 26A of the through electrodes 25 and 26 are on almost the level with an upper surface 115A of the insulating film 115 and end faces 25B and 26B of the through electrodes 25 and 26 are on almost the level with the lower surface 116A of the insulating film 116. In the case in which the conductive member is protruded from the upper surface 115A of the insulating film 115 and/or the lower surface 116A of the insulating film 116, the through holes 118 and 119 are filled with the conductive member and the conductive member in the protruded portion is then removed by polishing, for example. Thus, the through electrodes 25 and 26 are formed.

Figure 54:
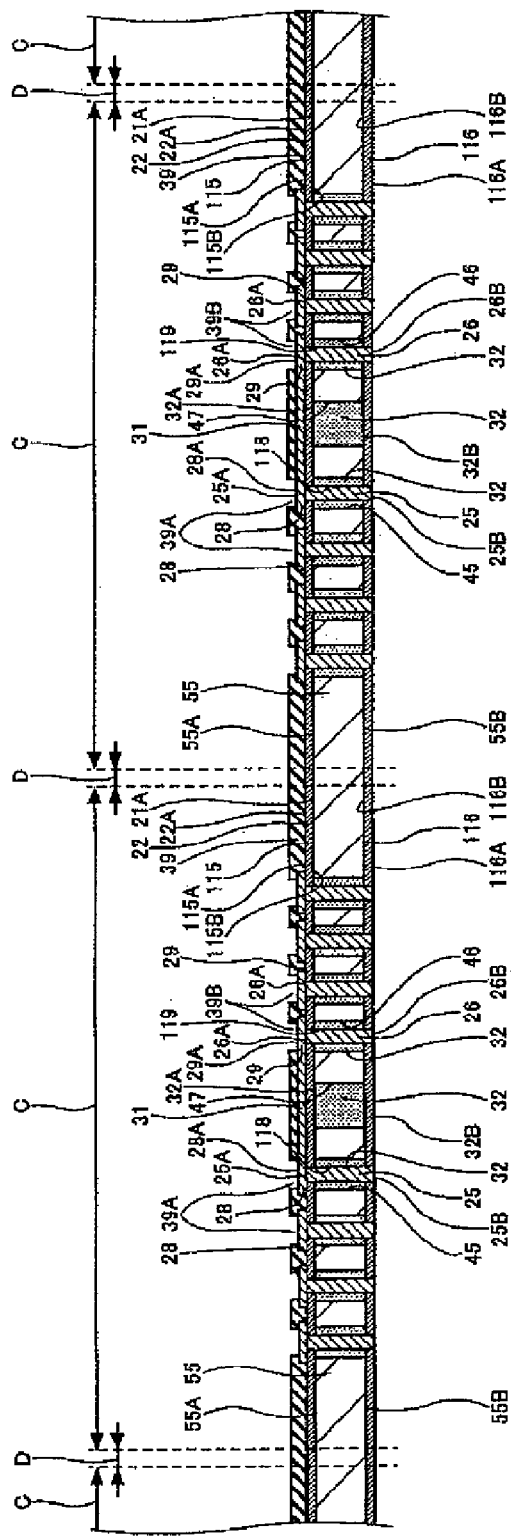
FIG. 54 is a view (No. 5) showing step of manufacturing the semiconductor device according to the fourth embodiment of invention.

At a step shown in FIG. 54, thereafter, there is carried out the same processing as the step illustrated in FIG. 11 which has been described in the first embodiment. Consequently, pads 28 and 29 and a wiring 31 are formed on the upper surface side of the structure shown in FIG. 53 (a pad forming step). Subsequently, there is carried out the same processing as the step shown in FIG. 12 which has been described in the first embodiment. Consequently, a solder resist layer 39 is formed on the upper surface 115A of the insulating film 115.

Figure 55:
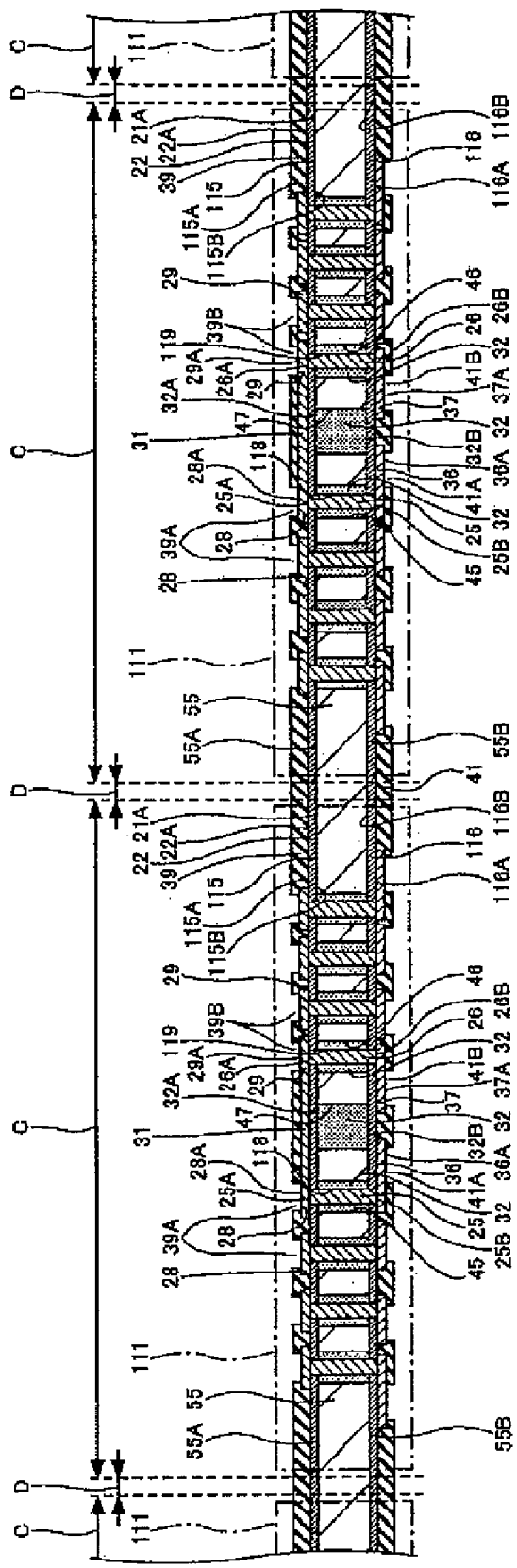
FIG. 55 is a view (No. 6) showing step of manufacturing the semiconductor device according to the fourth embodiment of invention.

At a step shown in FIG. 55, next, there is carried out the same processing as the step illustrated in FIG. 11 which has been described in the first embodiment. Consequently, external connecting pads 36 and 37 are formed on the lower surface side of the structure shown in FIG. 54 (an external connecting pad forming step). Then, there is carried out the same processing as the step shown in FIG. 12 which has been described in the first embodiment. Consequently, a solder resist layer 41 is formed on the lower surface 116A of the insulating film 116. Thus, the wiring board 111 is formed in a plurality of substrate forming regions C.

Figure 56:
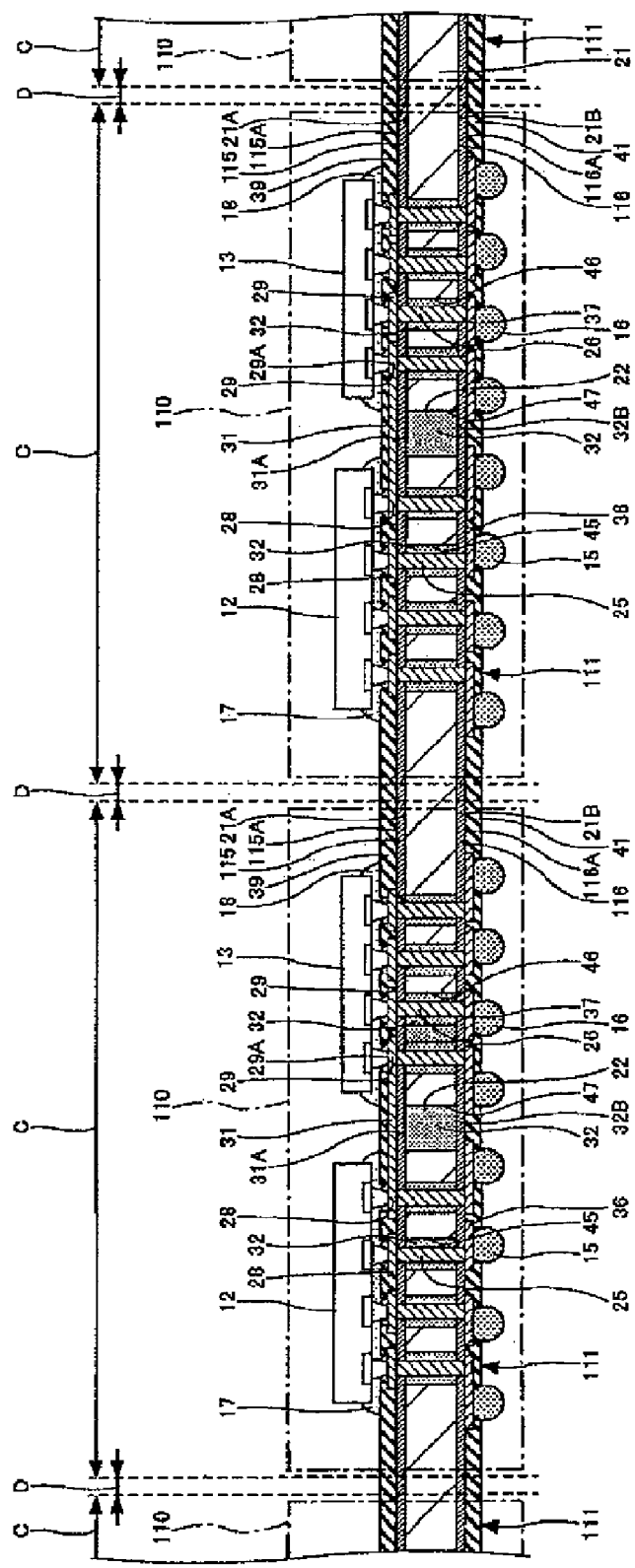
FIG. 56 is a view (No. 7) showing step of manufacturing the semiconductor device according to the fourth embodiment of invention.

At a step shown in FIG. 56, thereafter, electronic components 12 and 13 are mounted on the pads 28 and 29 of the wiring board 111 by a flip chip bonding. Subsequently, a clearance between the electronic component 12 and the wiring board 111 is filled with an underfill resin 17 and a clearance between the electronic component 13 and the wiring board 111 is filled with an underfill resin 18. Then, an external connecting terminal 15 is provided on the external connecting pad 36 and an external connecting terminal 16 is provided on the external connecting pad 37. Consequently, a semiconductor device 110 is manufactured in the substrate forming regions C.

Figure 57:
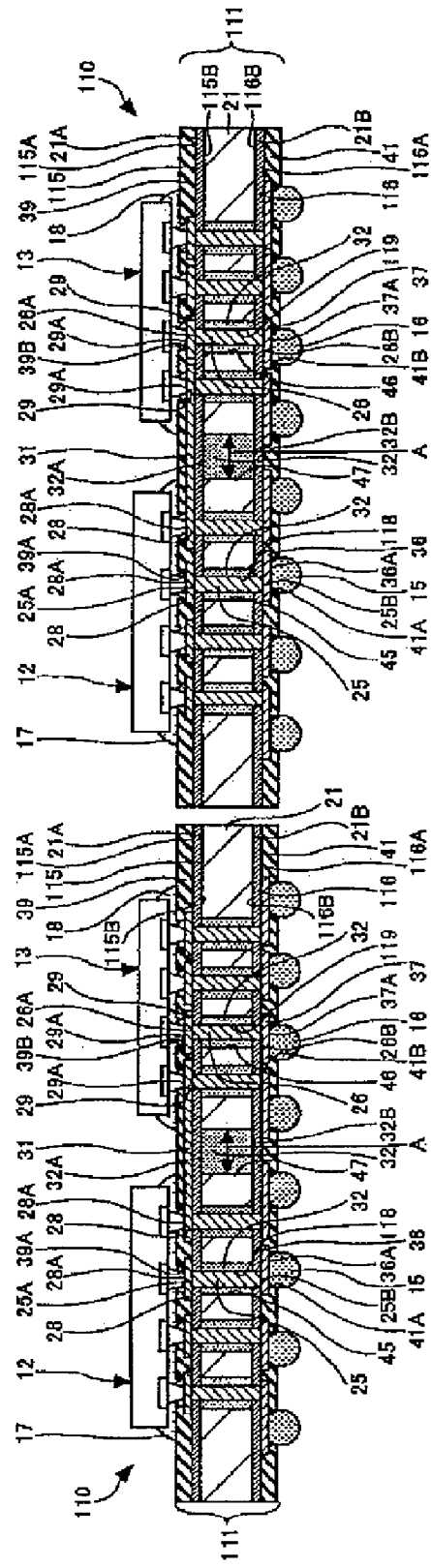
FIG. 57 is a view (No. 8) showing step of manufacturing the semiconductor device according to the fourth embodiment of invention.

At a step shown in FIG. 57, next, the structure illustrated in FIG. 56 is cut along a cut region D so that the semiconductor devices 110 are obtained as individual pieces (a cutting step).

According to the method of manufacturing the wiring board of the exemplary embodiment of the invention, the through holes 45, 46 penetrating the base material 55 and the through trench 47 positioned between the first mounting region for mounting the electronic component 12 thereon and the second mounting region for mounting the electronic component 13 thereon and penetrating the base material 55 are formed on the base material 55 at the same time. Subsequently, the through holes 45, 46 and the through trench 47 are filled with the insulating resin to form the heat intercepting member 32. Then, the through hole 118 in which the through electrode 25 is to be provided is formed on the heat intercepting member 32 disposed in the through hole 45, and the through hole 119 in which the through electrode 26 is to be provided is formed on the heat intercepting member 32 disposed in the through hole 46. Thereafter, the through holes 118, 119 are filled with the conductive member to form the through electrodes 25, 26. Next, the pads 28, 29 are formed. Consequently, the heat intercepting member 32 penetrating the base material 55 and serving to intercept the heat generated from the electronic component 13 in the operation is formed on the base material 55 in the portion positioned between the first mounting region for mounting the electronic component 12 thereon and the second mounting region for mounting the electronic component 13 thereon. Therefore, the heat generated from the electronic component 13 in the operation can be prevented from being transferred to the electronic component 12 through the substrate in the corresponding portion to the first mounting region.

In the through hole forming step in which the through holes 45, 46 and the through trench 47 are filled with the insulating resin to form the heat intercepting member 32, moreover, the through holes 118, 119 are formed to interpose the heat intercepting member 32 between the through hole 45 and the through hole 118 and between the through hole 46 and the through hole 119. Consequently, it is not necessary to separately form an insulating film for insulating the through electrodes 25, 26 from the substrate 21. Therefore, it is possible to reduce a manufacturing cost of the wiring board 111.

(Fifth Embodiment)

Figure 58:
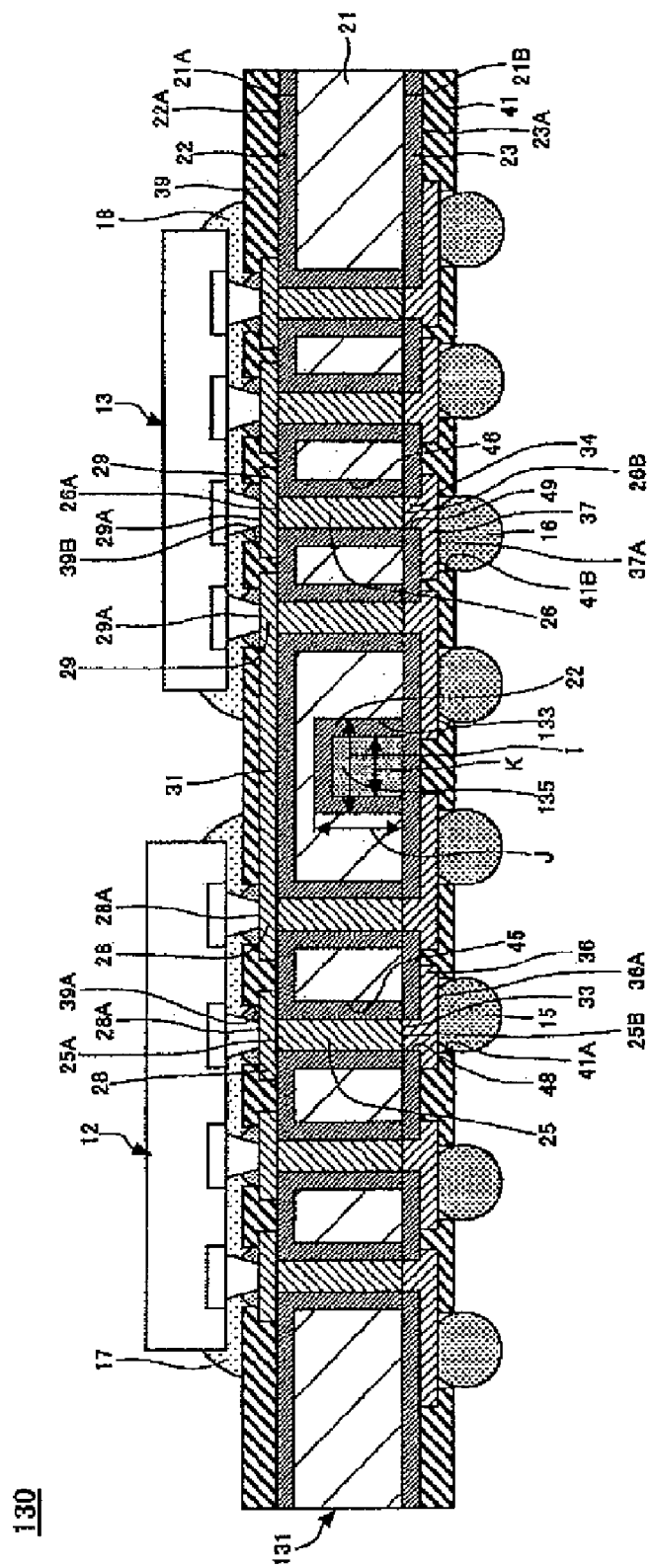
FIG. 58 is a sectional view showing a semiconductor device according to a fifth embodiment of invention.

FIG. 58 is a sectional view showing a semiconductor device according to a fifth embodiment of the invention. In FIG. 58, the same components as those of the semiconductor device 80 according to the second embodiment have the same reference numerals.

With reference to FIG. 58, a semiconductor device 130 according to the fifth embodiment has the same structure as that of the semiconductor device 10 except that a wiring board 131 is provided in place of the wiring board 11 disposed in the semiconductor device 10 according to the first embodiment.

The wiring board 131 has the same structure as that of the wiring board 11 except that a trench 133 and a heat intercepting member 135 are provided in place of the through trench 47 and the heat intercepting member 32 which are disposed in the wiring board 11.

The trench 133 is formed on a substrate 21 in a portion positioned between a first mounting region for mounting an electronic component 12 thereon and a second mounting region for mounting an electronic component 13 thereon from a lower surface 21B side of the substrate 21. The trench 133 does not penetrate the substrate 21. A surface of the substrate 21 in a portion constituting the trench 133 is covered with an insulating film 22. A width I of the trench 133 can be set to be 200 μm, for example. In the case in which a thickness of the substrate 21 is 200 μm, a depth J of the trench 133 can be set to be 170 μm, for example.

The heat intercepting member 135 is provided in the trench 133 on which the insulating film 22 is formed. The heat intercepting member 135 has the same structure as that of the heat intercepting member 32 except that a shape thereof is different from that of the heat intercepting member 32 described in the first embodiment. In other words, the heat intercepting member 135 is constituted by the same material as that of the heat intercepting member 32 and can produce the same advantages as those of the heat intercepting member 32. A width K of the heat intercepting member 135 can be set to be 150 μm, for example.

According to the semiconductor device of the exemplary embodiment of the invention, by providing the trench 133 which does not penetrate the substrate 21 and providing the heat intercepting member 135 in the trench 133 in the portion positioned between the mounting region on which the electronic component 12 is to be mounted and the mounting region on which the electronic component 13 having a larger amount of heat generation in an operation than that of the electronic component 12 is to be mounted, thus, it is possible to intercept a heat generated from the electronic component 13 in an operation by means of the heat intercepting member 32. Consequently, the heat generated from the electronic component 13 in the operation can be prevented from being transferred to the electronic component 12 through the substrate 21 in a corresponding portion to the first mounting region.

The heat intercepting member 135 provided in the wiring board 131 according to the fifth embodiment may be disposed to surround the second mounting region continuously or discontinuously.

FIGS. 59 to 69 are views showing a process for manufacturing the semiconductor device according to the fifth embodiment of the invention. In FIGS. 59 to 69, the same components as those of the semiconductor device 130 according to the fifth embodiment have the same reference numerals.

Figure 34:
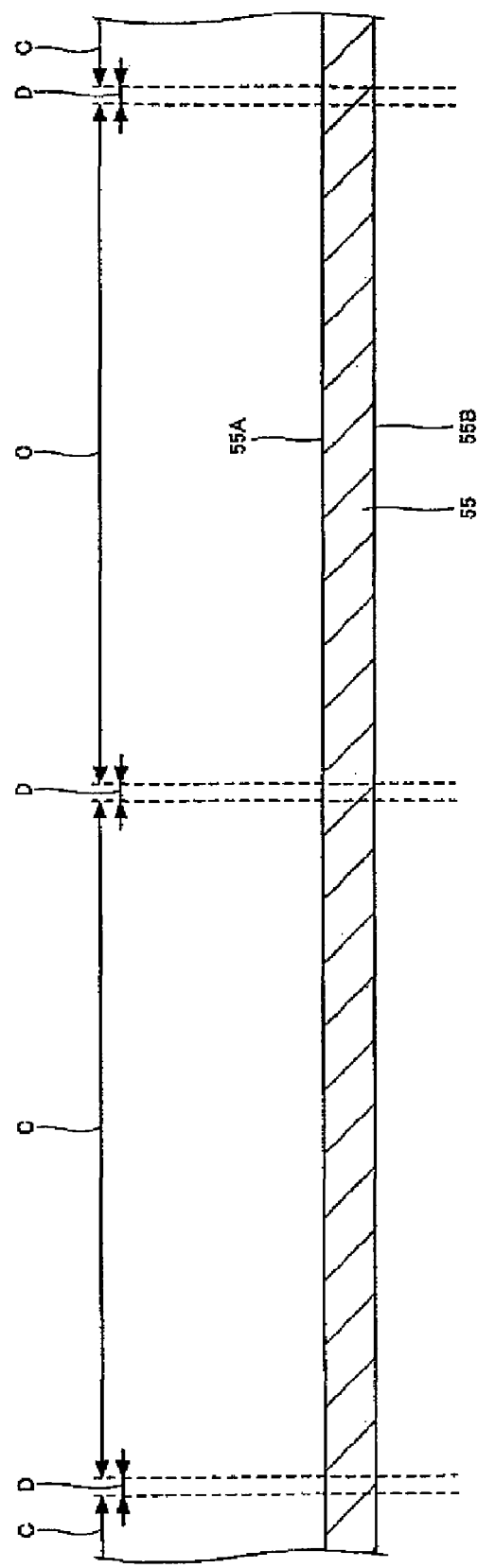
FIG. 34 is a view (No. 1) showing step of manufacturing the semiconductor device according to the third embodiment of invention.

With reference to FIGS. 59 to 69, description will be given to a method of manufacturing the semiconductor device 130 according to the fifth embodiment. First of all, there is carried out the same processing as the step shown in FIG. 34 which has been described in the third embodiment. Thus, the base material 55 shown in FIG. 34 is prepared (a base material preparing step).

Figure 59:
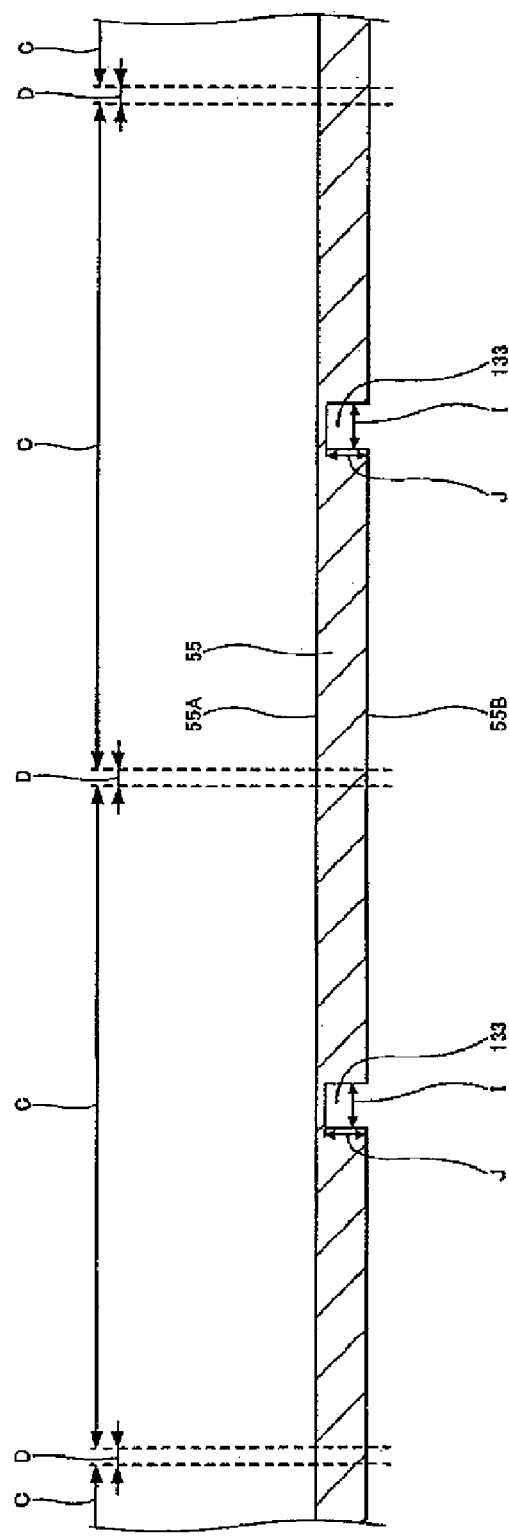
FIG. 59 is a view (No. 1) showing step of manufacturing the semiconductor device according to the fifth embodiment of invention.

At a step shown in FIG. 59, subsequently, a trench 133 which does not penetrate the base material 55 is formed on the base material 55 in a portion positioned between a first mounting region for mounting an electronic component 12 thereon and a second mounting region for mounting an electronic component 13 thereon from a surface 55B side of the base material 55 (a trench forming step).

More specifically, for instance, the base material 55 is subjected to etching to form the trench 133 by anisotropic etching using a mask (for example, dry etching), for instance. A width I of the trench 133 can be set to be 200 μm, for example. A depth J of the trench 133 can be set to be 170 μm, for example.

Figure 60:
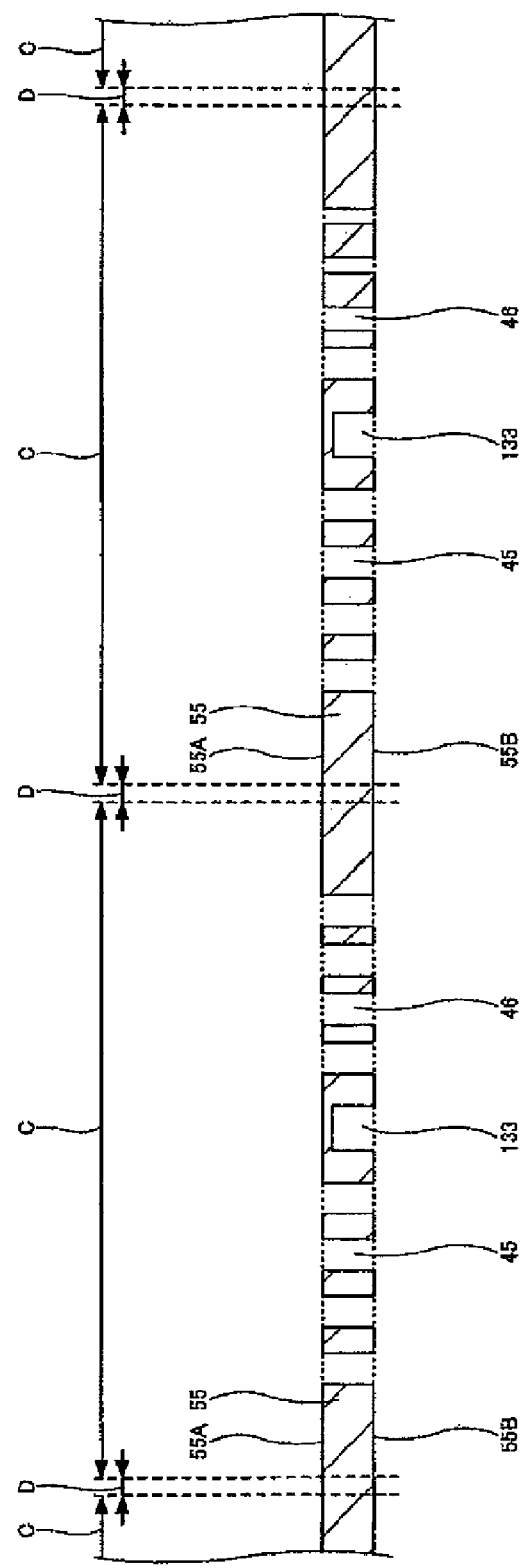
FIG. 60 is a view (No. 2) showing step of manufacturing the semiconductor device according to the fifth embodiment of invention.

At a step shown in FIG. 60, subsequently, a through hole 45 and a through hole 46 are formed at the same time (a through hole forming step). The through hole 45 penetrates the base material 55 in a corresponding portion to a position in which a through electrode 25 is to be formed. The through hole 46 penetrates the base material 55 in a corresponding portion to a position in which a through electrode 26 is to be formed.

More specifically, for instance, the base material 55 is subjected to etching to form the through holes 45 and 46 by anisotropic etching using a mask (for example, dry etching), for instance.

Figure 61:
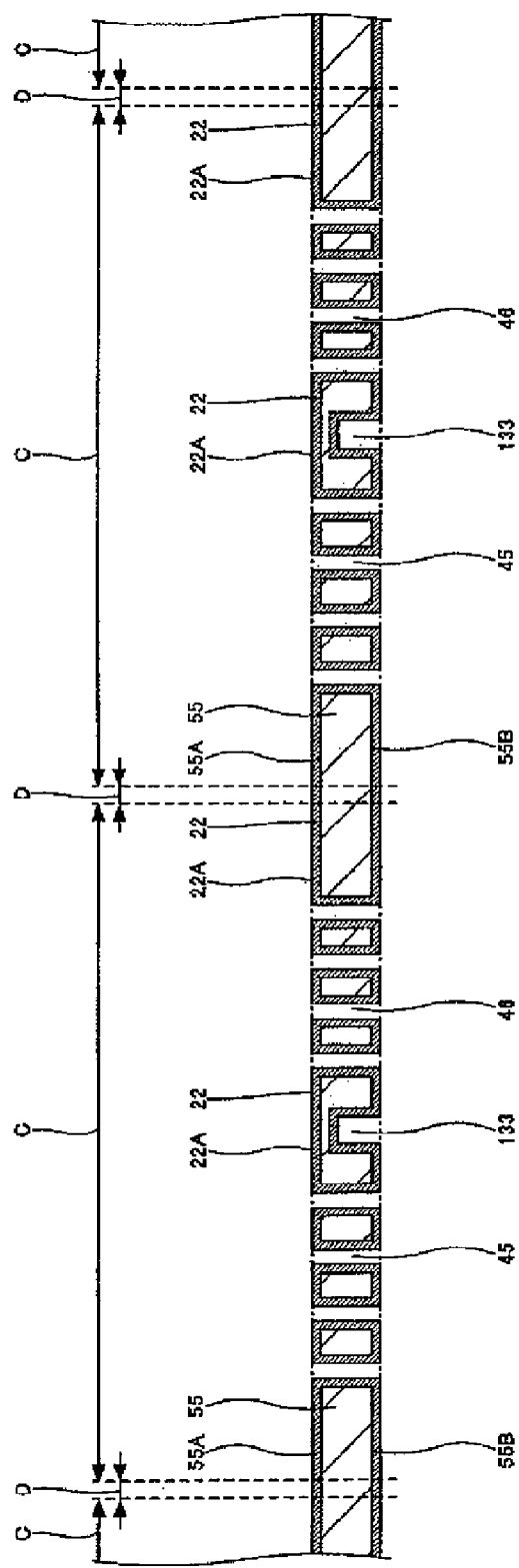
FIG. 61 is a view (No. 3) showing step of manufacturing the semiconductor device according to the fifth embodiment of invention.

At a step shown in FIG. 61, next, there is carried out the same processing as the step illustrated in FIG. 5 which has been described in the first embodiment. Consequently, there is formed an insulating film 22 for covering both surfaces 55A and 55B of the base material 55 and surfaces of the base material 55 in a portion constituting the through holes 45 and 46 and the trench 133.

Figure 62:
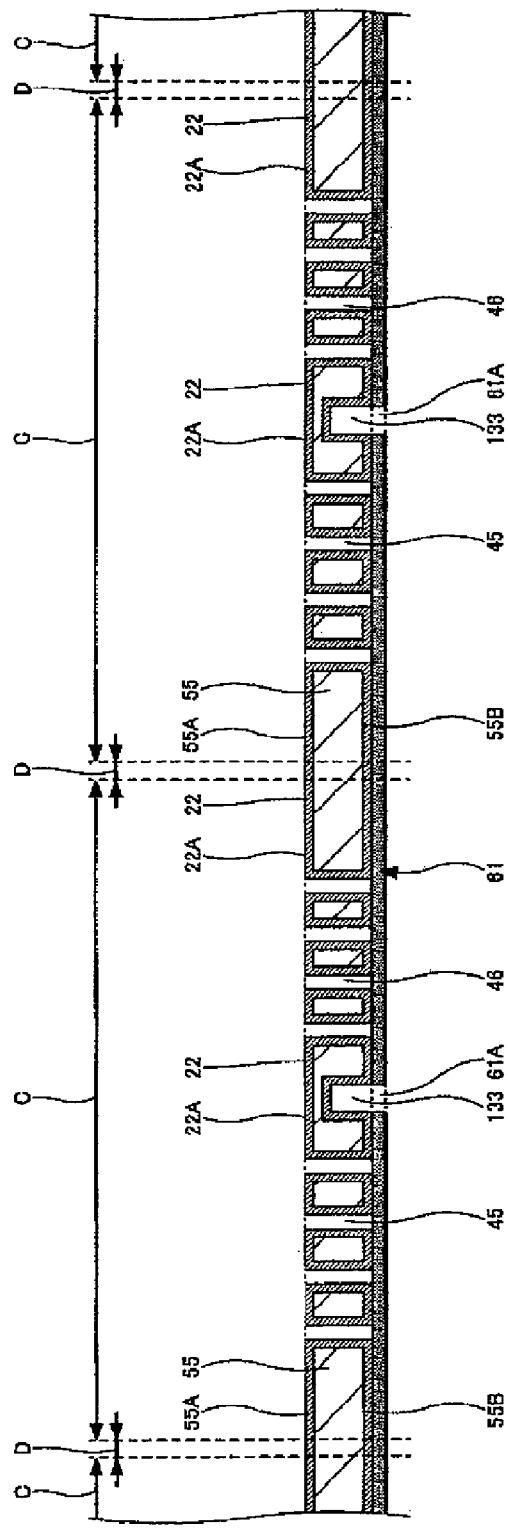
FIG. 62 is a view (No. 4) showing step of manufacturing the semiconductor device according to the fifth embodiment of invention.

At a step shown in. FIG. 62, then, there is carried out the same processing as the step illustrated in FIG. 6 which has been described in the first embodiment. Consequently, the mask 61 shown in FIG. 6 is formed on the insulating film 22 provided on the lower surface 55B of the base material 55. At this time, the mask 61 is formed in such a manner that an opening portion 61A exposes the trench 133.

Figure 63:
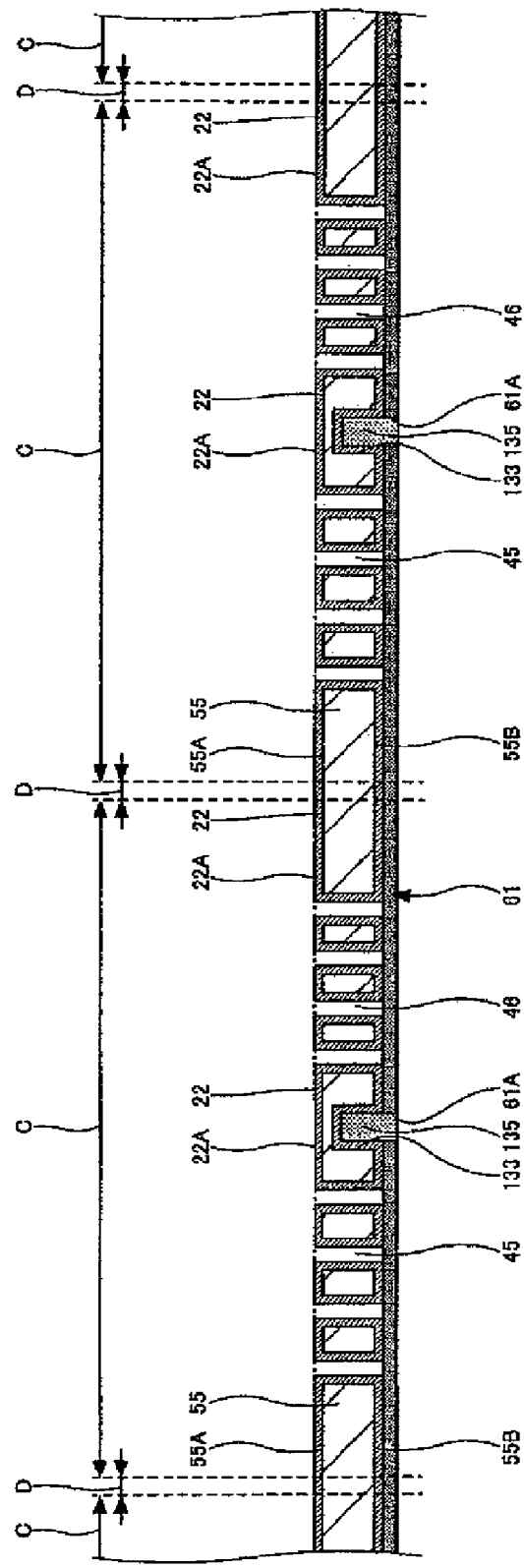
FIG. 63 is a view (No. 5) showing step of manufacturing the semiconductor device according to the fifth embodiment of invention.

At a step shown in FIG. 63, thereafter, the trench 133 is filled with a resin (a base metal of a heat intercepting member 135) to form the heat intercepting member 135 by a squeegee printing method, for example (a heat intercepting member forming step).

At this time, the opening portion 61A of the mask 61 is also filled with a resin. For the resin, it is possible to use a resin capable of intercepting a heat (for example, a thermal conductivity of 0.1 to 1.0 W/m·K), for instance. More specifically, for the resin, it is possible to use a polyimide resin, an epoxy resin or a silicone resin, for example. The resin may be caused to contain a filler (for example, silica). In the case in which the resin is caused to contain the filler (for example, the silica), it is possible to reduce a difference in a coefficient of thermal expansion between a substrate 21 and the heat intercepting member 135. For example, in the case in which a silicon substrate (a coefficient of thermal expansion of 3 ppm/K) is used as the substrate 21, a content of the filler (the silica) contained in the resin can be set to be 50%.

Figure 8:
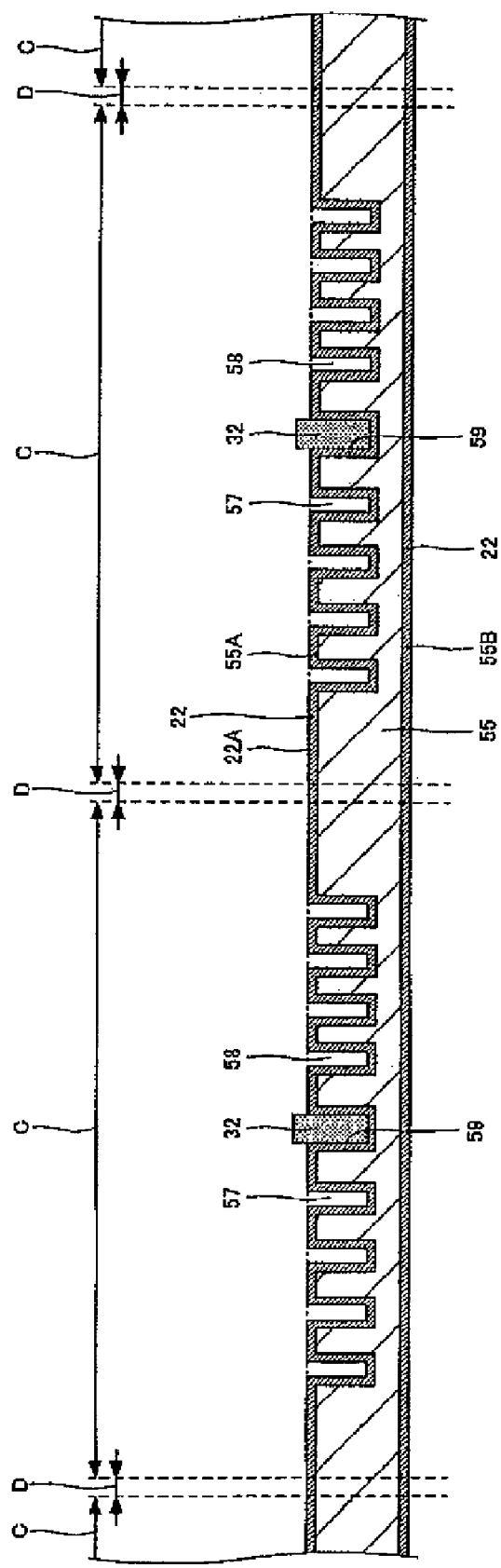
FIG. 8 is a view (No. 6) showing step of manufacturing the semiconductor device according to the first embodiment of invention.
Figure 64:
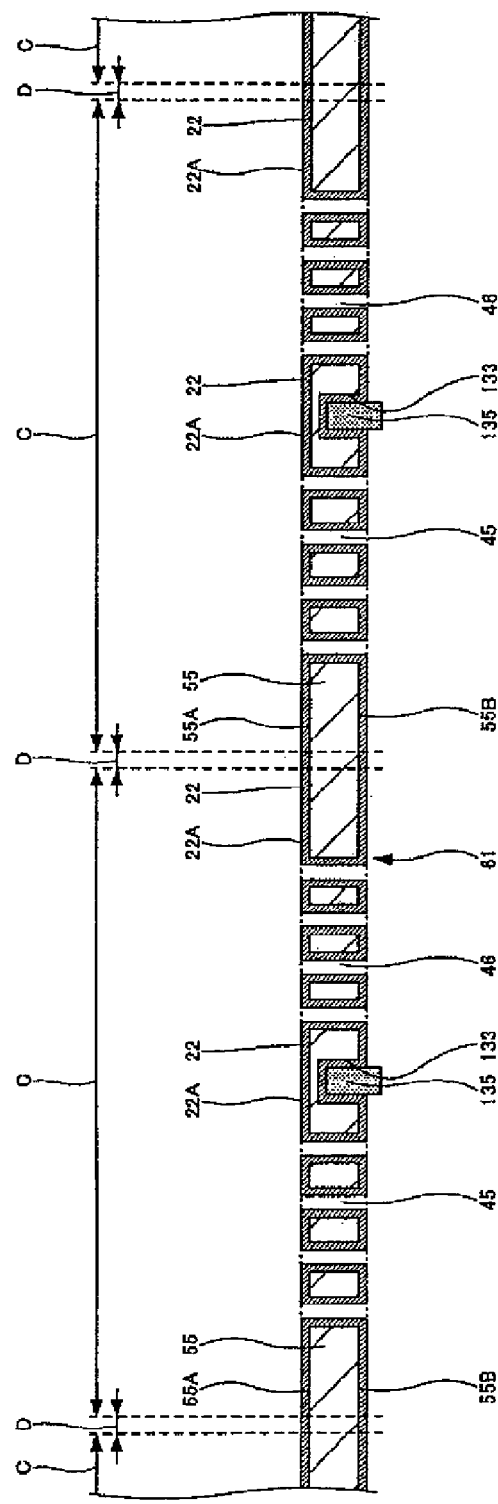
FIG. 64 is a view (No. 6) showing step of manufacturing the semiconductor device according to the fifth embodiment of invention.

At a step shown in FIG. 64, next, there is carried out the same processing as the step illustrated in FIG. 8 which has been described in the first embodiment. Thus, the mask 61 shown in FIG. 63 is removed.

Figure 65:
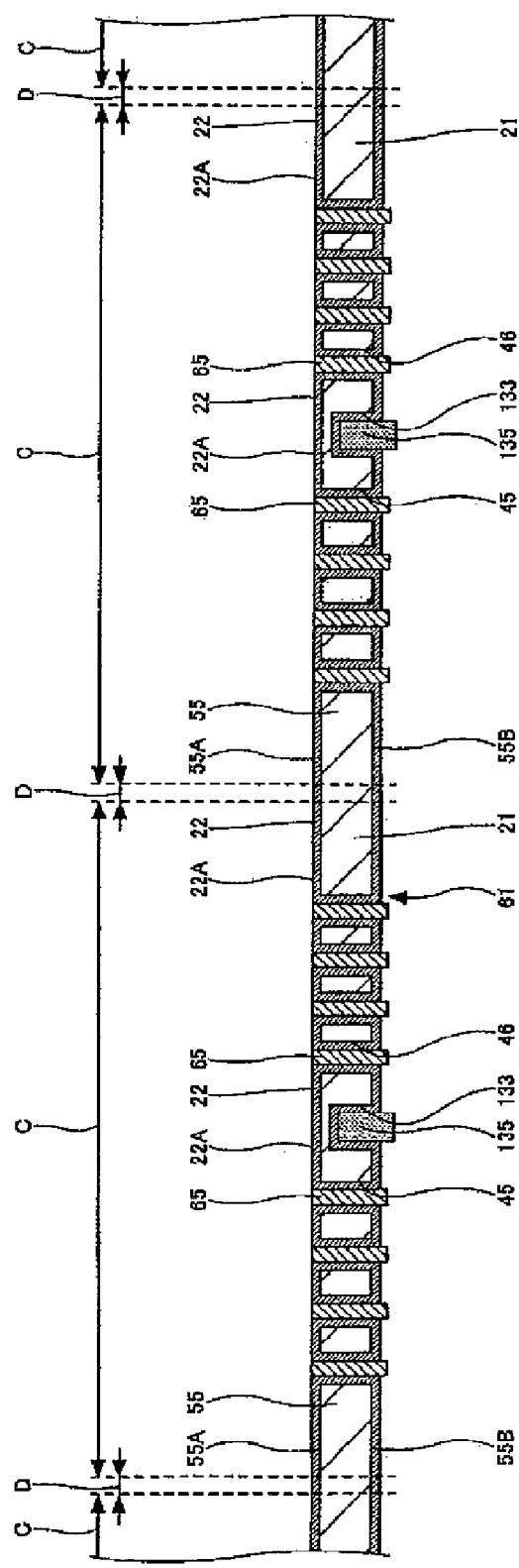
FIG. 65 is a view (No. 7) showing step of manufacturing the semiconductor device according to the fifth embodiment of invention.

At a step shown in FIG. 65, subsequently, a conductive member 65 to be a base metal of the through electrodes 25 and 26 is formed in the through holes 45, 46. More specifically, for example, a seed layer is formed by a sputtering method and a Cu plated film is then deposited and grown to form the conductive member 65 by a semiadditive process or the through holes 45, 46 are filled with a conductive paste (for example, a Cu paste, an Ag paste or an Ni paste) to form the conductive member 65 by a printing method. At this time, the conductive member 65 is protruded from the insulating film 22 formed on the lower surface 55B of the base material 55 in some cases.

Figure 66:
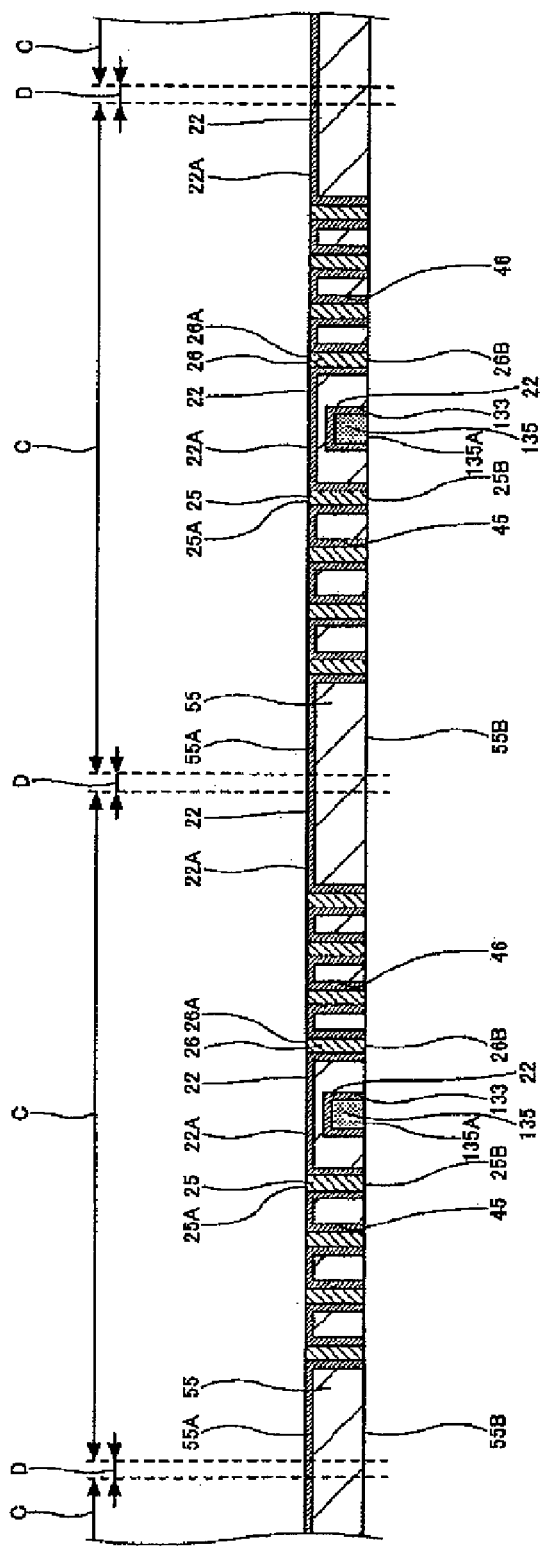
FIG. 66 is a view (No. 8) showing step of manufacturing the semiconductor device according to the fifth embodiment of invention.

At a step shown in FIG. 66, thereafter, there are/is removed the conductive member 65 and/or the heat intercepting member 135 in protruded portions from the insulating film 22 formed on the lower surface 55B of the base material 55 (a conductive member and/or heat intercepting member removing step).

More specifically, the unnecessary conductive member 65 and/or heat intercepting member 135 in the protruded portions from the insulating film 22 are/is removed by grinding or polishing. Consequently, the through electrodes 25 and 26 are formed (in the embodiment, the steps shown in FIGS. 65 and 66 serve as "a through electrode forming step"), and furthermore, an end face 135A (a polished or ground surface) of the heat intercepting member 135 is on almost the level with end faces 25B and 26B of the through electrodes 25 and 26.

Figure 67:
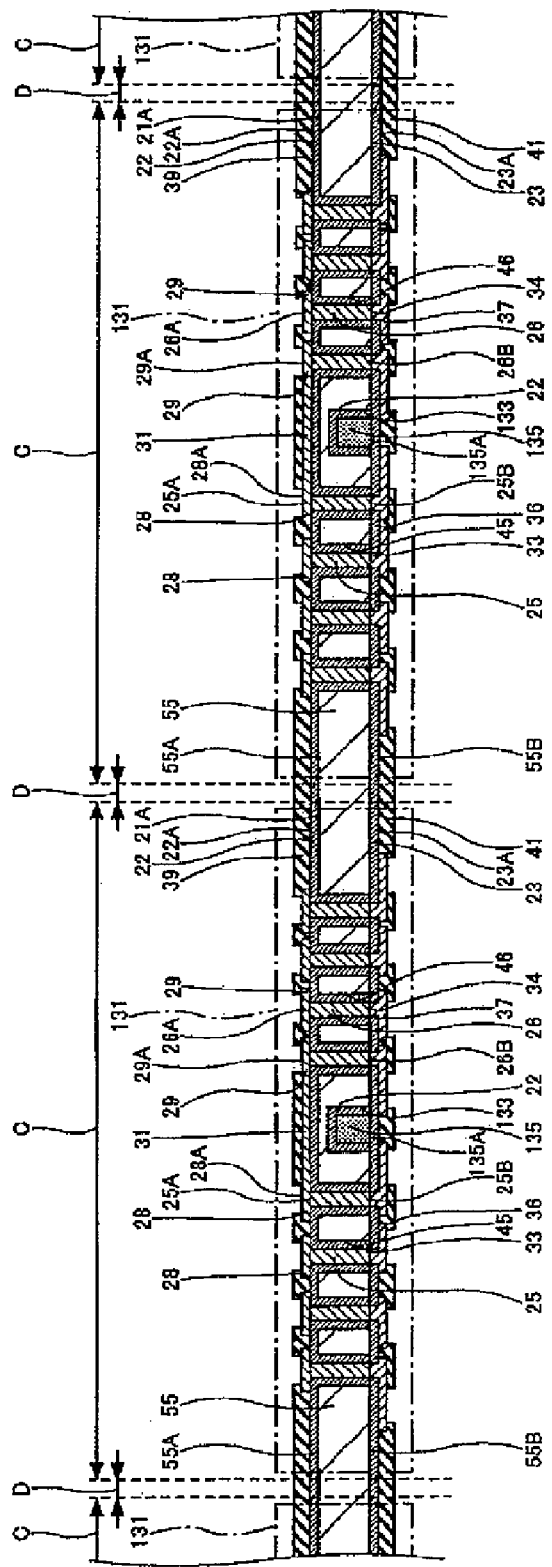
FIG. 67 is a view (No. 9) showing step of manufacturing the semiconductor device according to the fifth embodiment of invention.

At a step shown in FIG. 67, subsequently, there are sequentially carried out the same processings as the steps illustrated in FIGS. 11, 12 and 14 to 16 (the steps including "a pad forming step" and "an external connecting pad forming step") which have been described in the first embodiment. Consequently, there are formed pads 28 and 29, a wiring 31, vias 33 and 34, external connecting pads 36 and 37, and solder resist layers 39 and 41. Thus, a wiring board 131 is formed in a plurality of substrate forming regions C.

Figure 68:
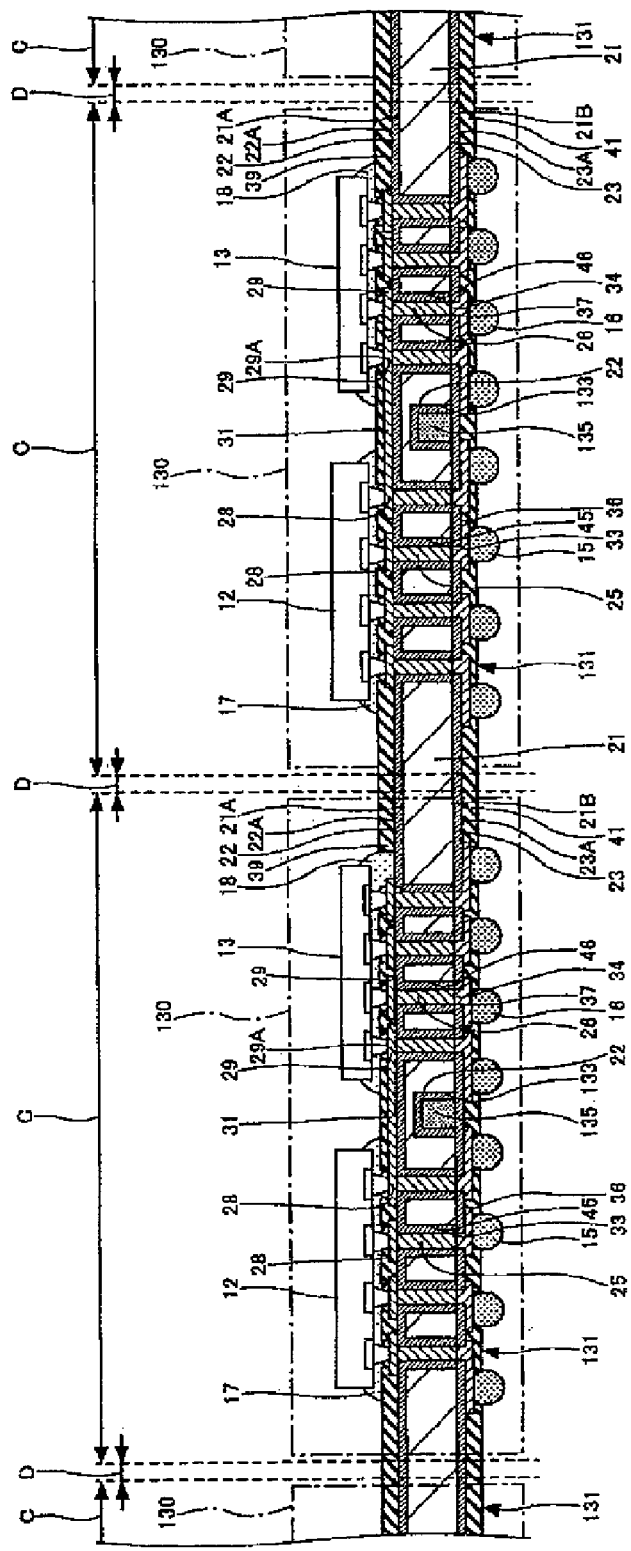
FIG. 68 is a view (No. 10) showing step of manufacturing the semiconductor device according to the fifth embodiment of invention.

At a step shown in FIG. 68, next, the electronic components 12 and 13 are mounted on the pads 28 and 29 of the wiring board 131 by a flip chip bonding. Subsequently, a clearance between the electronic component 12 and the wiring board 131 is filled with an underfill resin 17 and a clearance between the electronic component 13 and the wiring board 131 is filled with an underfill resin 18. Then, an external connecting terminal 15 is provided on the external connecting pad 36 and an external connecting terminal 16 is provided on the external connecting pad 37. Consequently, the semiconductor device 130 is manufactured in the substrate forming regions C.

Figure 69:
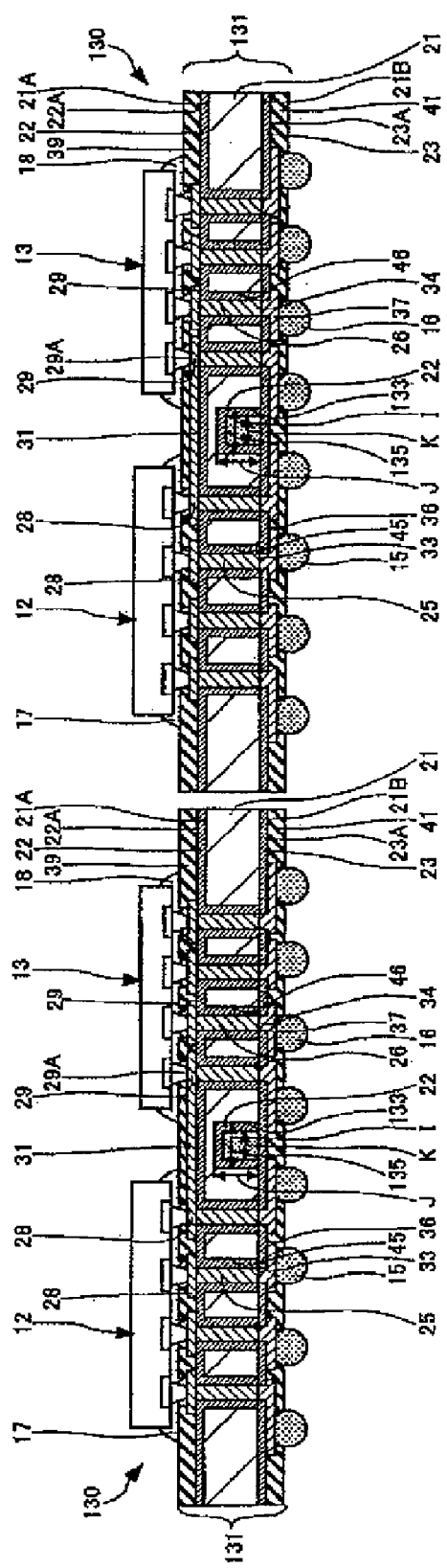
FIG. 69 is a view (No. 11) showing step of manufacturing the semiconductor device according to the fifth embodiment of invention.

At a step shown in FIG. 69, thereafter, the structure illustrated in FIG. 68 is cut along a cut region D so that the semiconductor devices 130 are obtained as individual pieces (a cutting step).

According to the method of manufacturing the wiring board of the exemplary embodiment of the invention, the trench 133 which does not penetrate the base material 55 is formed on the base material 55 in the portion positioned between the first mounting region for mounting the electronic component 12 thereon and the second mounting region for mounting the electronic component 13 thereon from the lower surface 55B side of the base material 55. Subsequently, the through holes 45, 46 corresponding to the forming positions for the through electrodes 25, 26 and penetrating the base material 55 are formed on the base material at the same time. Then, the heat intercepting member 135 for intercepting a heat is formed in the trench 133. Thereafter, the through holes 45, 46 are filled with the conductive member to form the through electrodes 25, 26. Next, the pads 28, 29 are formed. Consequently, the, heat intercepting member 135 for intercepting the heat generated from the electronic component 13 in the operation is formed on the base material 55 in the portion positioned between the first mounting region for mounting the electronic component 12 thereon and the second mounting region for mounting the electronic component 13 thereon. Therefore, the heat generated from the electronic component 13 in the operation can be prevented from being transferred to the electronic component 12 through the substrate 21 in the corresponding portion to the first mounting region.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A wiring board comprising:
   a substrate formed by a semiconductor material, a first pad which is provided on a first surface side of the substrate and on which a first electronic component is to be mounted, and a second pad which is provided on the first surface side of the substrate and on which a second electronic component having a larger amount of heat generation in an operation than that of the first electronic component is to be mounted;
   a first through electrode which penetrates the substrate and has one end connected electrically to the first pad;
   a second through electrode which penetrates the substrate and has one end connected electrically to the second pad;
   a through trench which penetrates the substrate and which is provided on the substrate in a portion positioned between a first mounting region on which the first electronic component is to be mounted and a second mounting region on which the second electronic component is to be mounted; and
   a heat intercepting member which is provided in the through trench,
   wherein a thermal conductivity of the heat intercepting member is less than a thermal conductivity of the substrate.

2. The wiring board according to claim 1, wherein the through trench is provided to surround the substrate in a corresponding portion to the second mounting region.

3. The wiring board according to claim 1, wherein a material of the heat intercepting member is a resin or a resin including a filler.

4. The wiring board according to claim 1, wherein
   a thermal conductivity of the heat intercepting member is in the range of 0.1 to 1.0 W/m·K, and
   a thermal conductivity of the substrate is in the range of 150 to 170 W/m·K.

5. The wiring board according to claim 1, wherein the substrate is made of silicon.

6. The wiring board according to claim 1, wherein a first external connecting pad connected to the other end of the first through electrode and a second external connecting pad connected to the other end of the second through electrode are provided on a second surface side of the substrate.

7. The wiring board according to claim 1, wherein an insulating film is formed on the surface of the semiconductor substrate, and the respective pads and through electrodes are formed via the insulating film.

8. The wiring board according to claim 1, wherein a thermal conductivity of the heat intercepting member is in the range of 0.1 to 1.0 W/m·K.

9. A wiring board comprising:
   a substrate formed by a semiconductor material, a first pad which is provided on a first surface side of the substrate and on which a first electronic component is to be mounted, and a second pad which is provided on the first surface side of the substrate and on which a second electronic component having a larger amount of heat generation in an operation than that of the first electronic component is to be mounted;
   a first through electrode which penetrates the substrate and has one end connected electrically to the first pad;
   a second through electrode which penetrates the substrate and has one end connected electrically to the second pad;
   a trench which does not penetrate the substrate and which is provided on the substrate in a portion positioned at an opposite side to the first surface in the substrate in a portion positioned between a first mounting region on which the first electronic component is to be mounted and a second mounting region on which the second electronic component is to be mounted; and
   a heat intercepting member which is provided in the trench,
   wherein a thermal conductivity of the heat intercepting member is less than a thermal conductivity of the substrate.

10. The wiring board according to claim 9, wherein the trench is provided to surround the substrate in a corresponding portion to the second mounting region.

11. The wiring board according to claim 9, wherein a material of the heat intercepting member is a resin or a resin including a filler.

12. The wiring board according to claim 9, wherein
    a thermal conductivity of the heat intercepting member is in the range of 0.1 to 1.0 W/m·K, and
    a thermal conductivity of the substrate is in the range of 150 to 170 W/m·K.

13. The wiring board according to claim 9, wherein the substrate is made of silicon.

14. The wiring board according to claim 9, wherein a first external connecting pad connected to the other end of the first through electrode and a second external connecting pad connected to the other end of the second through electrode are provided on a second surface side of the substrate.

15. The wiring board according to claim 9, wherein an insulating film is formed on the surface of the semiconductor substrate, and the respective pads and through electrodes are formed via the insulating film.

16. The wiring board according to claim 9, wherein a thermal conductivity of the heat intercepting member is in the range of 0.1 to 1.0 W/m·K.

* * * * *